US008648441B2

(12) United States Patent
Hijioka et al.

(10) Patent No.: US 8,648,441 B2
(45) Date of Patent: Feb. 11, 2014

(54) SEMICONDUCTOR DEVICE AND METHOD OF MANUFACTURING SEMICONDUCTOR DEVICE

(75) Inventors: Kenichiro Hijioka, Kanagawa (JP); Ippei Kume, Kanagawa (JP); Naoya Inoue, Kanagawa (JP); Hiroki Shirai, Kanagawa (JP); Jun Kawahara, Kanagawa (JP); Yoshihiro Hayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 246 days.

(21) Appl. No.: 13/106,590

(22) Filed: May 12, 2011

(65) Prior Publication Data

US 2011/0284991 A1    Nov. 24, 2011

(30) Foreign Application Priority Data

May 19, 2010   (JP) .................................. 2010-115755
Dec. 3, 2010   (JP) .................................. 2010-270310

(51) Int. Cl.
*H01L 21/02* (2006.01)

(52) U.S. Cl.
USPC ......................................................... 257/532

(58) Field of Classification Search
USPC ......................................................... 257/532
See application file for complete search history.

(56) References Cited

U.S. PATENT DOCUMENTS

| | | | |
|---|---|---|---|
| 6,965,139 B2 | 11/2005 | Ohno | |
| 7,247,902 B2 | 7/2007 | Ohno | |
| 7,482,694 B2 | 1/2009 | Ohtake et al. | |
| 7,659,567 B2* | 2/2010 | Aoki | ............................. 257/306 |
| 7,701,060 B2 | 4/2010 | Tada et al. | |
| 2006/0131632 A1 | 6/2006 | Chae | |
| 2008/0311739 A1* | 12/2008 | Besling et al. | ................ 438/643 |
| 2009/0267198 A1 | 10/2009 | Tada et al. | |
| 2010/0151675 A1 | 6/2010 | Tada et al. | |

FOREIGN PATENT DOCUMENTS

| | | |
|---|---|---|
| JP | 11-26716 A | 1/1999 |
| JP | 2000-332216 A | 11/2000 |
| JP | 2002-261256 A | 9/2002 |
| JP | 2003-332463 A | 11/2003 |
| JP | 2004-342787 A | 12/2004 |
| JP | 2005-5337 A | 1/2005 |

(Continued)

OTHER PUBLICATIONS

M. Ueki et al., High Performance Cu Interconnects With Damageless Full Molecular-Pore-Stack (MPS) SiOCH for 32nm-node LSIs and Beyond, IEEE, 2008, pp. 619-622.

*Primary Examiner* — Bradley K Smith
(74) *Attorney, Agent, or Firm* — Foley & Lardner LLP

(57) ABSTRACT

A semiconductor device has a substrate; a multi-layered interconnect formed on the substrate, and having a plurality of interconnect layers, each of which being configured by an interconnect and an insulating layer, stacked therein; a memory circuit formed in a memory circuit region on the substrate in a plan view, and having a peripheral circuit and at least one capacitor element embedded in the multi-layered interconnect; and a logic circuit formed in a logic circuit region on the substrate, wherein the capacitor element is configured by a lower electrode, a capacitor insulating film, an upper electrode, an embedded electrode and an upper interconnect; the top surface of the upper interconnect, and the top surface of the interconnect configuring the logic circuit formed in the same interconnect layer with the upper interconnect, are aligned to the same plane.

15 Claims, 76 Drawing Sheets

(56) References Cited

FOREIGN PATENT DOCUMENTS

| JP | 2005-86150 A | 3/2005 |
| JP | 2005-101647 A | 4/2005 |
| JP | 2007-201101 A | 8/2007 |
| JP | 2009-123886 A | 6/2009 |
| WO | WO 03/083935 A1 | 10/2003 |
| WO | WO 2004/107434 A1 | 12/2004 |
| WO | WO 2007/132879 A1 | 11/2007 |

\* cited by examiner

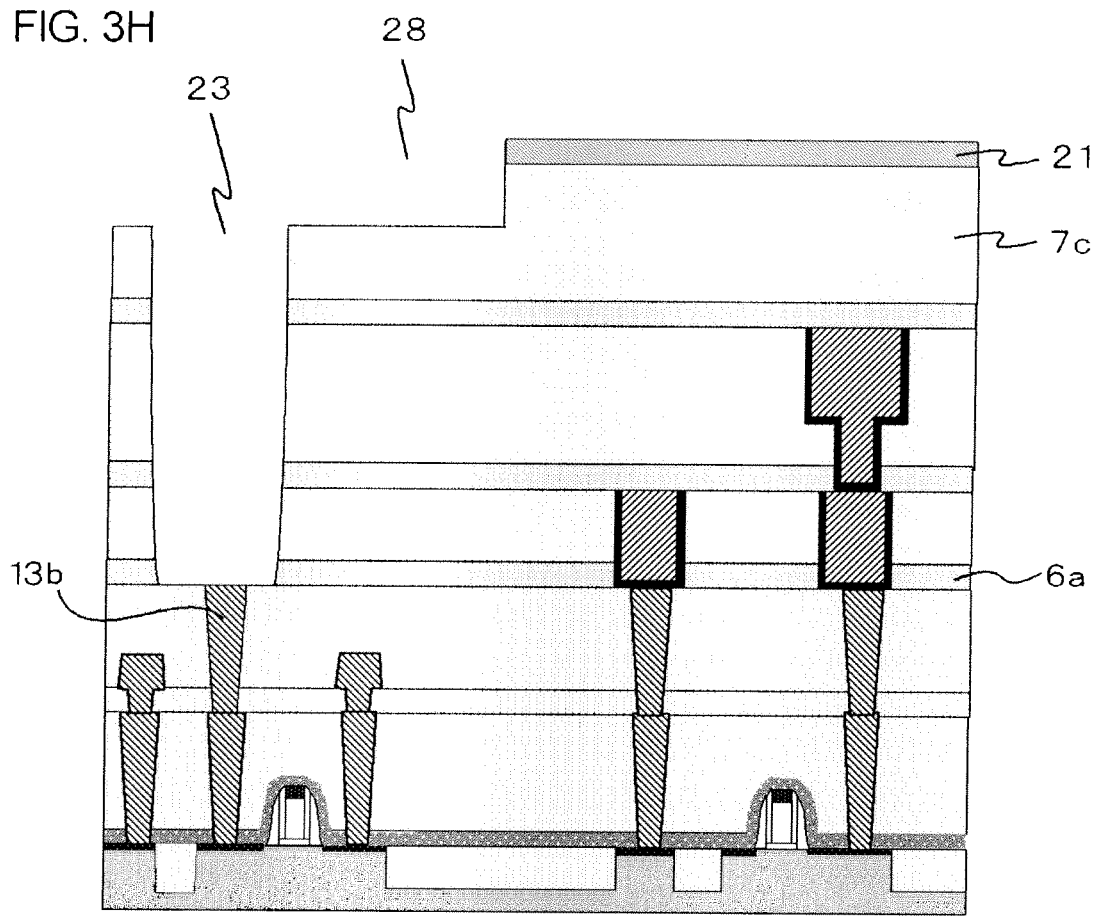

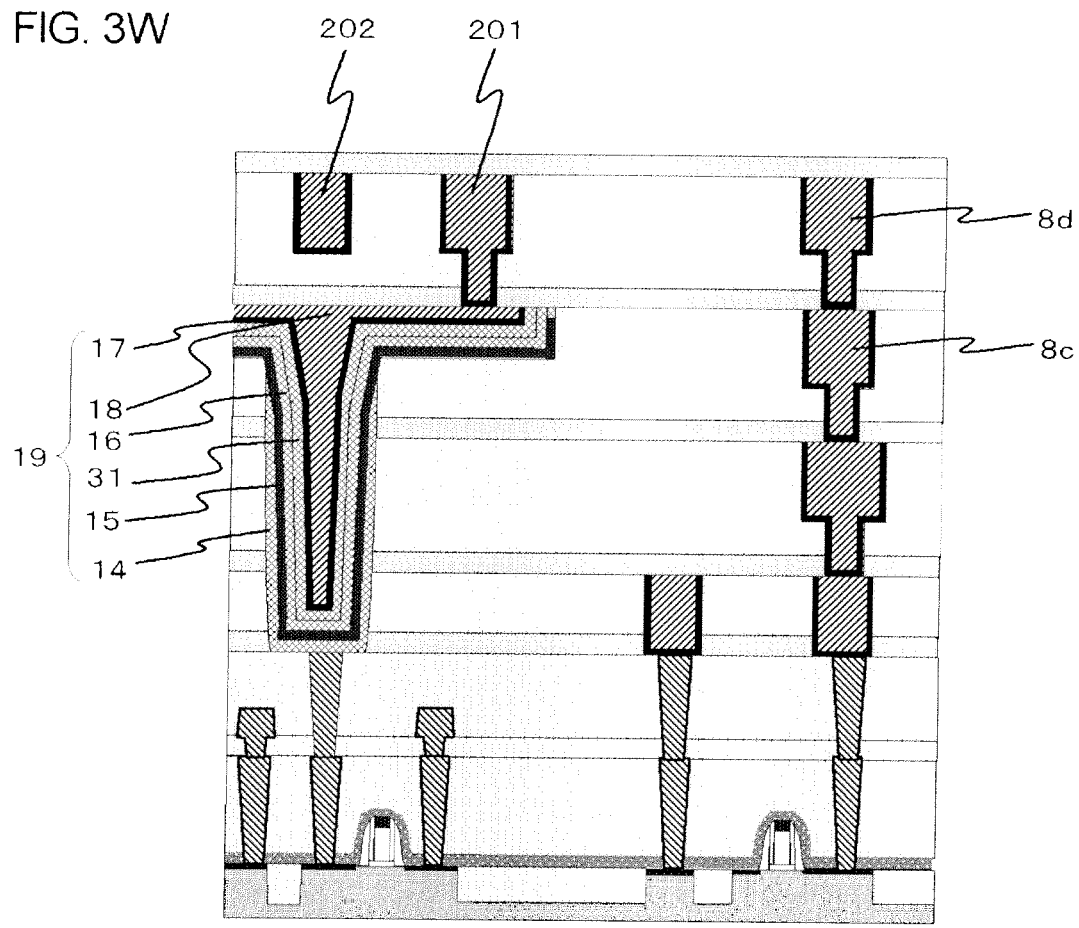

32

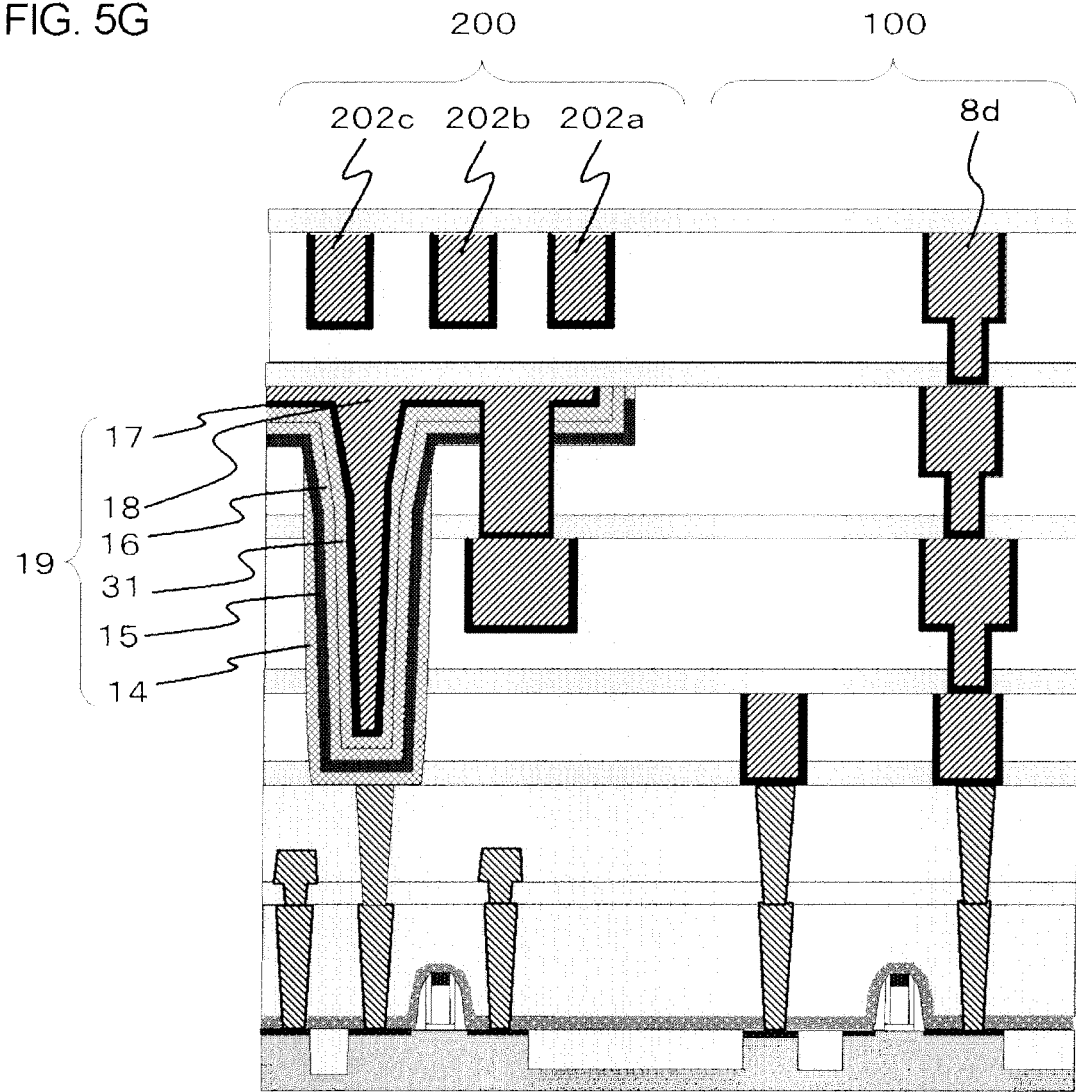

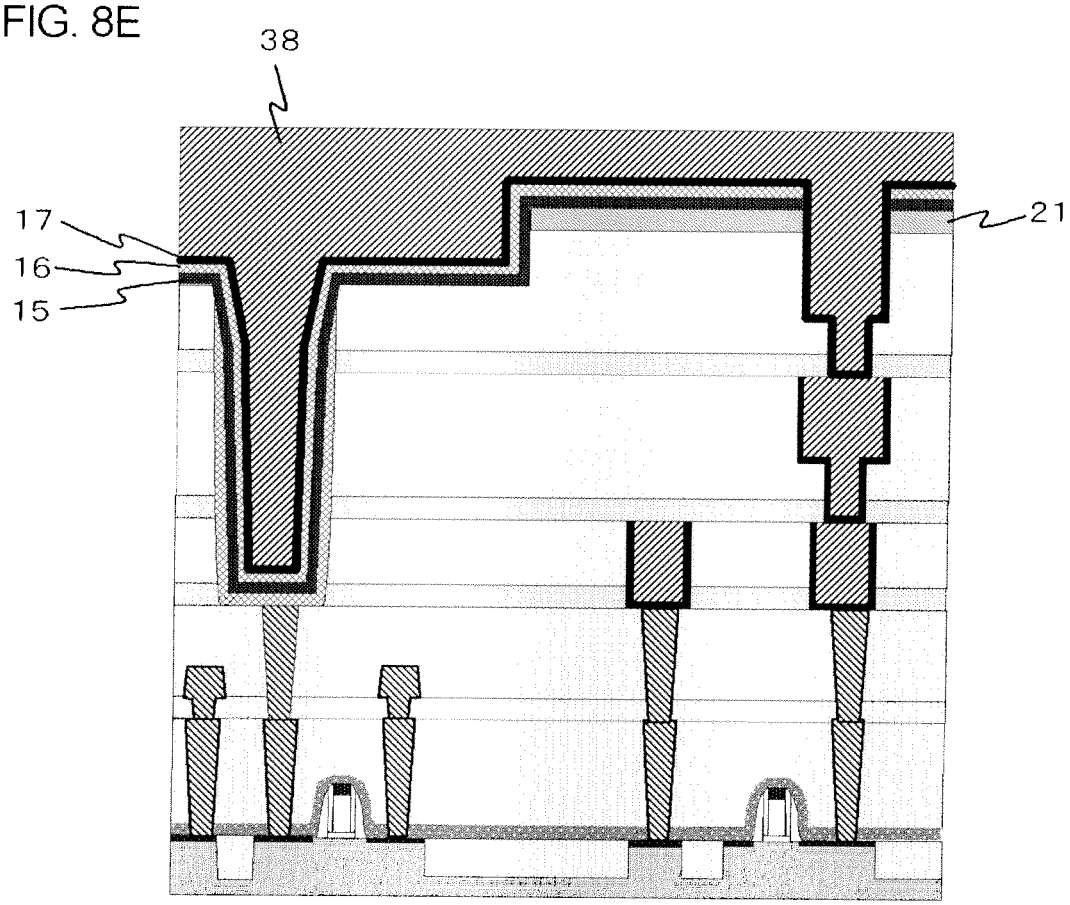

SEMICONDUCTOR DEVICE AND METHOD OF MANUFACTURING SEMICONDUCTOR DEVICE

This application is based on Japanese patent application No. 2010-115755 and No. 2010-270310 the content of which is incorporated hereinto by reference.

BACKGROUND

1. Technical Field

The present invention relates to a semiconductor device and a method of manufacturing a semiconductor device.

2. Related Art

Advancement of performance of semiconductor devices has been driven mainly by shrinkage of element. One of effects ascribable to the shrinkage relates to increase in operational speed of active element, by virtue of shortened gate length. Another effect relates to decrease in occupied area of the semiconductor devices, as a result of shortened gate length and reduced interconnect pitch. As one example making use of increased degree of integration of the semiconductor devices, those having a memory circuit and a logic circuit, which had respectively been formed on separate semiconductor substrates, mounted together on the same semiconductor substrate have already been put into practical use.

Performance-related effect of integration of the memory circuit for storing information and the logic circuit for processing the information on the same semiconductor substrate may be understood as that the memory circuit and the logic circuit, having been formed separately in previous days, may be placed closely adjacent to each other in the semiconductor device. Accordingly, connection between the memory circuit and the logic circuit, having been established on a substrate having the semiconductor device mounted thereon, may be enabled inside the semiconductor device. As a consequence, operational speed as an information processing system having a storage device and a logic operation device may be improved. In addition, since the memory circuit and the logic circuit, having previously been formed on separate semiconductor substrates, may be obtained from the same semiconductor substrate, the semiconductor device having the memory circuit and the logic circuit integrated therein, may be manufactured at low cost with good yield.

Manufacturing of the semiconductor device having the memory circuit and the logic circuit integrated therein, however, needs formation of active elements and interconnects for configuring the logic circuit, and additionally needs formation of memory elements necessary for configuring the memory circuit. It has been necessary to adopt a more specialized structure in order to form the memory elements, as compared with the case where the logic circuit is configured.

For an exemplary case where capacitor elements, generally called "trench-type capacitors" are formed on the semiconductor substrate, trenches of as deep as several micrometers or more are formed in the semiconductor substrate. According to the method, since diameters of the trenches to be formed in the semiconductor substrate will necessarily be reduced as the semiconductor elements keep on shrinking, so that the trenches are necessarily deepened if they are concomitantly desired to ensure a sufficient level of capacitance. This means increase in aspect ratio of the trenches formed in the semiconductor substrate. For this reason, it has been very difficult to fill up such high-aspect-ratio trenches with the electrode which composes the capacitor elements.

In order to solve the problem of such high aspect ratio, there has been proposed a capacitor element structure called stacked-type capacitor. Known stacked capacitor element structures include those having fin-type or cylinder-type capacitor elements formed on the semiconductor substrate, so as to configure the memory elements.

For example, Japanese Laid-Open Patent Publication Nos. 2005-005337, 2005-086150, 2002-261256 and H11-026716 disclose structures having cylinder-type capacitor elements formed between active elements formed on the semiconductor substrate and a multi-layered interconnect.

Japanese Laid-Open Patent Publication No. 2003-332463 discloses a structure having parallel plate-type capacitor elements formed over the active elements formed on the semiconductor substrate.

Japanese Laid-Open Patent Publication Nos. 2007-201101, 2000-332216, 2004-342787 and 2005-101647 disclose structures having cylinder-type capacitor elements formed in a stacked insulating film structure which composes a multi-layered interconnect structure formed over the semiconductor substrates.

SUMMARY

In the semiconductor devices disclosed in Japanese Laid-Open Patent Publication Nos. 2007-201101, 2000-332216, 2004-342787 and 2005-101647, the capacitor elements are formed in the insulating interlayer configuring the logic circuit interconnect so as to be embedded therein. As one example, a cross-sectional view of the semiconductor device disclosed in Japanese Laid-Open Patent Publication Nos. 2007-201101 is illustrated in FIG. 10. As illustrated in FIG. 10, the semiconductor device disclosed in Japanese Laid-Open Patent Publication Nos. 2007-201101, an active element 300 which configures a memory circuit and a logic circuit is formed on a semiconductor substrate, and capacitor elements 301 are formed in a multi-layered interconnect formed over the active element 300.

According to Japanese Laid-Open Patent Publication Nos. 2007-201101, metal material layers respectively composing embedded electrodes 302a, 302b embedded in the capacitor elements 301, and the upper interconnects 304a, 304b backed by the embedded electrodes 302a, 302b are formed in separate processes. For this reason, in the process of concomitantly forming the upper interconnects 304a, 304b and an interconnect 303 in the logic circuit, the embedded electrodes 302a, 302b are necessarily etched by an etch-back process, so as to ensure a space for forming the upper interconnects 304a, 304b. The etch-back process has, however, occasionally resulted in an excessive removal of the top surface of the capacitor elements 301, and has consequently degraded yield of the semiconductor device.

According to the semiconductor devices disclosed in Japanese Laid-Open Patent Publication Nos. 2000-332216, 2004-342787 and 2005-101647, since the top surface of the upper interconnect composing the capacitor elements and the top surface of the interconnect configuring the logic circuit are positioned at different levels of height, so that the amount of etching of the insulating film has occasionally varied between a portion above the upper interconnect and a portion above the interconnect. This has resulted, for example, in excessive etching of the upper interconnects of the capacitor elements in the process of forming connecting portions towards the upper interconnects, or has conversely resulted in insufficient etching of the insulating film in the process of forming the connecting portions towards the upper interconnects. As a consequence, the techniques described in Japanese Laid-Open Patent Publication Nos. 2000-332216, 2004-342787 and 2005-101647 have occasionally been suffering from degradation in yield of the semiconductor devices.

According to the present invention, there is provided a semiconductor device which includes:

a substrate;

a multi-layered interconnect formed on the substrate, and having a plurality of interconnect layers, each of which being configured by an interconnect and an insulating layer, stacked therein;

a memory circuit formed in a memory circuit region on the substrate in a plan view, and having a peripheral circuit and at least one capacitor element embedded in the multi-layered interconnect; and a logic circuit formed in a logic circuit region on the substrate, which is a region different from the memory circuit region in a plan view.

The capacitor element is configured by a lower electrode, a capacitor insulating film, an upper electrode, an embedded electrode and an upper interconnect.

The upper interconnect and the embedded electrode are configured by the same material in an integrated manner.

At least one layer of the interconnect configuring the logic circuit is provided between the upper interconnect and the lower electrode.

The top surface of the upper interconnect, and the top surface of the interconnect configuring the logic circuit formed in the same interconnect layer with the upper interconnect, are aligned to the same plane.

In the present invention, the top surface of the upper interconnect, and the top surface of the interconnect configuring the logic circuit are aligned to the same plane. Accordingly, excessive etching or insufficient etching may be suppressed above the top surface of the upper interconnect. The upper interconnect and the embedded electrode are configured by the same material in an integrated manner. It is therefore no longer necessary, in the process of forming the upper interconnect, to etch the embedded electrode by the etch-back process in order to ensure a space for forming the upper interconnect. Accordingly, the embedded electrode may be suppressed from being excessively etched. As may be understood from the above, the present invention has a structure excellent in the yield.

According to another aspect of the present invention, there is also provided a semiconductor device which includes:

a substrate;

a multi-layered interconnect formed on the substrate, and having a plurality of interconnect layers, each of which being configured by an interconnect and an insulating layer, stacked therein;

a memory circuit formed in a memory circuit region on the substrate in a plan view, and having a peripheral circuit and at least one capacitor element embedded in the multi-layered interconnect; and a logic circuit formed in a logic circuit region on the substrate, which is a region different from the memory circuit region in a plan view.

The capacitor element is configured by a lower electrode, a capacitor insulating film, an upper electrode, an embedded electrode and an upper interconnect.

The upper interconnect and the embedded electrode is configured by the same material in an integrated manner.

At least one layer of the interconnect configuring the logic circuit is provided between the upper interconnect and the lower electrode.

Difference in the level of height, between the top surface of the upper interconnect, and the top surface of the interconnect configuring the logic circuit formed in the same interconnect layer with the upper interconnect, is 30 nm or smaller.

In the present invention, difference in the level of height, between the top surface of the upper interconnect, and the top surface of the interconnect configuring the logic circuit formed in the same interconnect layer with the upper interconnect, is set to 30 nm or smaller. Accordingly, similarly to the above-described invention, excessive etching or insufficient etching may be suppressed above the top surface of the upper interconnect. In this way, a structure excellent in yield may be given.

According to another aspect of the present invention, there is provided a method of manufacturing a semiconductor device having a memory circuit and a logic circuit formed on the same substrate. The method includes:

forming an insulating layer on the substrate, forming an opening in the insulating layer, and forming a lower electrode, a capacitor insulating film and an upper electrode in the opening;

forming an interconnect trench in the insulating layer having the opening formed therein;

forming a metal film so as to fill the opening and the interconnect trench; and planarizing the metal film.

In the step of planarizing the metal film, a capacitor element configured by the lower electrode, the capacitor insulating film, the upper electrode, an embedded electrode and an upper interconnect is formed in the opening, while forming an interconnect configuring the logic circuit in the interconnect trench.

According to still another aspect of the present invention, there is provided a method of manufacturing a semiconductor device having a memory circuit and a logic circuit formed on the same substrate. The method includes:

forming an insulating layer on the substrate, forming an opening in the insulating layer, and forming a lower electrode, a capacitor insulating film, an upper electrode, an embedded electrode, and upper interconnect in the opening;

planarizing the upper interconnect;

forming an interconnect trench in the insulating layer having the opening formed therein;

forming a metal film so as to fill the interconnect trench; and planarizing the metal film, and further planarizing the upper interconnect at the same time.

In the step of planarizing the metal film, a capacitor element configured by the lower electrode, the capacitor insulating film, the upper electrode, an embedded electrode and an upper interconnect is formed in the opening, while forming an interconnect configuring the logic circuit in the interconnect trench.

In the present invention, the top surface of the upper interconnect, and the top surface of the interconnect configuring the logic circuit are aligned to the same plane. Accordingly, excessive etching or insufficient etching may be suppressed above the top surface of the upper interconnect. The upper interconnect and the embedded electrode herein are configured by the same material in an integrated manner. It is therefore no longer necessary, in the process of forming the upper interconnect, to etch the embedded electrode by the etch-back process in order to ensure a space for forming the upper interconnect. Accordingly, the embedded electrode may be suppressed from being excessively etched.

As may be understood from the above, the present invention has a structure excellent in the yield.

According to the present invention, a semiconductor device having a structure manufacturable in good yield, and a method of manufacturing the same are provided.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 5A to 5G are sectional views sequentially illustrating procedures of manufacturing of the semiconductor device of the second embodiment;

FIGS. 8A to 8F are sectional views sequentially illustrating procedures of manufacturing of the semiconductor device of the fifth embodiment;

DETAILED DESCRIPTION

Figure 1:
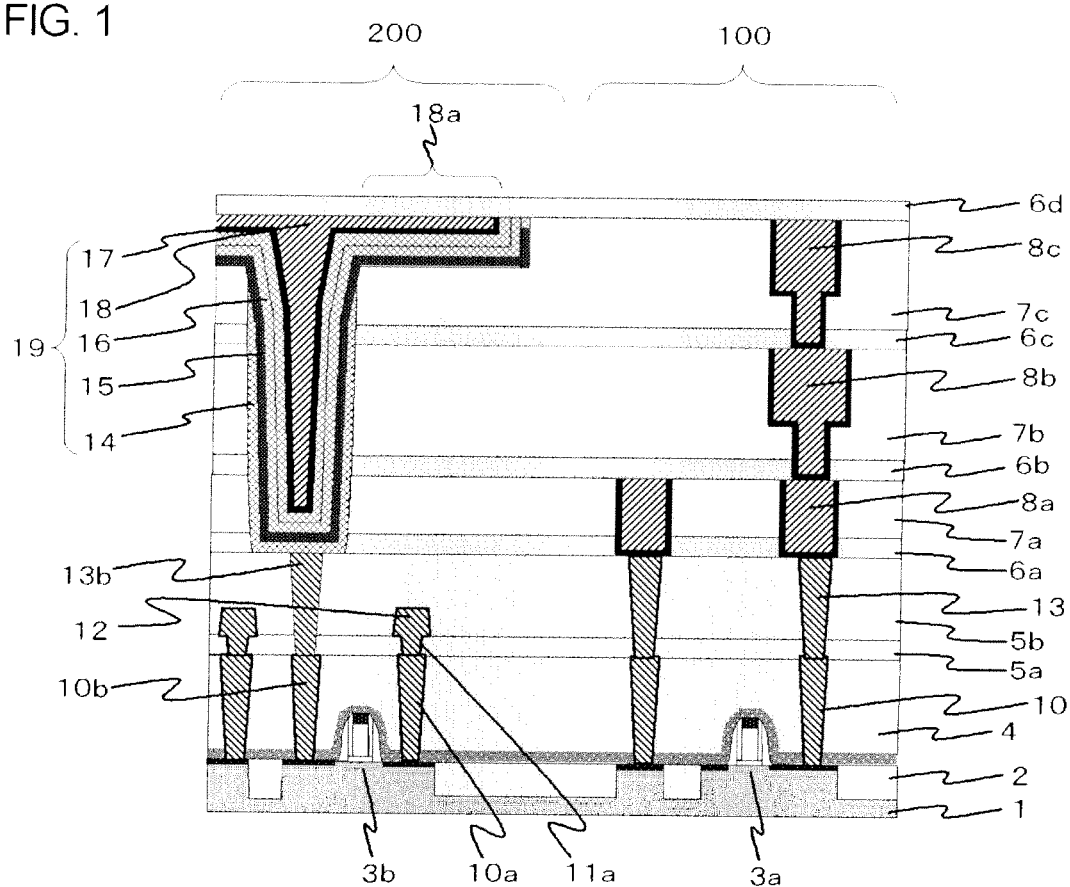
FIG. 1 and FIG. 2 are sectional views schematically illustrating a semiconductor device of a first embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that all similar constituents in all drawings will be given similar reference numerals or symbols, so as to appropriately avoid repetitive explanation. Note also that all drawings are aimed at schematically illustrating structures related to the embodiments of the present invention, without restricting dimensions of the structures by the dimensional ratios of the constituents seen in the drawings.

(First Embodiment)

A semiconductor device of a first embodiment will be explained.

Figure 2:
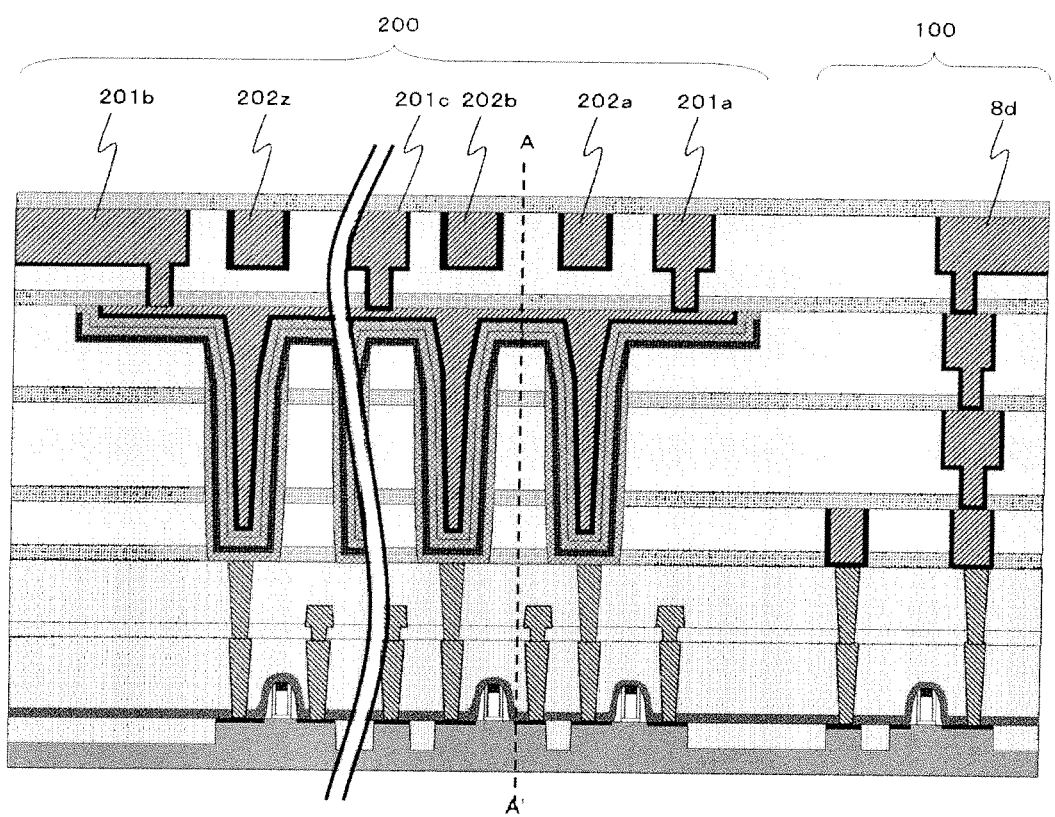
Figure 9:
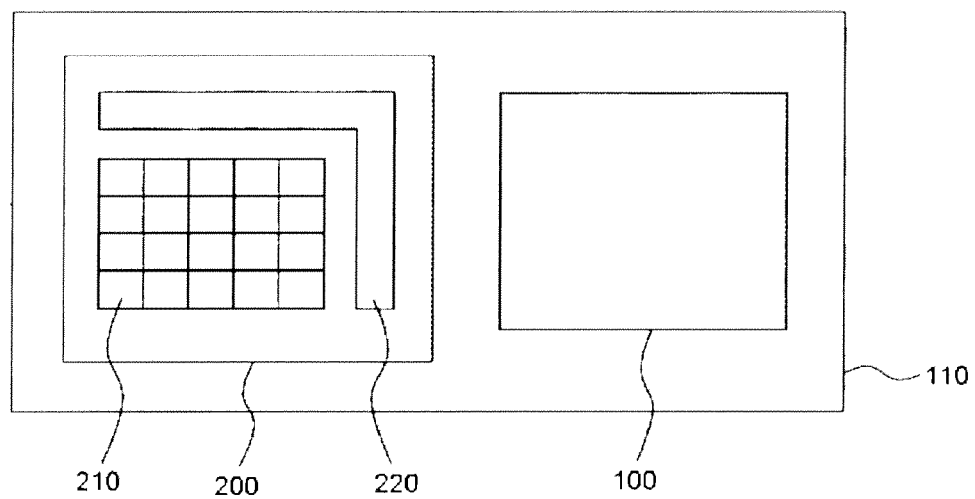
FIG. 9 is a top view schematically illustrating the semiconductor device of the first embodiment.

FIG. 1 and FIG. 2 are sectional views schematically illustrating a semiconductor device of a first embodiment. FIG. 1 is an extraction of a portion on the right side, as seen in the drawing, of dashed line A-A' in FIG. 2 for simplicity. FIG. 9 is a top view schematically illustrating the semiconductor device of the first embodiment.

The semiconductor device of this embodiment has a substrate (semiconductor substrate 1); a multi-layered interconnect formed on the semiconductor substrate 1, and having a plurality of interconnect layers, each of which being configured by an interconnect and an insulating layer, stacked therein; a memory circuit 200 formed in a memory circuit region on the semiconductor substrate 1 in a plan view, and having a peripheral circuit and at least one capacitor element 19 embedded in the multi-layered interconnect; and a logic circuit 100 formed in a logic circuit region on the semiconductor substrate 1, which is a region different from the memory circuit region in a plan view. In the semiconductor device, the capacitor element 19 is configured by a lower electrode 14, a capacitor insulating film 15, an upper electrode 16, an embedded electrode, and an upper interconnect 18. The upper interconnect 18 and the embedded electrode are configured by the same material in an integrated manner. At least one layer of the interconnect (metal interconnect 8c) configuring the logic circuit 100 is provided between the upper interconnect 18 and the lower electrode 14. In the semiconductor device of this embodiment, the top surface of the upper interconnect 18, and the top surface of the interconnect (metal interconnect 8c) configuring the logic circuit 100 formed in the same interconnect layer (insulating interlayer 7c) with the upper interconnect 18, are aligned to the same plane. In this patent specification, "the same plane" means a plane having a maximum value of difference in the level of height, with respect to an average level of height of the surface measured by a method described below, of preferably 30 nm or smaller, more preferably 20 nm or smaller, and still more preferably 10 nm or smaller. Typical methods of measurement include a method of acquiring a sectional image containing the top surface of the upper interconnect 18 and the top surface of the interconnect 8c using a SEM (Scanning Electron Microscope) or a TEM (Transmission Electron Microscope), and then measuring therefrom difference in the level of height; and a method of measuring in-plane height profile using a surface profiler widely adopted to inspection processes in manufacturing of semiconductor devices.

Referring now to FIG. 1, the logic circuit 100 and the memory circuit 200 are respectively formed on the semiconductor substrate 1. Note that constituents of the logic circuit 100 and the memory circuit 200, seen in the drawing, are only a part of those selected from elements composing the individual circuits, so that the scope of the present invention is not limited, for example, by mode of connection of the active element and the multi-layered interconnect, which is not directly relevant to the embodiments of the present invention.

As illustrated in FIG. 1, on the surface of the semiconductor substrate 1, an active element 3a configuring the logic circuit 100 and an active element 3b composing a memory cell of the memory circuit 200 are respectively formed. In a region parting the active element 3a and the active element 3b from each other, device isolation layers 2 are formed in the surficial portion of the semiconductor substrate 1. The device isolation layers 2 (silicon oxide film, etc.) and the active elements 3a, 3b (transistors, etc.) may be any of those obtained by generally-adoptable methods of manufacturing a semiconductor device, by which the scope of the present invention will not limitatively be understood.

While bit lines 12 and the active element 3b configuring the memory cell in an actual memory circuit 200 are arranged so as to align the longitudinal directions thereof nearly orthogonal to each other, the gate of the active element 3a herein is illustrated so as to extend the longitudinal direction thereof normal to the sheet of drawing, similarly to the bit lines 12, for simplicity of illustration. In all sectional views referred to hereinafter in this patent specification, the above-described way of illustration will be adopted with respect to positional relation between the longitudinal directions of the bit lines 12 and the gate of the active element 3a configuring the logic circuit 100, unless otherwise specifically noted.

Also as illustrated in FIG. 9, the semiconductor device of this embodiment is configured to have the memory circuit 200 which contains the capacitor element 210, and the logic circuit 100 which has the semiconductor element formed therein, mounted together on the semiconductor substrate 110. The logic circuit 100 is formed in a region different from the memory circuit 200, and is different from a peripheral circuit 220 of the capacitor element 210 in the memory circuit 200. For example, the logic circuit region may be given as a region having a high-speed logic circuit, such as CPU (Central Processing Unit), formed therein.

Next, structures and constitutive materials of the constituents of the semiconductor device of the first embodiment will be detailed.

As illustrated in FIG. 1, contact-embedding insulating interlayers 4, 5a, 5b are formed, over the device isolation layer 2 and the active elements 3a, 3b formed on the semiconductor substrate 1. Cell contact plugs 10, 10a, 10b are formed in the contact-embedding insulating interlayer 4. On the other hand, bit line contact plugs 11, the bit lines 12, and capacitor contact plugs 13, 13b are respectively formed in the contact-embedding insulating interlayers 5a and 5b. Note that the nomenclature of the contact plugs used in the above description was defined in order to clarify roles of the individual contact plugs, and will be applied also to the description hereinafter in this patent specification.

At least one layer, out of the contact-embedding insulating interlayers 4, 5a, 5b is preferably an insulating film having a dielectric constant smaller than that of silicon oxide film. This sort of insulating film includes those generally called low-k film, obtained by partially replacing oxygen atoms in silicon oxide film with fluorine atoms, carbon atoms, or hydrocarbon groups; and so-called porous insulating film containing at least silicon, oxygen and carbon, and having micro-pores of several nanometers in diameter formed therein. The insulating film is preferably those having no micro-pores formed therein and having a dielectric constant of 3.1 or smaller, and more preferably those having micro-pores formed therein and having a dielectric constant of 2.6 or smaller. By virtue of these configuration, parasitic capacitance of the contact plugs may be reduced, delay in operations of the memory circuit and the logic circuit may consequently be reduced, and thereby operational speed of the semiconductor device may be improved.

In the memory circuit 200, one impurity-diffused layer of the active element 3b and the bit line 12 are electrically connected through the cell contact plug 10a and the bit line contact plug 11. The other impurity-diffused layer of the active element 3b and the capacitor element 19 is electrically connected through the cell contact plug 10b and the capacitor contact plug 13b. By the configuration, the active element 3b, the bit line 12, and the capacitor element 19 are connected with each other, to configure a one-transistor-one-capacitor-type memory cell known as a general memory cell in DRAM (Dynamic Random Access Memory) circuit.

Over the contact-embedding insulating interlayer 5b, insulating interlayers 6a, 7a, 6b, 7b, 6c, 7c and 6d are stacked in this order. The insulating interlayers 6a to 6d are capping films. In the logic circuit region, interconnects 8a, 8b, 8c are respectively formed in the individual insulating interlayers. As is obvious from the above, a multi-layered interconnect is formed in this embodiment. The interconnects 8a, 8b are preferably formed by the dual-damascene process which is generally adopted as a method of forming multi-layered interconnect of semiconductor devices. By the adoption, costs for manufacturing the interconnects may be reduced, and resistivity of via for connecting an interconnect with another interconnect which resides in some other layer may be reduced. Note that the interconnects 8b, 8c illustrated in FIG. 1 are given reference numerals and symbols, while assuming that also vias for establishing connection respectively with the underlying interconnects 8a, 8b as a part of the interconnects. In other word, the interconnects formed by the damascene process are understood as containing the vias, unless otherwise specifically noted. The individual interconnects 8a to 8c have barrier metal film formed therearound.

Materials for composing the insulating interlayer may be silicon oxide film, generally known low-k film composed of silicon oxide film having fluorine, carbon and so forth contained therein, and so-called porous film having micro-pores formed therein. Not only for the logic circuit 100 and the memory circuit 200, dielectric constant of the insulating interlayer is preferably lower than that of silicon oxide film, in view of reducing parasitic capacitance between the interconnects. By the strategy, the parasitic capacitance between the interconnects may be reduced, and delay in circuit operation may be suppressed as a consequence. In addition, a plurality of insulating film corresponded to the insulating interlayers 6a to 6d, positioned above the metal material layers composing the multi-layered interconnect, are more preferably films capable of blocking metal diffusion (metal diffusion blocking films), such as insulating films composed of silicon, carbon and nitrogen, or a stacked structure of such insulating films containing these elements. Dielectric constant of the metal diffusion blocking film may be more than that of the silicon oxide film. Moreover dielectric constant of the metal diffusion blocking film more preferably is the same as or less than that of the silicon oxide film in case of optimization of a composition ratio and/or a stacked structure of the metal diffusion blocking film.

In the logic circuit 100, the active element 3a and the interconnect 8a, which is the lowermost interconnect in the multi-layered interconnect, are electrically connected through a series connection of two contact plugs, that are the cell contact plug 10 and the capacitor contact plug 13. By virtue of such structure, the logic circuit 100 and the memory circuit 200 may be formed in an integrated manner on the same semiconductor substrate 1, while adopting the same design parameters for the both.

Next, a structure of the capacitor element 19 in this embodiment will be explained.

The capacitor element 19 in the present invention is formed as a memory element configuring the memory circuit 200. The capacitor element 19 is embedded in the multi-layered interconnect which is composed of three interconnect layers containing the insulating interlayers 6a to 6c and 7a to 7c, and interconnects 8a to 8c. The capacitor element 19 is composed of the lower electrode 14, the capacitor insulating film 15, the upper electrode 16, and the upper interconnect 18 having an embedded electrode. In the capacitor element 19, the lower electrode 14, the capacitor insulating film 15 and the upper electrode 16 are formed conforming to the profile of the recess, and the embedded electrode is formed so as to fill up the recess. The top portion of the embedded electrode is formed as the upper interconnect 18. Since the upper interconnect 18 and the embedded electrode in this embodiment are composed of the same material, so that the both are formed in a seamless manner. In other words, the upper interconnect 18 is embedded in the recess covered with the lower electrode 14, the capacitor insulating film 15, and the upper electrode 16, which are the constituents of the capacitor element 19, and functions also as an embedded electrode. The upper interconnect 18 and the embedded electrode are formed in the same process.

The upper interconnect 18 is also provided with an extension electrode 18a for connection with still upper interconnects. In a plan view, the capacitor element 19 in this embodiment has a first region which functions as a capacitor element, and a second region, different from the first region, which functions as an interconnect. More specifically, as seen in FIG. 1, the first region has the lower electrode 14 formed therein, on the other hand, the second region has the extension electrode 18a formed outside the sidewall of the lower electrode 14. The bottom and the sidewall of the extension electrode 18a are covered by the upper electrode 16. In particular, right under the extension electrode 18a, the upper electrode 16 and the capacitor insulating film 15 are formed. Note that, as illustrated in FIG. 1, a barrier metal film 17 may be formed between the upper electrode 16 and the upper interconnect 18.

The lower electrode 14 and the upper electrode 16 function as electrodes which configure a parallel plate-type capacitor element while placing the capacitor insulating film 15 in between. The lower electrode 14 and upper electrode 16 are preferably composed of refractory metals such as titanium, tantalum and so forth, or nitrides of these metals, and are preferably formed using materials capable of improving crystallinity of the capacitor insulating film 15.

The capacitor insulating film 15 is preferably composed of a material having a dielectric constant larger than that of silicon nitride film, which is exemplified by zirconium dioxide ($ZrO_2$), zirconium aluminate ($ZrAlO_x$), and zirconium dioxide film added with lanthanide such as Tb, Er, Yb or the like. By elevating the dielectric constant of the capacitor insulating film 15, the electrostatic capacity of the capacitor element 19 may be increased.

In the capacitor element 19 in this embodiment, the topmost surface of the upper interconnect 18 is aligned to the same plane with the topmost surface of the interconnect 8c configuring the logic circuit 100. The upper interconnect 18 and the interconnect 8c formed in the same interconnect layer with the upper interconnect 18 are formed in the same process. As a consequence, the upper interconnect 18 is configured by the same material with the interconnect 8c configuring the logic circuit 100.

Over the top surface of the upper interconnect 18, and over the top surface of the interconnect 8c formed in the same interconnect layer with the upper interconnect 18 and configuring the logic circuit 100, a metal diffusion blocking film (the insulating interlayer 6d) is formed in common.

The lower limit of the height of the capacitor element 19 in the thickness-wise direction of the multi-layered interconnect (simply referred to as "thickness-wise direction" on occasions, hereinafter) is equivalent to one layer, and preferably two or more layers. The upper limit of the height of the capacitor element 19 in the thickness-wise direction is not specifically limited. One layer herein is configured by one interconnect layer (insulating interlayers 7a, 7b, 7c, etc.) and one capping film (insulating interlayers 6a, 6b, 6c) formed between the interconnect layers, in the multi-layered interconnect.

As for the upper interconnect 18 of the capacitor element 19 in the present invention, the extension electrode 18a, drawn out for external connection, preferably has a height in the thickness-wise direction equivalent to, or smaller than, the height of the interconnect 8c of the logic circuit 100 in the thickness-wise direction, and more preferably smaller than the height of the interconnect 8c. Accordingly, ratio of height occupied by the lower electrode 14 in a predetermined thickness of the interconnect layer may be increased, and thereby electrostatic capacity of the capacitor element 19 may be improved. Since the layer structure of semiconductor devices is generally determined so as to satisfy design parameters, so that it is impossible to alter, for example, the thickness of the interconnect layer only for the purpose of forming the capacitor element. For the case where the capacitor element is formed in the interconnect layer, it is therefore necessary to enlarge the areas of contact among the lower electrode 14, the capacitor insulating film 15, and the upper electrode 16, which determine electrostatic capacity in terms of electromagnetism. In other words, it is necessary to increase the height of the lower electrode 14 in the present invention.

Since the upper interconnect 18 in this embodiment is formed using the same material with the embedded electrode while being integrated therewith, so that the height of the upper interconnect 18 may be reduced for the purpose increasing the height of the lower electrode 14.

In this embodiment, since the upper interconnect 18 has the extension electrode 18a which extends, in the top view, outward from the area having the lower electrode 14 provided therein, so that it may be good enough to connect the extension electrode 18a to a fixed-potential interconnect 201a, for the purpose of establishing connection to a fixed potential in order to make the capacitor element 19 function as a memory cell of the memory circuit 200. Accordingly, the designer of the semiconductor device may freely create an interconnect layout using the interconnects which fall in the area having the lower electrode 14 contained therein, out of all interconnect layers which reside above the capacitor element 19. For example, the designer can use signal interconnects 202a, 202b, 202z as shunt interconnects of word lines and bit lines in the memory circuit 200.

The interconnect layer which resides in the same level with the capacitor element 19 preferably has at least one layer of interconnect configuring the logic circuit 100 formed therein. More preferably, in the interconnect layer (insulating interlayers 6a to 6c, and 7a to 7c) which resides in the same level with the capacitor element 19 always has the interconnect (interconnects 8a to 8c) configuring the logic circuit 100. In other words, the height of the capacitor element 19 in the thickness-wise direction may be designed to be equal to the total height of a plurality of interconnects, formed in the same level with the capacitor element 19, in the thickness-wise direction. Another possible configuration may be such as having no layer having only contact plugs formed therein, in the interconnect layer which resides in the same level with the capacitor element 19.

Geometry of the capacitor element 19 may typically be cylindrical, T-shape in cross-sectional view or the like, while not being specifically limited. The capacitor element 19 is formed in the insulating interlayer which is composed of the same material with the insulating interlayer configuring the logic circuit 100.

As illustrated in FIG. 2, in the memory circuit 200 of the semiconductor device, a plurality of capacitor elements 19 illustrated in FIG. 1 are arranged in series in the horizontal direction over the substrate. The plurality of capacitor elements 19 are formed en bloc. All of the plurality of capacitor elements 19 are configured to have the top surfaces thereof aligned to the same plane with the top surface of the interconnect 8c. The semiconductor device of this embodiment has the logic circuit 100 having a scale suitable therefor. Accordingly, the memory circuit 200 is required to have a necessary number of capacitor elements 19 for configuring the semiconductor device. As seen in FIG. 2, fixed-potential interconnects 201a, 201b, 201c are connected to the upper interconnect 18a of the capacitor element 19 illustrated in FIG. 1. Potential owned by the fixed-potential interconnects 201a, 201b, 201c may arbitrarily be set by the designer of the memory circuit. According to the first embodiment, a plurality of signal interconnects 202a, 202b, 202z are arranged over the capacitor elements 19.

In this embodiment, the top surface of the upper interconnect 18 and the top surface of the interconnect 8c are aligned to the same plane. Over the top surface of the upper interconnect 18 and over the top surface of the interconnect 8c, the capping film (insulating interlayer 6d) is formed in common. Accordingly, the fixed-potential interconnects 201a to 201c which configure the memory circuit 200 connected to the upper interconnect 18 have the same height, in the thickness-wise direction, with the height, in the thickness-wise direction, of the interconnect 8d which configures the logic circuit 100 formed in the same interconnect layer with these interconnects.

An additional interconnect layer, composed of an interconnect and an insulating interlayer, may be formed over the fixed-potential interconnects 201a to 201c, and the signal interconnects 202a, 202b, 202z configuring the memory circuit 200, and over the interconnect 8d configuring the logic circuit 100 illustrated in FIG. 2. In this way, the semiconductor device may be configured by forming a multi-layered interconnect structure of the semiconductor device generally adopted. Since possibility of such configuration of semiconductor device is obvious to those skilled in the art, so that a structure of the interconnect which resides on the still upper side of the interconnect layer, having the fixed-potential interconnects 201a to 201c, signal interconnects 202a, 202b, 202z and the interconnect 8d formed therein, is not specifically illustrated in the present invention.

Next, a method of manufacturing according to the first embodiment will be detailed, referring to the attached drawings.

Figure 3A:
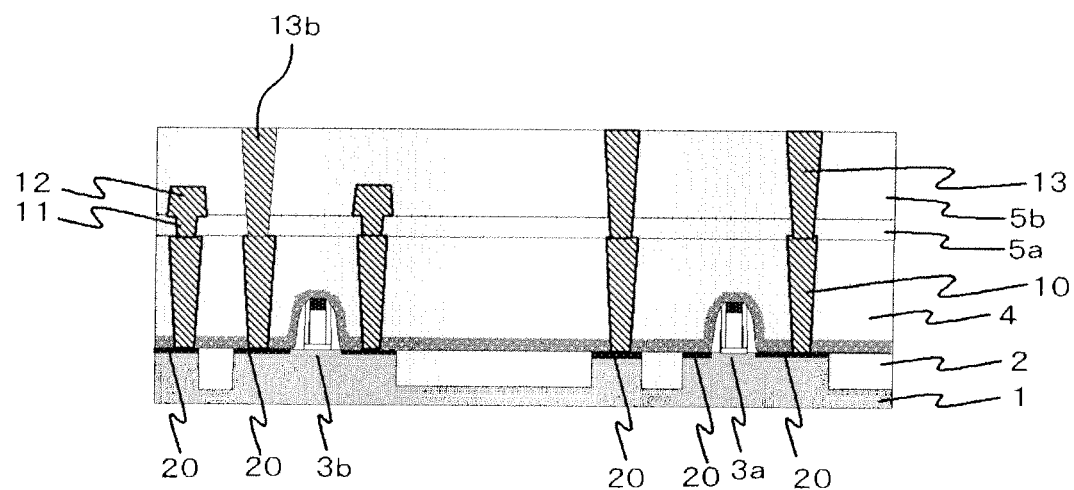
FIGS. 3A to 3W are sectional views sequentially illustrating procedures of manufacturing of the semiconductor device of the first embodiment.

FIGS. 3A to 3W are sectional views sequentially illustrating procedures of manufacturing according to the first embodiment, each of which showing only a portion on the right side, as seen in the drawing, of dashed line A-A' in FIG. 2 for simplicity.

The method of manufacturing a semiconductor device of this embodiment is a method of manufacturing a semiconductor device having the memory circuit 200 and the logic circuit 100 formed on the same substrate (semiconductor substrate 1). The method includes a step of forming an insulating layer (insulating interlayer 7c) on the semiconductor substrate 1, forming an opening (an opening 23 for forming therein the capacitor element) in the insulating layer, and forming the lower electrode 14, the capacitor insulating film 15 and the upper electrode 16 in the opening; a step of forming an interconnect trench (an opening 37 for forming therein the interconnect 8c configuring the logic circuit 100) in the insulating layer having the opening formed therein; a step of forming a metal film (an electro-conductive film 38) so as to fill the opening and the interconnect trench; and a step of planarizing the electro-conductive film 38. In the step of planarizing the electro-conductive film 38, a capacitor element 19 configured by the lower electrode 14, the capacitor insulating film 15, the upper electrode 16, an embedded electrode and the upper interconnect 18, is formed in the opening, while forming the interconnect 8c configuring the logic circuit 100 in the interconnect trench.

In the step of forming the interconnect trench in this embodiment, the interconnect trench (opening 37) to be filled up with the interconnect 8c configuring the logic circuit 100 is formed by using, as a mask, the upper electrode 16 of the capacitor element 19.

First, as illustrated in FIG. 3A, the device isolation layer 2, and the active elements 3a, 3b are formed on the semiconductor substrate 1, by a method generally adopted. Further thereover, the insulating interlayer 4, the cell contact plugs 10, the insulating interlayer 5a, the bit line contact plugs 11, the bit lines 12, the insulating interlayer 5b, and the capacitor contact plugs 13, 13b are respectively formed. In the method of manufacturing a semiconductor device of the present invention, the steps up to that the capacitor contact plugs are formed may be proceeded conforming to the method of manufacturing a semiconductor device generally adopted. Although not illustrated, an exemplary process may be such as forming the active elements 3a, 3b, allowing the insulating interlayer 4 to deposit thereon, forming the openings, later having the cell contact plugs formed therein by photolithography and etching, filling the openings with a contact-forming material by CVD (Chemical Vapor Deposition), and removing an excessive portion of the contact-forming material by CMP (Chemical Mechanical Polishing), to thereby form the cell contact plugs 10. Thereafter, the contact-embedding insulating interlayer 5a, later having the bit line contact plugs formed therein, is deposited, and the opening, later having the bit line contact plugs 11 formed therein, are formed by photolithography and etching. A metal material is then deposited by CVD, and the bit line contact plugs 11 and the bit lines 12 are formed by a photolithography and reactive ion etching. Thereafter, the contact-embedding insulating interlayer 5b is deposited, planarized by CMP, and capacitor contact plugs 13, 13b are formed by a method similar to that for forming the cell contact plugs 10. In this way, a structure illustrated in FIG. 3A may be embodied.

As seen in FIG. 3A, the impurity-diffused layers have, formed on the surface thereof, a layer of alloy generally called silicide 20, formed between silicon and a metal such as cobalt, nickel, platinum or the like. Gate electrodes of the active elements 3a, 3b may be configured by a generally-adopted polysilicon electrode, partially-silicided polysilicon electrode, or a metal gate electrode under recent research and development. Either of the publicly-known, gate-first process and gate-last process may preferably be adoptable to the method of forming the metal gate electrode, for the memory circuit and the logic circuit in the present invention. FIG. 3A illustrates the polysilicon gate electrode as a more general example. In the generally-adopted method of manufacturing a semiconductor device, the cell contact plugs 10, the bit line contact plugs 11, the bit lines 12, and the capacitor contact plugs 13 in many cases are formed using tungsten. The scope of the present invention is, however, not limited by materials composing the contact plugs and the bit lines, instead allowing the contact plugs and bit lines configured, for example, by copper or alloy mainly composed of copper. Formation of the contact plugs is generally preceded by formation of a barrier metal, typically composed of titanium or titanium nitride, provided so as to cover the bottom of the openings, before the opening are filled up with a contact-forming material. Also the barrier metal is, however, not illustrated since it does not affect the configuration and effects of the present invention. In short, since the structure and method of manufacturing of the present invention are characterized by the structure and method of manufacturing the capacitor elements and the logic circuit interconnect which resides nearly in the same layer with the capacitor elements, so that any other portions configuring the logic circuit and the memory circuit will not disadvantageously affect the structure and effects of the present invention, and therefore any of generally-adoptable structure and method of manufacturing may be adoptable herein.

Figure 3B:
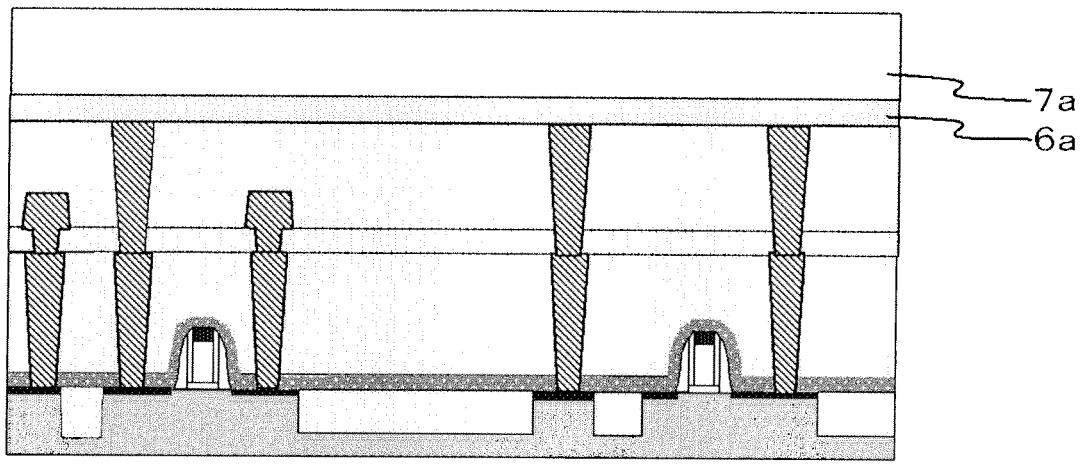

Next, as illustrated in FIG. 3B, the insulating interlayers 6a and 7a are deposited over the capacitor contact plugs 13, 13b. While it is more preferable for the insulating interlayer 6a to serve as an etching stopper film which exhibits a large etching selectivity over the insulating interlayer 7a in the process of reactive ion etching of the insulating interlayer 7a, it is not a constituent indispensable for the structure of the present invention.

Figure 3C:
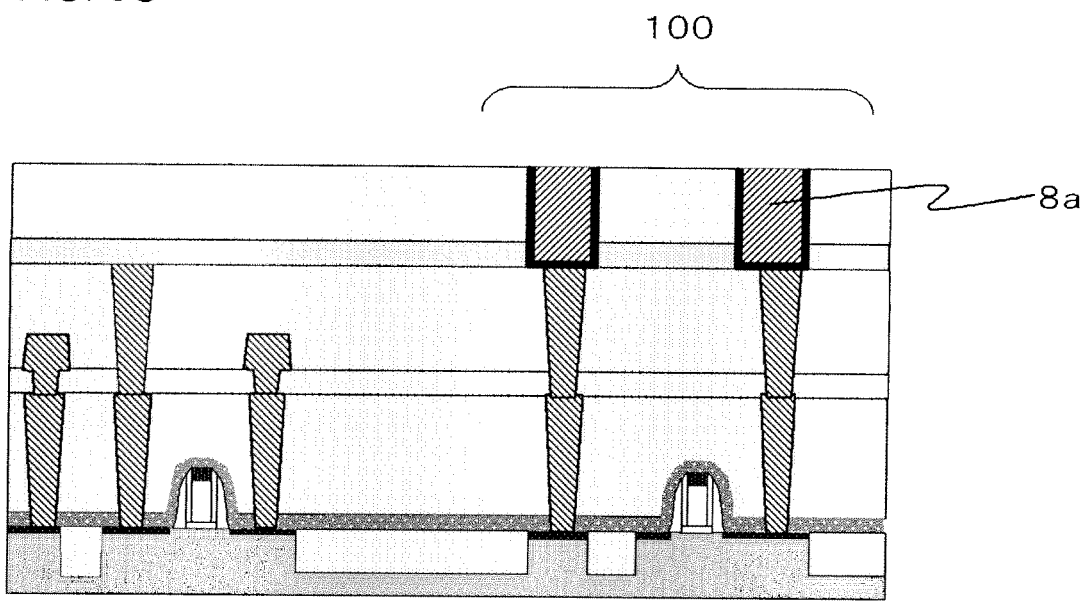

Next, as illustrated in FIG. 3C, the interconnects 8a, which are constituents of the logic circuit 100, are formed in the insulating interlayers 6a and 7a by the generally-adoptable dual damascene process.

Figure 3D:
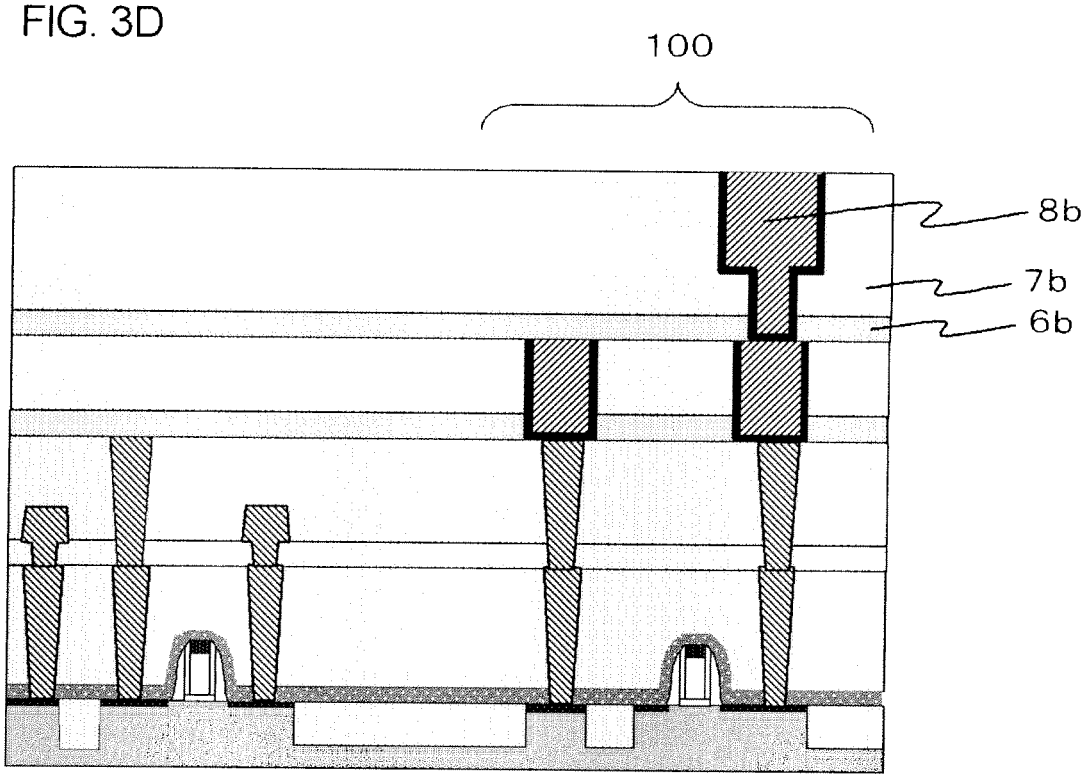

Next, as illustrated in FIG. 3D, the insulating interlayers 6b, 7b are deposited similarly as illustrated in FIGS. 3B and 3C, and the interconnect 8b of the logic circuit is formed by the damascene process.

Figure 3E:
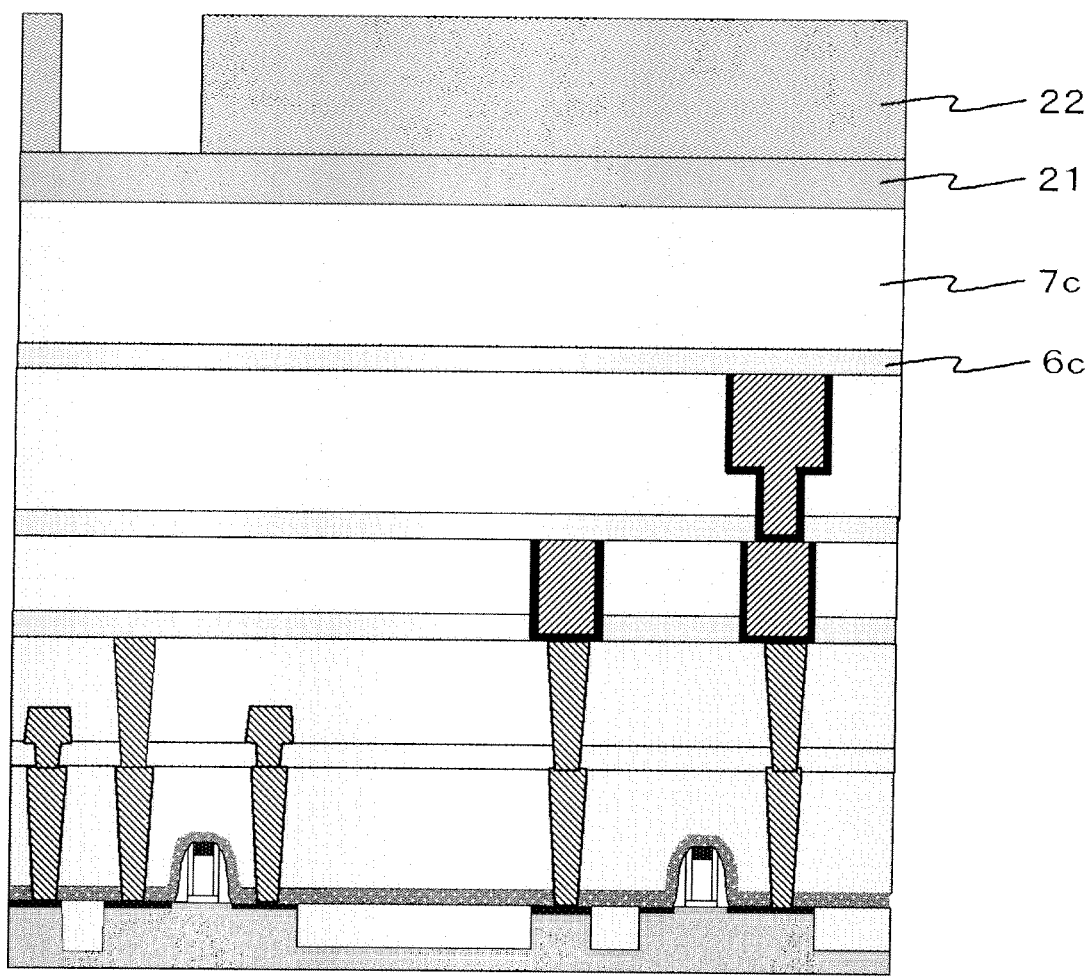

Next, as illustrated in FIG. 3E, the insulating interlayers 6c and 7c are deposited, and further on the insulating interlayer 7c, an insulating film which serves as a hard mask 21 used for forming the cylindrical capacitor elements and the interconnects of the logic circuit is deposited. The hard mask 21 is preferably an insulating film which exhibits a large etching selectivity over the insulating interlayer 7c in the process of etching the insulating interlayer 7c, and preferably a silicon oxide film, for example. A photoresist layer 22 is formed by coating on the hard mask 21. A predetermined pattern of cylindrical capacitor elements is then formed in the photoresist layer 22, typically by photolithography. While FIG. 3E illustrates the photoresist layer 22 as a single-layered film, a multi-layered photoresist structure, which has been becoming more popular, and is typically composed of a planarizing organic layer, a silicon oxide film, an anti-reflection film, and a photosensitive resist, may alternatively be used.

Figure 3F:
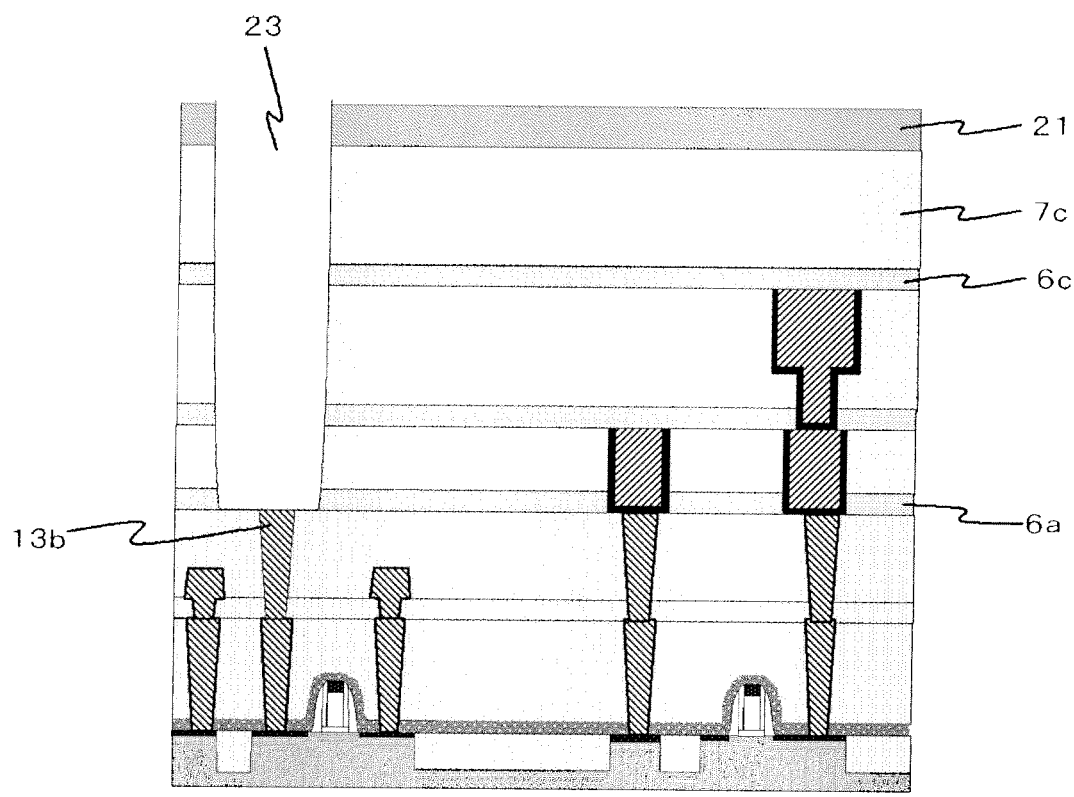

Next, as illustrated in FIG. 3F, the opening 23 for forming therein the cylindrical capacitor element is formed by a micro-processing method such as reactive ion etching, using the photoresist layer 22 and the hard mask 21 as a mask. While the photoresist layer 22 is consumed in midway of the etching for forming the opening 23, the residual etching of the opening 23 may be continued using the hard mask 21 as the mask. FIG. 3F illustrates a state obtained after the photoresist layer 22 was completely removed.

Figure 3G:
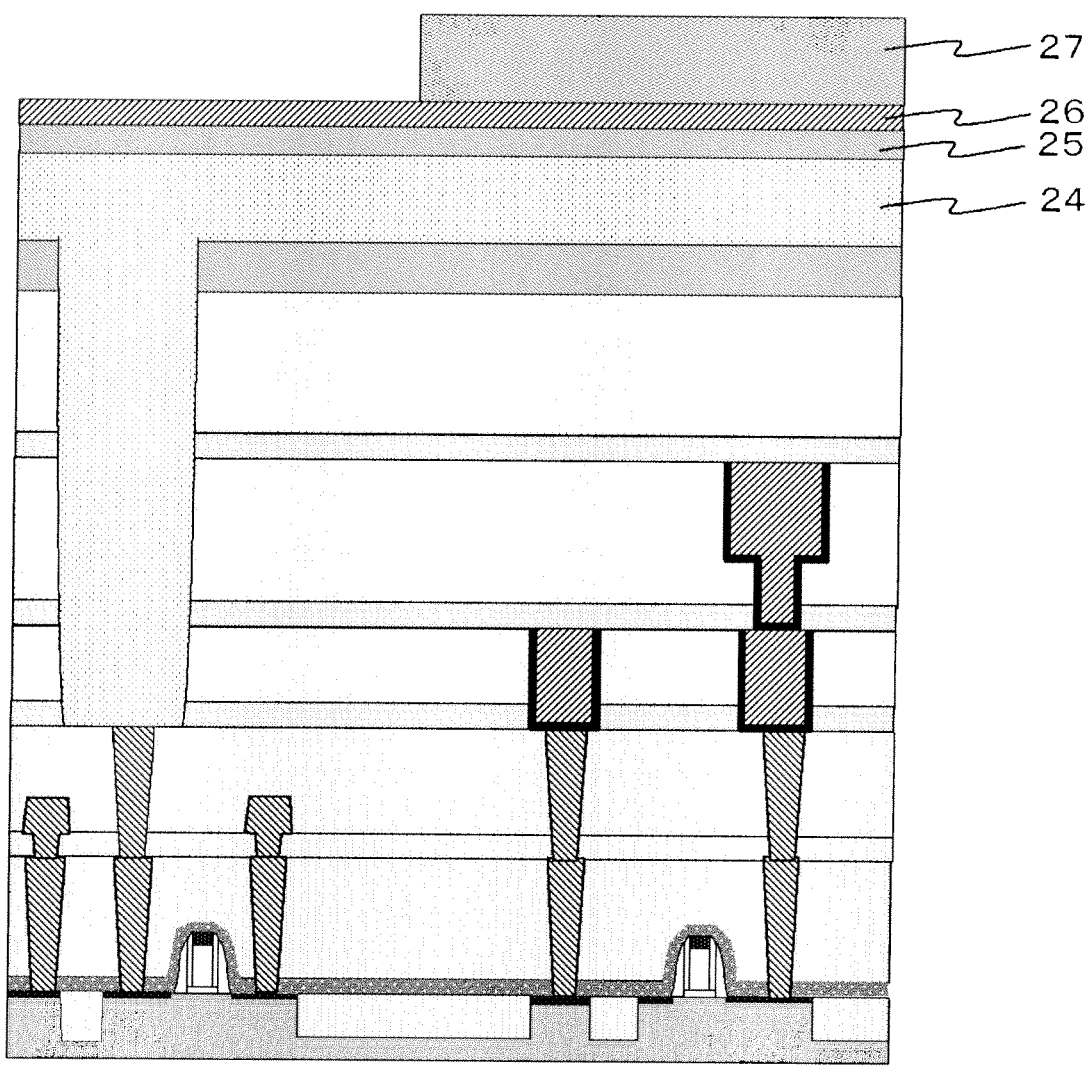

Next, as illustrated in FIG. 3G, a multi-layered resist used for patterning the interconnect trench, in which the upper interconnect of the capacitor element is formed later, is formed. The multi-layered resist preferably has a structure obtained by depositing a planarizing film 24 so as to fill the opening, and a silicon oxide film 25, an anti-reflection film 26, and a photoresist layer 27 are sequentially deposited on the planarizing film 24.

Next, as illustrated in FIG. 3H, an interconnect trench (opening 28), in which the upper interconnect of the capacitor element is formed later, is formed in the insulating interlayer 7c using the photoresist layer 27 and the hard mask 21 as a mask. Method of formation herein may be a micro-processing method such as reactive ion etching, similarly to the above-described processing for forming the cylindrical opening. During the reactive ion etching, or after the insulating interlayer 7c was processed by reactive ion etching, the planarizing film 24 remained in the cylinder-form opening 23 is removed. Next, the insulating interlayer 6a exposed on the bottom of the opening 23 is removed by reactive ion etching, to thereby complete the opening through which connection with the capacitor contact plug 13b provided under the opening 23 may be established. For the case where ashing using $CO_2$ or $O_2$ plasma is adopted to remove the planarizing film 24, the insulating interlayers 7a, 7b, 7c are preferably configured by using a low-k film excellent in durability against process damage, and more preferably configured by a film described in International Electron Device Meeting, Digest of Technical Papers, IEEE, p. 619-622 (2008), which is highly durable against the process damage.

As preferable examples of the low-k insulating interlayer, organosilica films having high carbon contents will be briefed below. The organosilica films may be formed typically by using, as a source material, organosiloxane having a six-membered cyclic siloxane as a principal skeleton, and has organic group(s) as functional group(s). The organic functional group bound to silicon atom is preferably an unsaturated hydrocarbon group and an alkyl group. The unsaturated hydrocarbon group may be exemplified by vinyl group, propenyl group, isopropenyl group, 1-methyl-propenyl group, 2-methyl-propenyl group, and 1,2-dimethyl-propenyl group. Particularly preferable unsaturated hydrocarbon group is vinyl group. The alkyl group is preferably a functional group which is bulky and is therefore capable of function as a steric hindring group, such as isopropyl group, isobutyl group, and tert-butyl group. By using such source material, an extremely fine (mainly 0.5 nm or smaller) independent pore structure may be introduced into the organosilica film. SCC film is known to have a blocking performance against copper diffusion, despite its nature as a sort of SiOCH film, and is characterized by its larger carbon content as compared with generally-known SiOCH film. More specifically, when compared on the basis of carbon/silicon ratio, the SCC film contains carbon approximately four times much more than that of the general SiOCH film. On the other hand, the SCC film is less in element ratio of oxygen as compared with the general SiOCH film, which is approximately a half. This may be realized by plasma-assisted polymerization of the source material, rather than by plasma CVD by which the source material is dissociated and activated in plasma. The plasma-assisted polymerization may predominantly activate the unsaturated hydrocarbon while keeping the silica skeleton thereof unchanged, and may thereby more readily control chemical structure of the insulating film. By obtaining the organosilica film having a large carbon content in this way, a film having also an excellent durability against process damage may be obtained as a consequence.

While this embodiment dealt with the method of forming the opening 23 for forming therein the capacitor element in advance, and forming thereafter the interconnect trench (opening 28) for forming therein the upper interconnect, another possible method may be such as forming the interconnect trench (opening 28) for forming therein the upper interconnect, and then forming the opening 23 for forming therein the capacitor element.

Figure 3I:
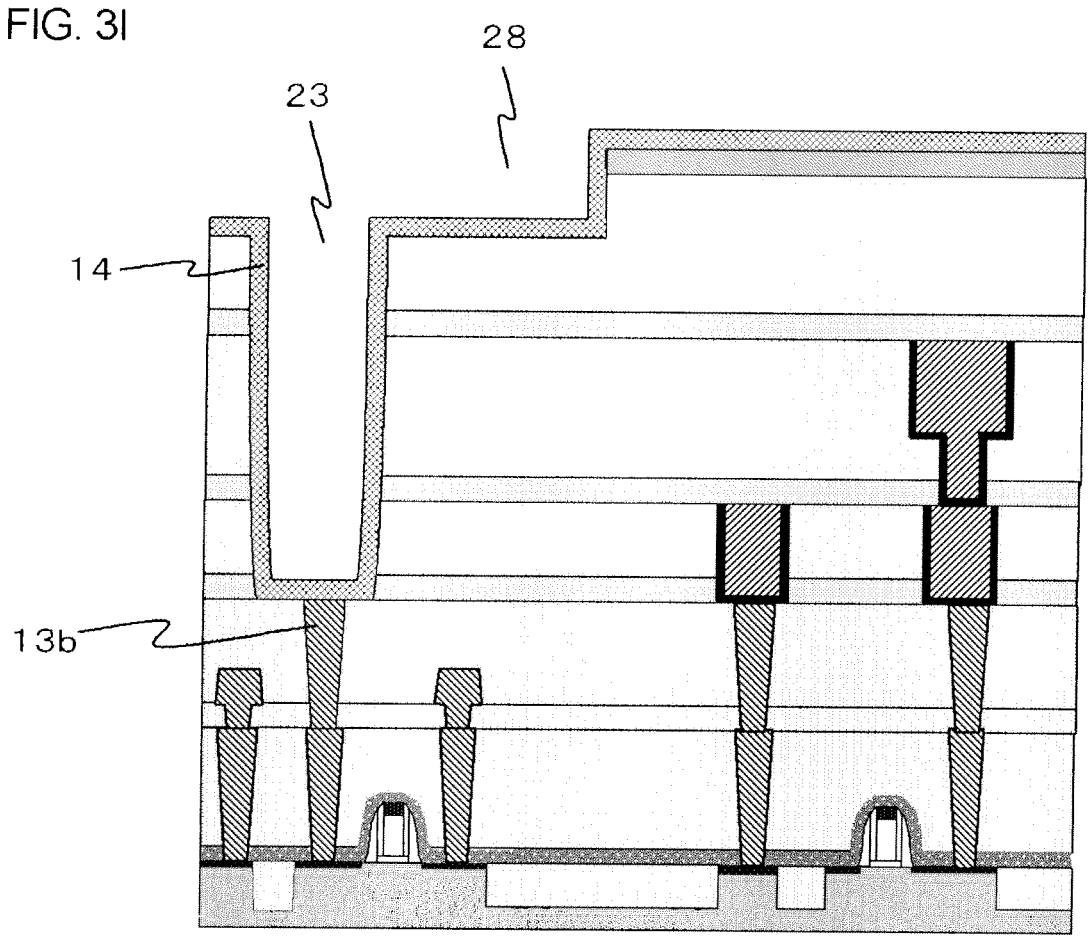

Next, as illustrated in FIG. 3I, the lower electrode 14 is deposited in the opening 23 and the opening 28 which are formed by the processes illustrated up to FIG. 3H. Method of forming the lower electrode 14 may be any of CVD, sputtering, ALD (Atomic Layer Deposition) and so forth generally adopted to manufacturing of the semiconductor devices. While the surface of the work may occasionally be roughened, before the lower electrode 14 is deposited, typically by RF sputtering in order to improve close contactness with respect to the capacitor contact plug 13b, details will not be given below, since such pretreatment will not impair the effects of the present invention. Examples of the material composing the lower electrode 14 adoptable herein include refractory metal and nitrides thereof, such as titanium and titanium nitride, tantalum and tantalum nitride, ruthenium and so forth, and stacked structure of these materials. In the method of manufacturing of this embodiment, the lower electrode 14 is formed using a TiN film.

Figure 3J:
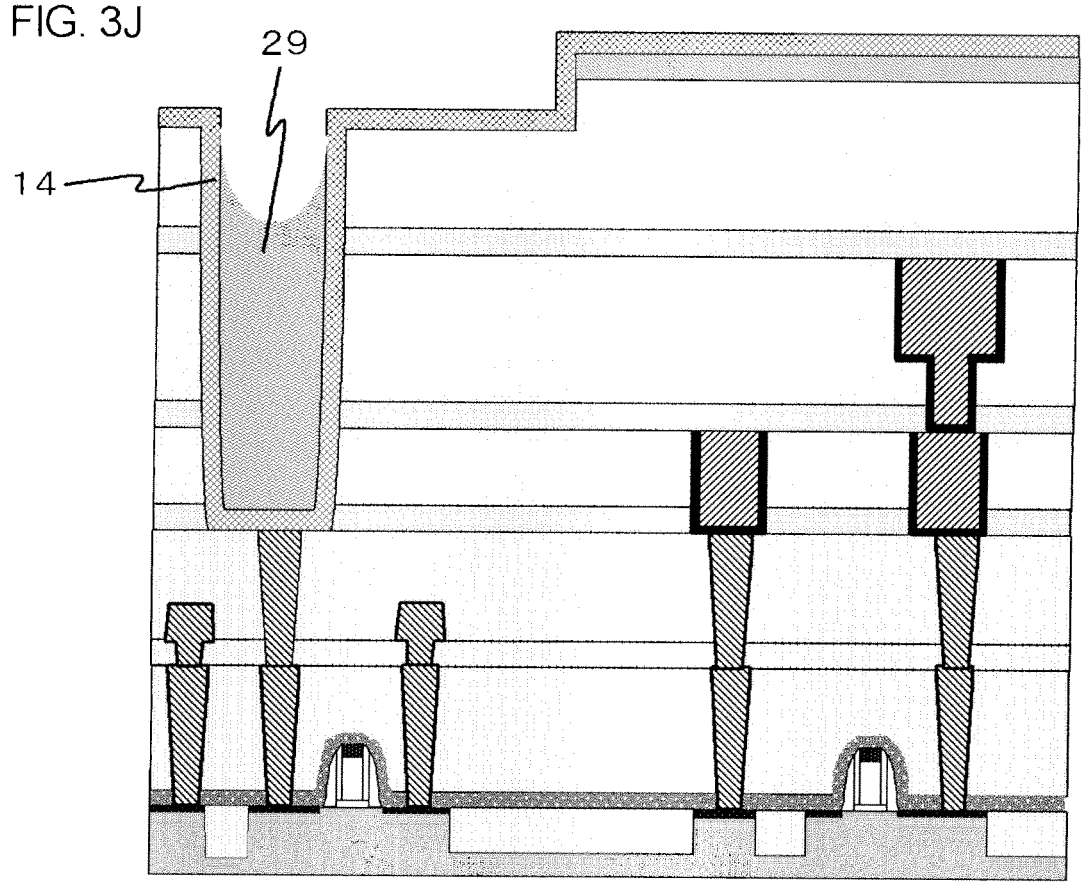

Next, as illustrated in FIG. 3J, a photoresist layer 29 is formed typically by coating, so as to partially fill the opening 23 for forming therein the cylindrical capacitor, having the lower electrode 14 previously deposited therein. The photoresist layer 29 is preferably formed so as to remain only inside the opening 23, and only to a height lower than the top end of the opening 23. If necessary, an unnecessary portion of the photoresist layer 29 may be removed by photolithography.

Figure 3K:
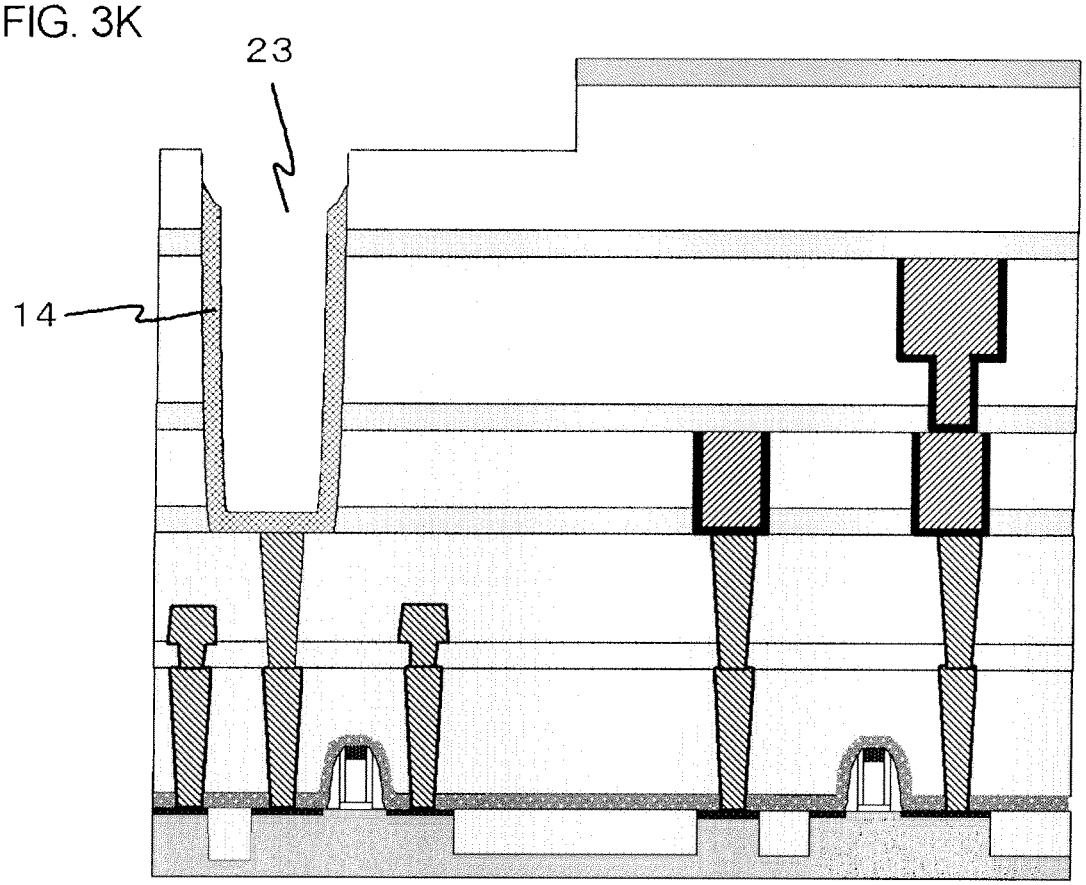

Next, as illustrated in FIG. 3K, the lower electrode 14 is anisotropically etched overall, typically by reactive ion etching. By the anisotropic etching while leaving the photoresist layer 29 only inside the opening 23 as illustrated in FIG. 3J, the lower electrode 14 having a height lower than the top end of the opening 23 may be formed, as illustrated in FIG. 3K.

Figure 3L:
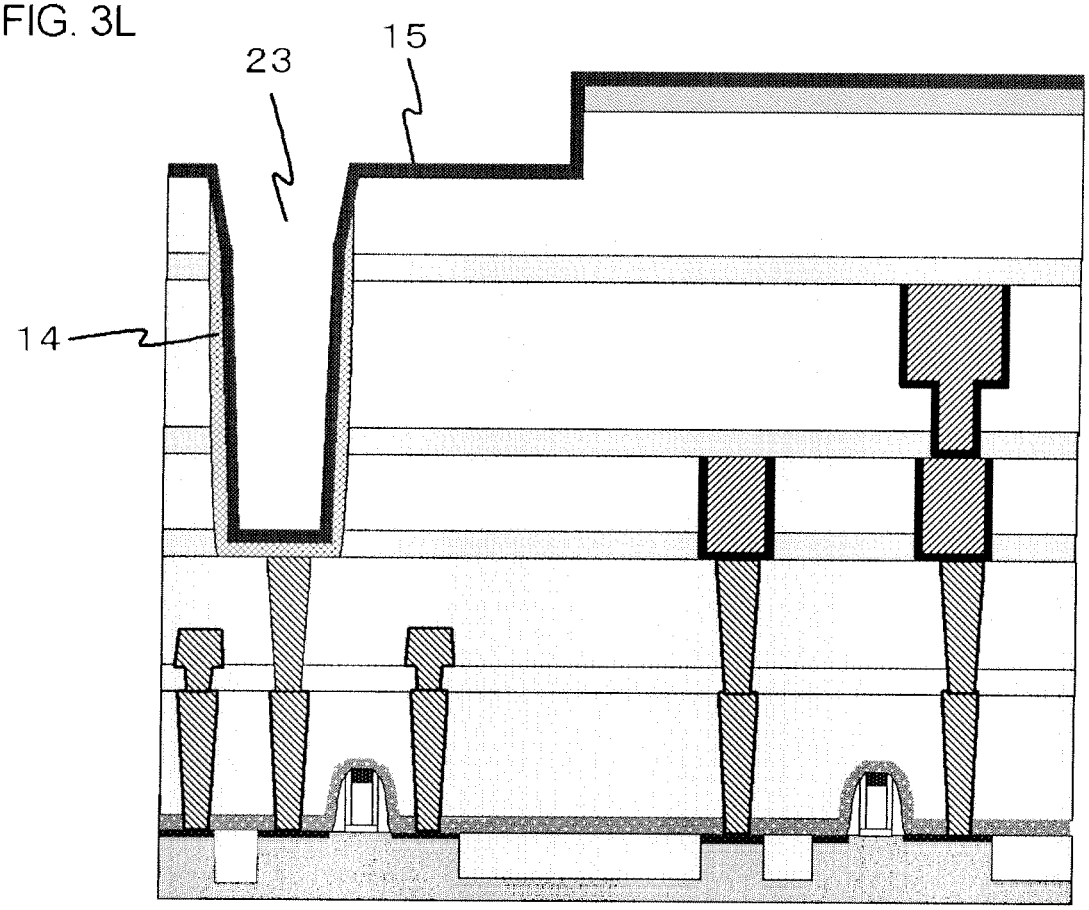

Next, as illustrated in FIG. 3L, the capacitor insulating film 15 is deposited on the lower electrode 14. More specifically, the capacitor insulating film 15 is formed so as to cover at least the opening 23 and the opening 28. While method of forming the capacitor insulating film 15 may be any of CVD, sputtering, ALD and so forth generally adopted to manufacturing of the semiconductor devices, ALD capable of depositing a several-nanometer-thick film with an excellent uniformity may be more preferable, in view of improving electrostatic capacity of the capacitor element. The capacitor insulating film 15 may typically be composed of zirconium dioxide ($ZrO_2$), zirconium aluminate ($ZrAlO_x$), and films obtained by adding lanthanide such as Tb, Er, Yb and so forth, to zirconium dioxide. In the method of manufacturing of this embodiment, the capacitor insulating film 15 is formed using $ZrO_2$. Although not illustrated, the capacitor insulating film 15 may be sintered after the deposition, for the purpose of improving the crystallinity.

Figure 3M:
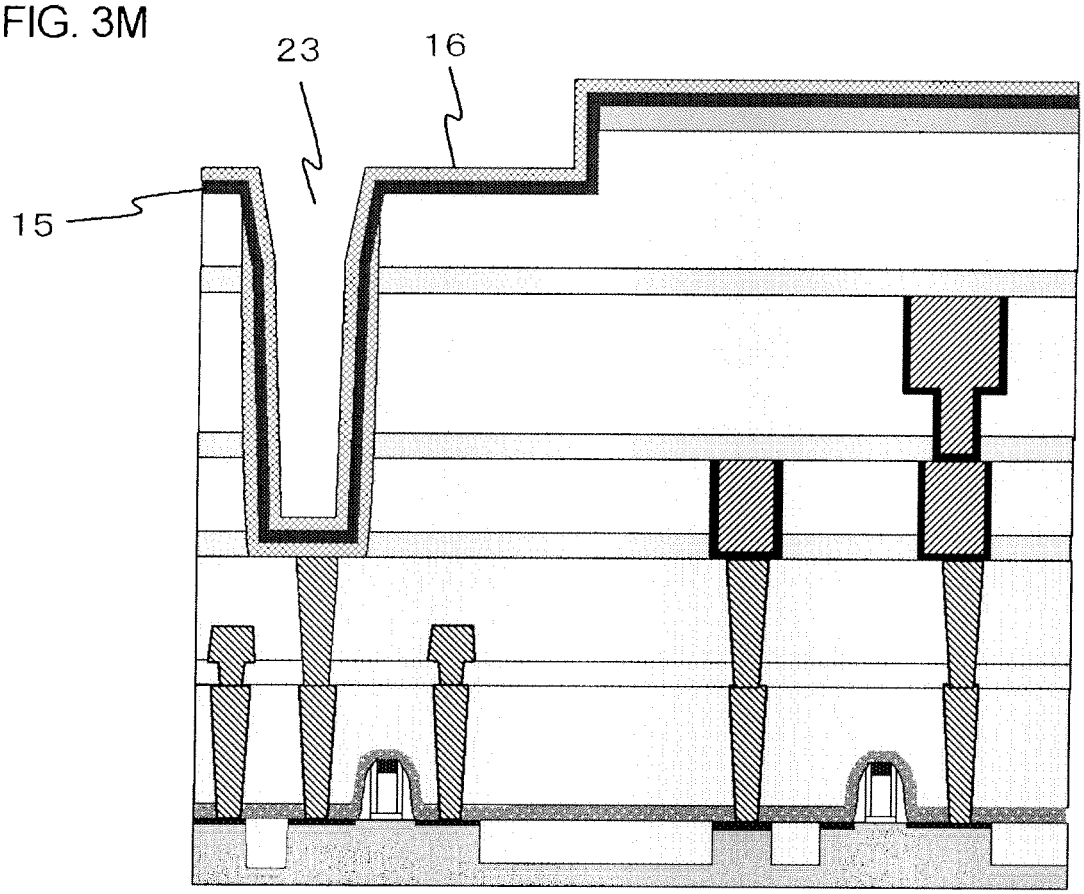

Next, as illustrated in FIG. 3M, the upper electrode 16 is deposited over the capacitor insulating film 15. More specifically, the upper electrode 16 is formed so as to cover at least the opening 23, the opening 28, and the hard mask 21. The upper electrode 16 herein may cover the entire surface of the work. Examples of the material composing the upper electrode 16 adoptable herein include refractory metal and nitrides thereof, such as titanium and titanium nitride, tantalum and tantalum nitride, ruthenium and so forth, and stacked structure of these materials. Method of forming the upper electrode 16 may be any of CVD, sputtering, ALD and so forth generally adopted to manufacturing of the semiconductor devices. In the method of manufacturing of this embodiment, the upper electrode 16 is formed using a TiN film.

Figure 3N:
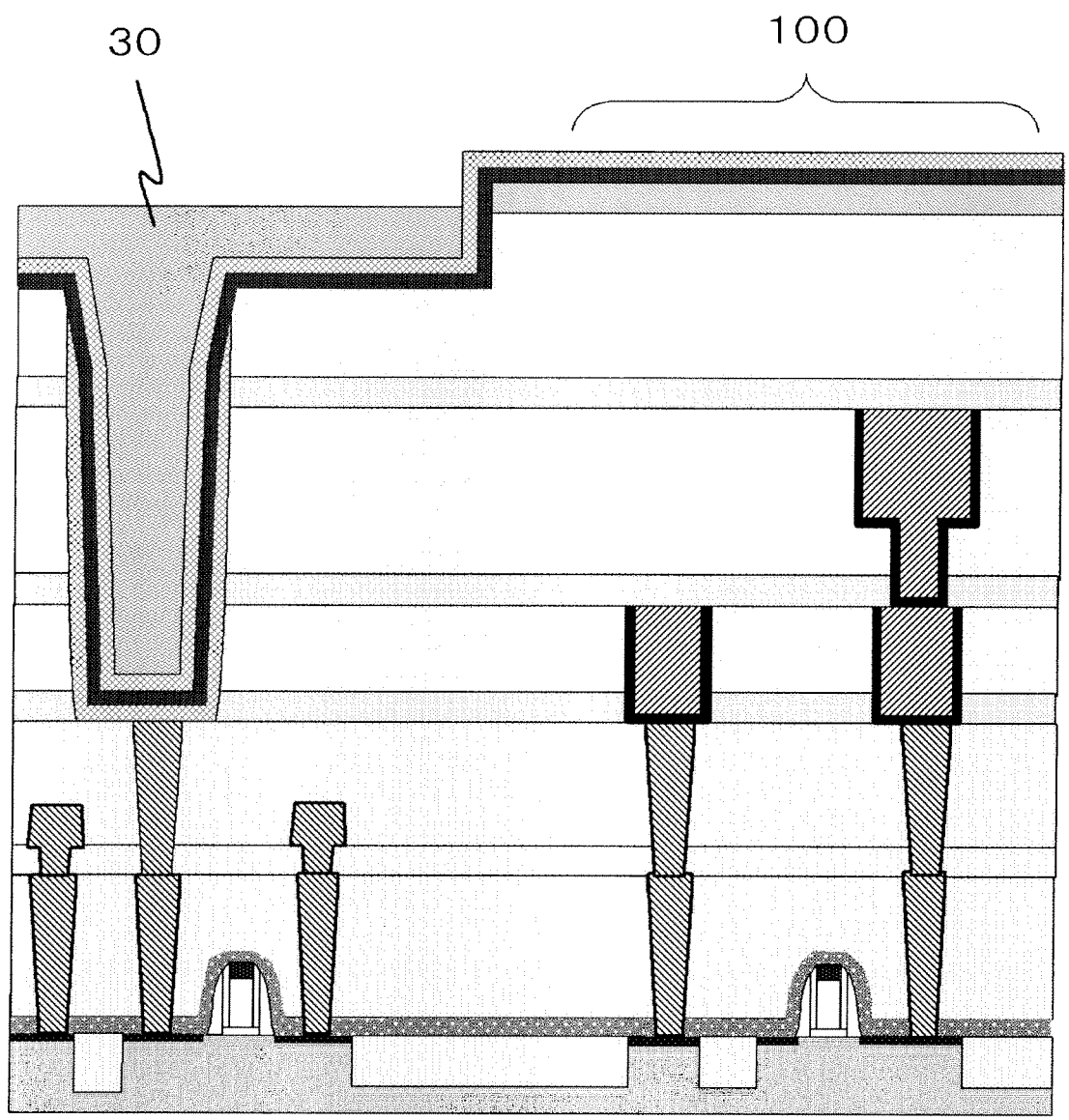

Next, as illustrated in FIG. 3N, a photoresist layer 30 is formed typically by coating, so as to fill the opening 23 for forming therein the cylindrical capacitor, and so as to fill the opening 28 for forming therein the upper interconnect. The photoresist layer 30 is formed so as to finally reside only inside the opening 23 for forming therein the cylindrical capacitor, and only inside the opening 28 for forming therein the upper interconnect. In other words, the resist 30 is formed only up to a height lower than the top end of the opening, and so as not to remain over the hard mask 21 which remains in the logic circuit 100 region. If necessary, an unnecessary portion of the photoresist layer 30 formed in the logic circuit 100 region may be removed by photolithography, or anisotropic overall etching.

Figure 3O:
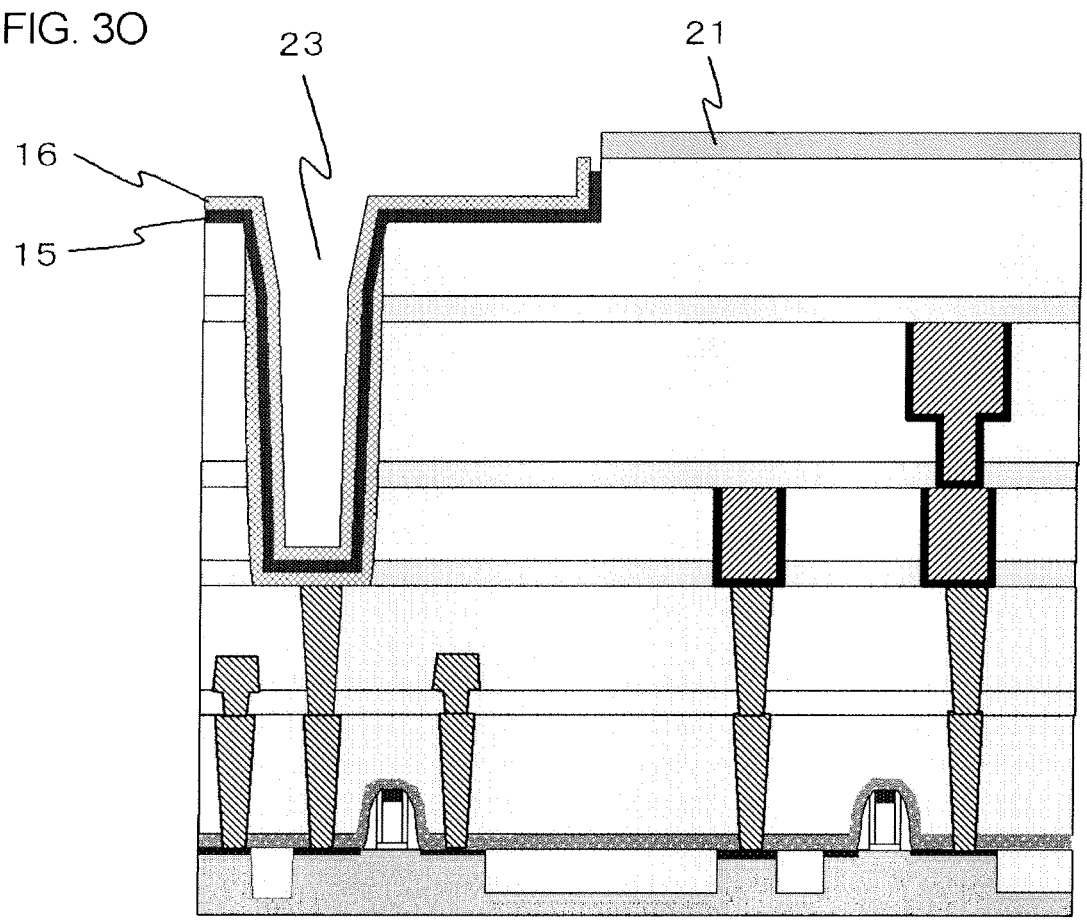

Next, as illustrated in FIG. 3O, the upper electrode 16 and the capacitor insulating film 15 are anisotropically etched overall typically by reactive ion etching, to thereby remove the portions of the upper electrode 16 and the capacitor insulating film 15 which reside over the hard mask 21. Next, the photoresist layer 30 remained in the openings 23 and 28 is removed by ashing.

Figure 3P:
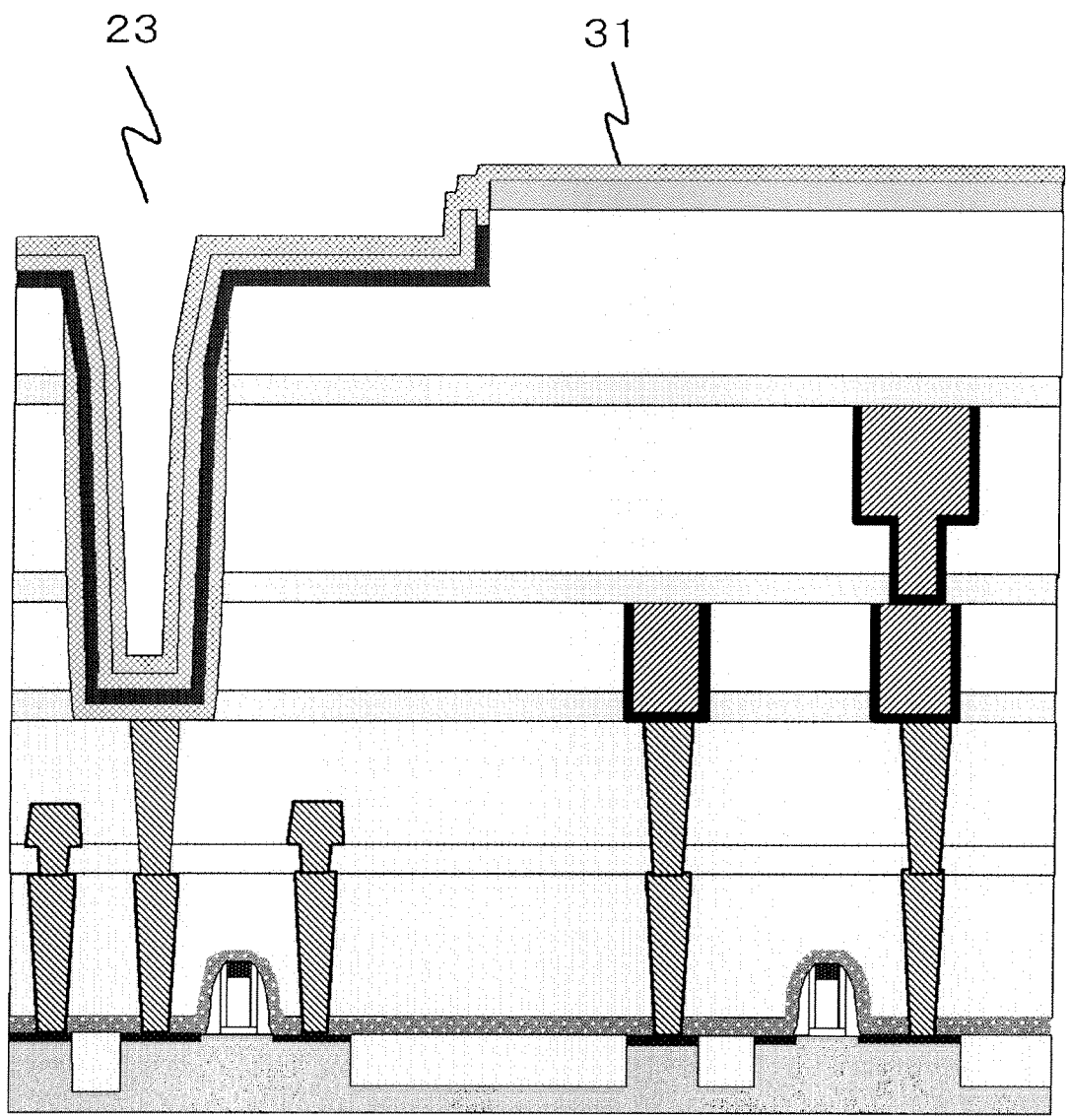

Next, as illustrated in FIG. 3P, an electroconductive hard mask 31, used for patterning of the interconnect in the logic circuit, is deposited. Examples of the material composing the hard mask 31 adoptable herein include refractory metal and nitrides thereof, such as titanium and titanium nitride, tantalum and tantalum nitride, ruthenium and so forth, and stacked structure of these materials. Method of forming the hard mask 31 may be any of CVD, sputtering, ALD and so forth generally adopted to manufacturing of the semiconductor devices. The hard mask 31 preferably has a thickness sufficiently durable against later patterning of the logic circuit interconnect, and preferably has a low electric resistance, since the hard mask 31 in the embodiment of the present invention may remain to serve a part of the upper electrode of the capacitor element 19. In other words, the hard mask 31 remained in the opening 23 will function as the upper electrode. Accordingly, the thickness of the hard mask 31 may be adjusted so as to be consumed upon completion of the later-described patterning of the interconnect in the logic circuit. The hard mask 31 may, therefore, be composed of the same material with the upper electrode 16. While the hard mask 31 and the upper electrode 16 may be configured using the same material or different materials, they are more preferably be composed of the same material. In the embodiment of the present invention, the hard mask 31 is formed using TiN.

Figure 3Q:
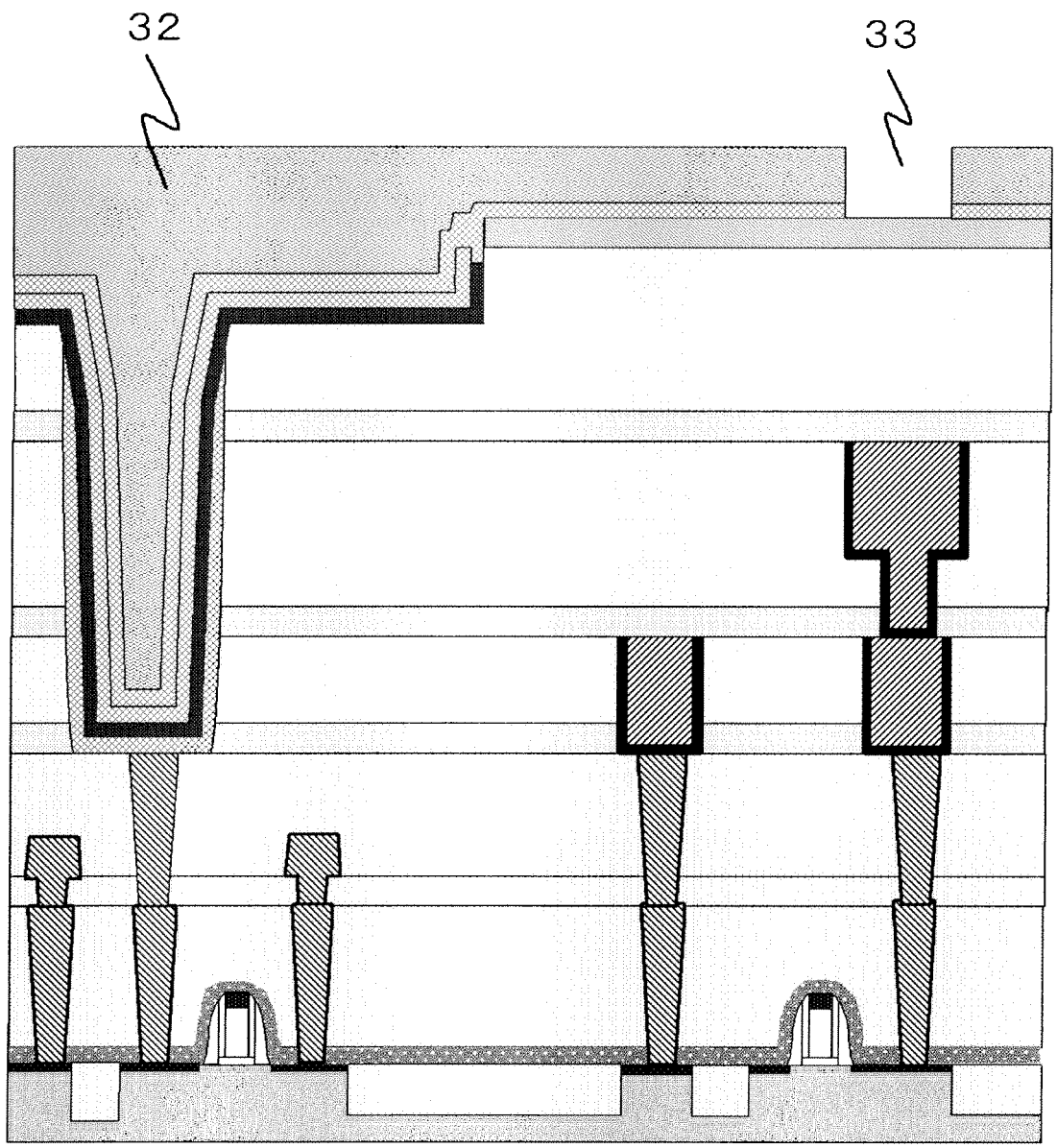

Next, a photoresist layer 32 is formed typically by coating, and a predetermined pattern on the interconnect in the logic circuit is transferred thereto by photolithography (FIG. 3Q). Thereafter, the hard mask 31 is patterned typically by reactive ion etching, to thereby form the opening 33 conforming to a pattern of the interconnect in the logic circuit. Although not illustrated, the photoresist layer 32 may have so-called, multi-layered resist structure, composed of a planarizing film, a silicon oxide film, an anti-reflection film, a photoresist layer and so forth.

Figure 3R:
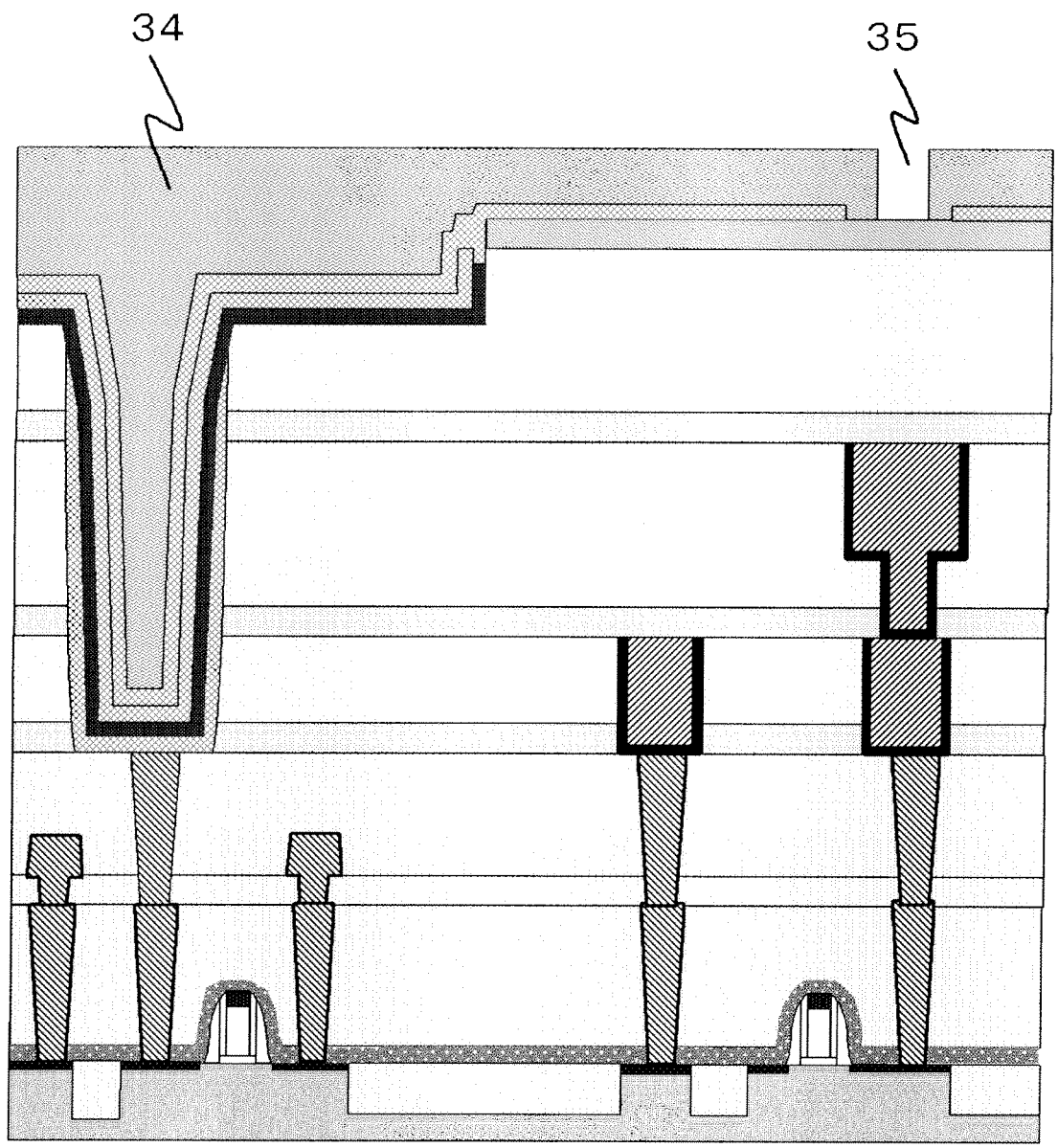

Next, the photoresist layer 32 is once removed by ashing, and another photoresist layer 34 is formed as illustrated in FIG. 3R, and an opening 35 is formed therein by photolithography according to a desired pattern of via. Although not illustrated, the photoresist layer 34 may have so-called, multi-layered resist structure, composed of a planarizing film, a silicon oxide film, an anti-reflection film, a photoresist layer and so forth.

Figure 3S:
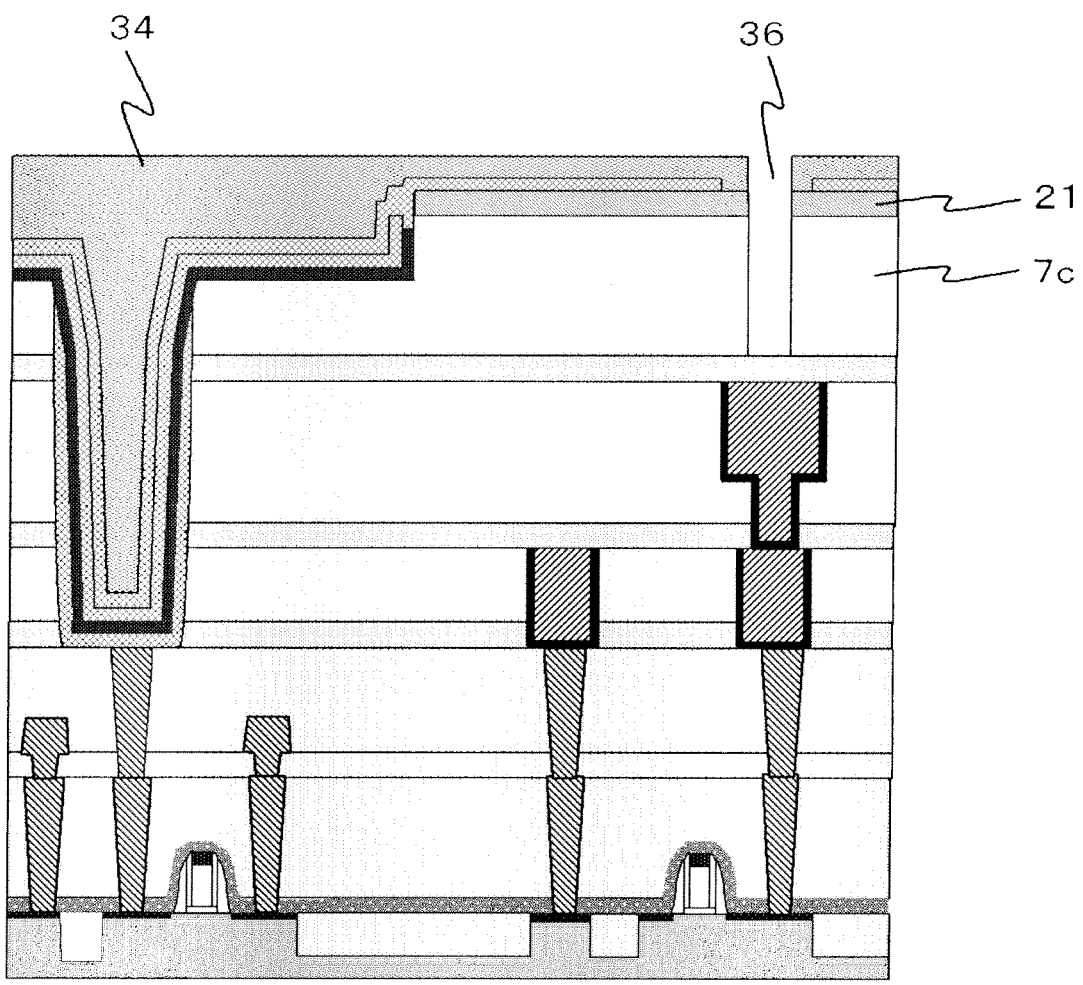

Next, as illustrated in FIG. 3S, an opening 36 for forming therein a via is formed typically by reactive ion etching, using the photoresist layer 34 as a mask. After the opening 36 for forming therein a via is formed, the photoresist layer 34 is removed, although not illustrated.

Figure 3T:
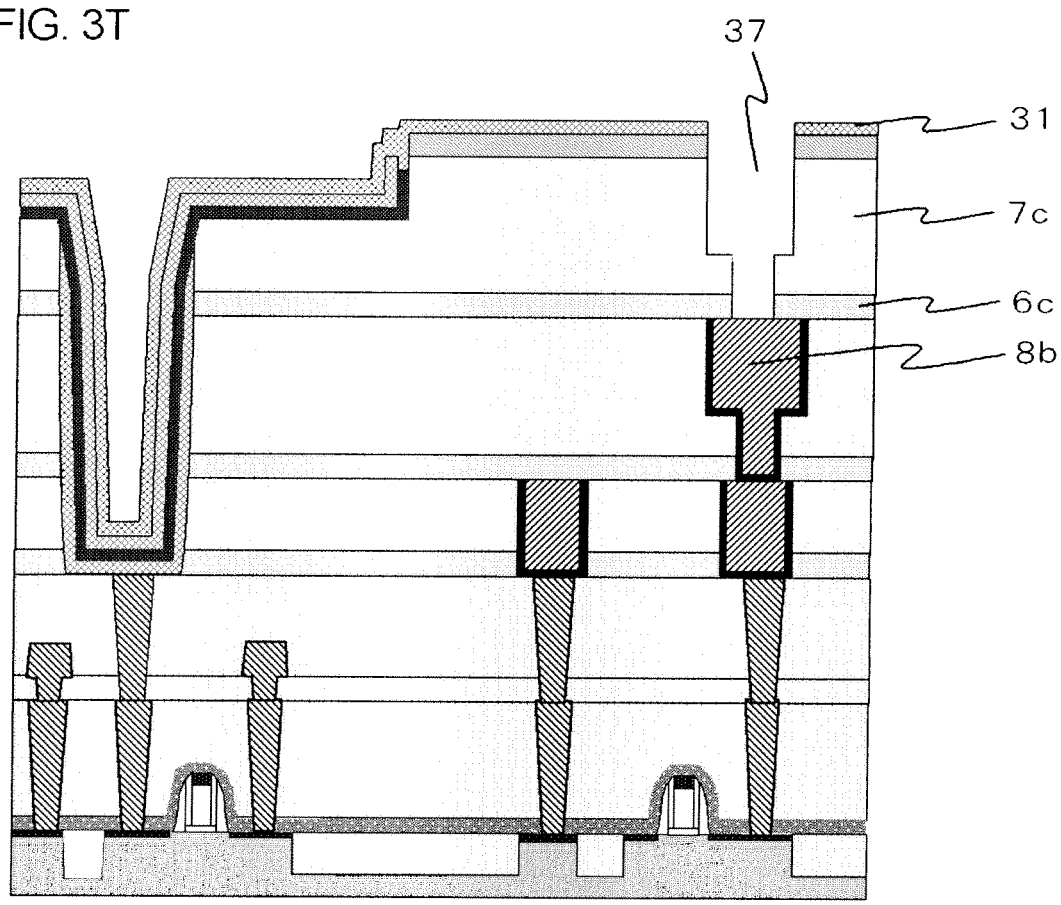

Next, as illustrated in FIG. 3T, the opening 37 for forming therein the interconnect is formed typically by reactive ion etching, using the hard mask 31 and the hard mask 21 as a mask. After the opening 37 for forming therein the interconnect was formed, the insulating interlayer 6c is etched according to conditions under which the insulating interlayer 6c may be etched more faster than the insulating interlayer 7c, to thereby form an opening through which connection with the interconnect 8b in the logic circuit may be established. Although not illustrated, after the opening 37 for forming therein the interconnect was formed, the hard mask 31 may be removed by reactive ion etching. By adopting the method, the hard mask 31 remained in the capacitor element 19 may be thinned, and thereby resistivity of the upper electrode of the capacitor element may be reduced.

Figure 3U:
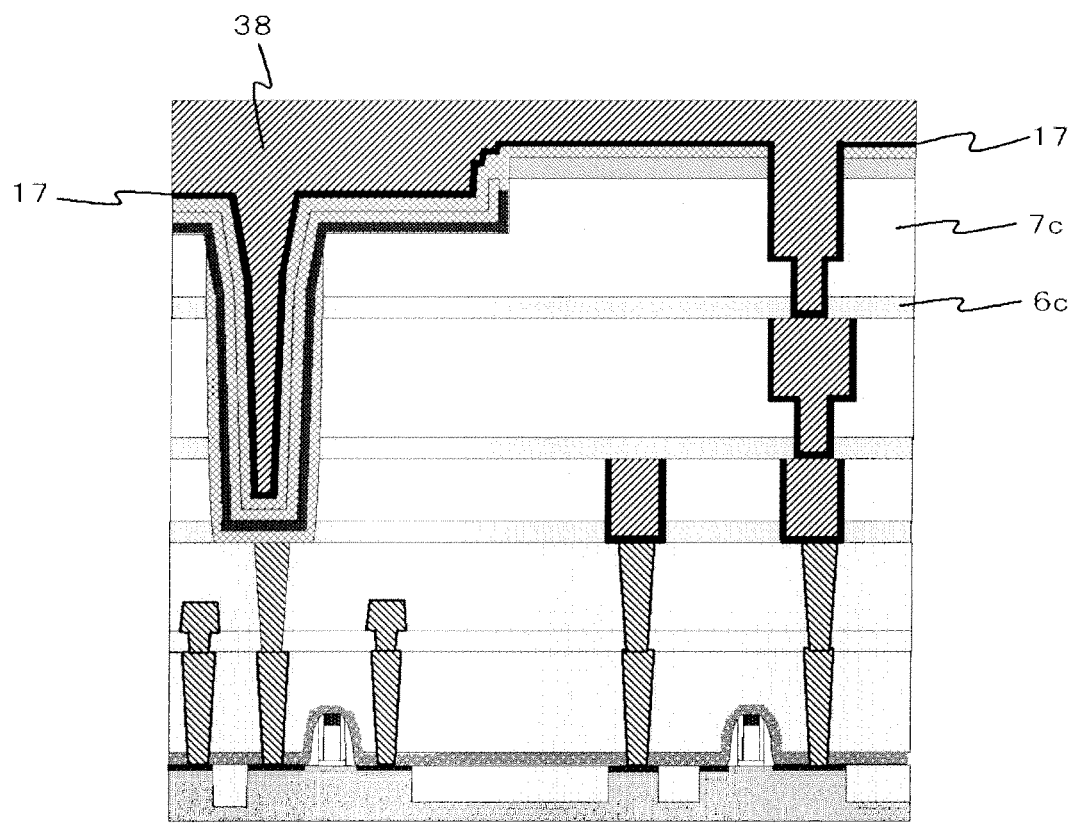

Next, as illustrated in FIG. 3U, the opening 23 for forming therein the capacitor element, the opening 28 for forming therein the upper interconnect, and the opening 37 for forming therein the interconnect in the logic circuit, are covered overall with the barrier metal film 17 and the electro-conductive film 38. Examples of material composing the barrier metal film 17 adoptable herein include refractory metal and nitrides thereof, such as titanium and titanium nitride, tantalum and tantalum nitride, ruthenium and so forth, and stacked structure of these materials. The barrier metal film 17 is preferably configured so as not to allow the electro-conductive film 38 to diffuse therethrough. The electro-conductive film 38 may be formed by using any material generally used for forming interconnects of the semiconductor devices, such as copper, and alloy mainly composed of copper.

Figure 3V:
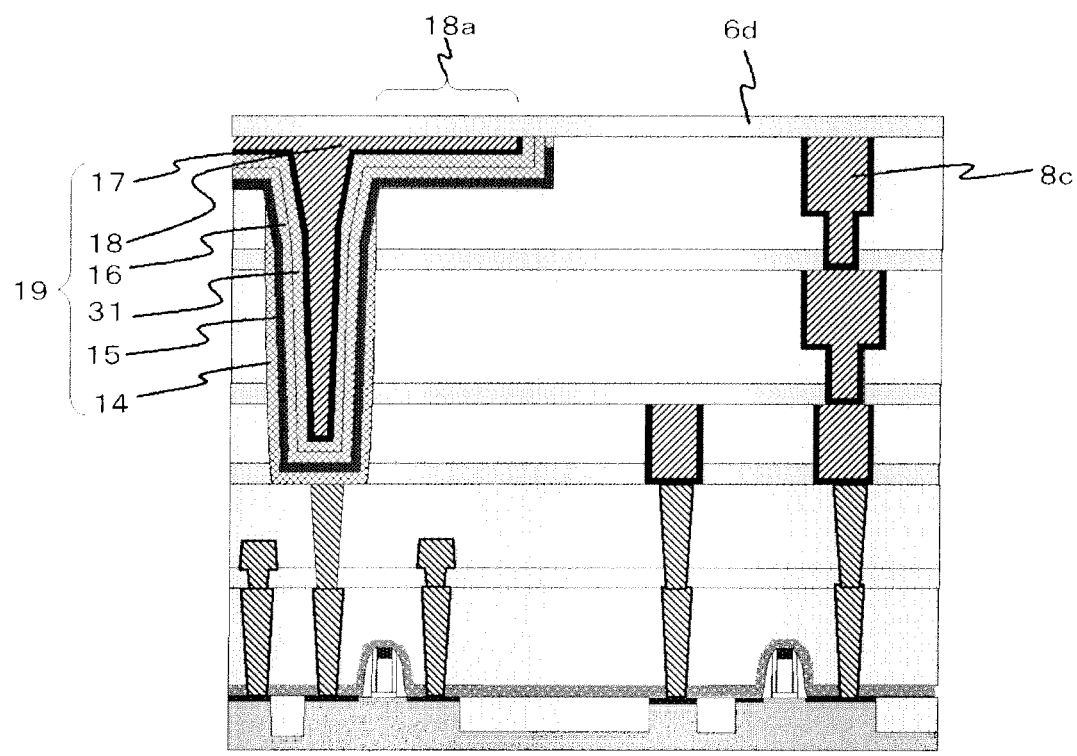

Next, as illustrated in FIG. 3V, the electro-conductive film 38, the barrier metal film 17, and the hard masks 31 and 21 are removed typically by CMP, so as to form the capacitor element 19 and the interconnect 8c of the logic circuit electrically isolated from each other. The top surface of the upper interconnect 18 and the top surface of the interconnect 8c are aligned to the same plane. The same plane in this embodiment may be formed by concomitantly polishing, in a single process such as CMP, the same interconnect material layer embedded in two recesses. The thus-formed same plane has a flatness more excellent than that of the same plane configured by different interconnect materials embedded in two recesses.

The insulating interlayer 6d is further deposited so as to cover the upper interconnect 18 of the capacitor element 19, and the interconnect 8c of the logic circuit. The insulating interlayer 6d is preferably an insulating film capable of blocking diffusion of materials composing the upper interconnect 18 of the capacitor element and the interconnect 8c of the logic circuit, similarly to the above-described insulating interlayers 6a, 6b, and may typically be an insulating layer containing elements such as silicon, carbon, nitrogen and so forth, or stacked structure of these insulating layers.

Next, as illustrated in FIG. 3W, the fixed-potential interconnect 201, the signal interconnect 202, and the logic circuit interconnect 8d are formed further over the capacitor element 19 which configures the memory circuit, and over the interconnect 8c of the logic circuit formed in the same level with the upper interconnect 18 of the capacitor element 19, by the generally-adoptable method of manufacturing a semiconductor device.

Next, operations and effects of the first embodiment will be explained.

In this embodiment, the top surface of the upper interconnect 18 and the top surface of the interconnect 8c configuring the logic circuit 100 are aligned to the same plane. Accordingly, variation in the amount of etching of the insulating film between portions above the top surface of the upper interconnect and above the top surface of the interconnect may be suppressed. For example, in the process of concomitantly forming the opening for forming therein the fixed-potential interconnect 201 to be connected to the upper interconnect 18, and the opening for forming therein the interconnect 8d to be connected to the interconnect 8c, the amount of etching of the insulating film above the top surface of the upper interconnect and above the top surface of the interconnect are almost equal. The resultant semiconductor device may therefore be improved in the reliability and yield.

Since the upper interconnect 18 and the embedded electrode are configured by the same material, they may be formed in the same process. Accordingly, it is no longer necessary to anisotropically etch the embedded electrode overall in order to ensure a space for forming the upper interconnect 18, unlike the method described in Japanese Laid-Open Patent Publication No. 2007-201101. The embedded electrode may therefore be suppressed from being excessively etched, and thereby the semiconductor device may be improved in the reliability and yield. Use of the same material also contributes to reduction in the manufacturing cost. Since the upper interconnect 18 and the embedded electrode are concomitantly formed using the same material, they are configured as seamless. Since there is no boundary in between, contact resistance of the semiconductor device may be reduced.

In the semiconductor device of this embodiment, having the logic circuit 100 and the memory circuit 200 formed on the same semiconductor substrate, the capacitor element 19 configuring the memory circuit 200, and one layer of the interconnect 8c in the interconnect layer of the logic circuit 100 are configured by the same material, and the top surface of the upper interconnect 18 of the capacitor element 19 and the top surface of certain one layer of the interconnect 8c are aligned to the same plane. By concomitantly forming the capacitor element 19 and the interconnect 8c configuring the logic circuit 100, the number of times of planarization process may be reduced. Accordingly, the semiconductor device having the logic circuit 100 and the memory circuit 200 formed on the same semiconductor substrate may be reduced in the manufacturing cost and improved in the yield.

Since the top surface of the upper interconnect 18 and the top surface of the interconnect 8c are aligned to the same plane, flatness of the multi-layered interconnect formed thereabove may be improved. In other words, over the top surface of the upper interconnect 18 and over the top surface of the interconnect 8c, a common metal diffusion blocking film may be formed. The commonness herein means that the top surface of the upper interconnect 18 and the top surface of the interconnect 8c come into contact with the insulating interlayer 6d formed in the same process. Accordingly, the flatness of the semiconductor device of this embodiment may be ensured. In addition, the height in the thickness-wise direction of the interconnect (fixed-potential interconnects 201a to 201c) configuring the memory circuit 200, and to be connected to the upper interconnect 18, will be same with the height in the thickness-wise direction of the interconnect 8d configuring the logic circuit 100, and formed in the same interconnect layer with the interconnect. Accordingly, also the flatness of the multi-layered interconnect formed in further upper layer may be improved. Since the capacitor element 19 and the interconnect in the semiconductor device of this embodiment are configured to avoid difference in height as described in the above, the semiconductor device is excellent in the flatness as a whole. Since there is no dead space (insulating interlayer) for canceling the difference, the resultant semiconductor device may be excellent also from the viewpoint of shrinkage.

Concomitant planarization of the metal material layer (upper interconnect 18) embedded in the capacitor element 19 and the metal material layer embedded in the interconnect 8*c* of the logic circuit 100 also contributes to improve accuracy of the planarization. Accordingly, the semiconductor device having the logic circuit 100 and the memory circuit 200 formed on the same semiconductor substrate may be manufactured with a good yield.

Since the upper interconnect 18 of the capacitor element 19 and the interconnect 8*c* of the logic circuit 100 are formed in the same process, thermal history in the manufacturing process of the semiconductor device may be reduced, as compared with the case where the upper interconnect and the interconnect are separately formed. The semiconductor device may, therefore, be improved in the long-term reliability.

Since the number of times of sintering process after filling of the metal material may be reduced, and thereby thermal load possibly exerted on the semiconductor device may be reduced, the semiconductor device may be suppressed from being degraded in the reliability.

Height of the extension electrode 18*a* drawn out for the convenience of external connection, which is a part of the upper interconnect 18 configuring the capacitor element 19, may be made smaller than the level of height of the interconnect 8*c* of the logic circuit 100. Accordingly, difference in the level of height of the capacitor insulating film 15 configuring the capacitor element 19 may be increased. An effective value of electrostatic capacity of the capacitor element 19 may, therefore, be improved, and operation margin of the memory circuit 200 may be expanded as a consequence.

The capacitor element 19 is formed in the insulating interlayer which is composed of the same material with the insulating interlayer configuring the logic circuit 100. More specifically, the insulating interlayer 7*c* of the multi-layered interconnect, having the capacitor element 19 embedded therein, is provided in common with the insulating interlayer 7*c* having, embedded therein, the interconnect 8*c* in the logic circuit region formed in the same layer with the capacitor element 19. In addition, since the insulating interlayer 7*c* has a dielectric constant smaller than that of silicon oxide film, parasitic capacitance of the capacitor element 19 may be reduced.

Moreover, since design parameters for designing the logic circuit, and design parameters for designing the semiconductor device having the memory circuit and the logic circuit integrated on the same semiconductor substrate, may be provided in common, so that cost for designing the semiconductor device may be reduced.

As described in the above, this embodiment may be adoptable to the semiconductor device having the transistor and the multi-layered interconnect. By appropriately adopting this embodiment, the memory circuit and the logic circuit may be integrated on the same semiconductor substrate at low cost with good yield.

In the method of manufacturing of this embodiment, the top surface of the upper interconnect 18 of the capacitor element 19, and the top surface of the interconnect 8*c* of the logic circuit formed in the same layer or around with the upper interconnect 18, are aligned to the same plane, and the upper interconnect 18 and the embedded electrode are formed using the same material in an integrated manner. Accordingly, both of excessive etching and insufficient etching may be avoidable above the upper interconnect. It is no longer necessary to anisotropically etch the embedded electrode overall, in order to ensure a space for forming the upper interconnect 18. The embedded electrode may therefore be suppressed from being excessively etched. In this way, a structure excellent in yield may be obtained.

In the method of manufacturing of this embodiment, the interconnect trench (opening 37) was formed, after the recess (opening 23) for forming therein the capacitor element was formed. If the interconnect trench were formed first, the metal (copper, for example) embedded in the interconnect trench may be oxidized if the capping film was not formed thereon, or the capping film was removed, and thereby the reliability would degrade, or device performance would degrade due to diffusion of copper. In contrast, the above-described procedures of this embodiment may avoid these anticipated problems, enough to yield the semiconductor device excellent in the reliability.

In the method of manufacturing of this embodiment, the top surface of the upper interconnect 18 of the capacitor element 19, and the top surface of the interconnect 8*c* of the logic circuit formed in the same layer or around with the upper interconnect 18, may be aligned to the same plane, and the upper interconnect 18 and the embedded electrode may be formed using the same material in an integrated manner. Accordingly, the upper interconnect 18 and the interconnect 8*c* may be formed using the same material, and may be planarized at the same time. The manufacturing cost may therefore be reduced. In addition, since the sintering process for improving crystallinity of the upper interconnect 18 of the capacitor element 19 and the interconnect may be proceeded at the same time, so that the semiconductor device may successfully be suppressed from being degraded in the reliability due to thermal history.

Next, the effects of this embodiment will further be explained, in comparison with the semiconductor devices disclosed in the above-described patent documents.

According to the structures disclosed in Japanese Laid-Open Patent Publication Nos. 2005-005337, 2005-086150, 2002-261256 and H11-026716, increase in the capacitance of the capacitor element inevitably calls for increase in the height of the capacitor element. While increase in the height of the capacitor element may increase the capacitance thereof without increasing occupied area of the capacitor element, such increase in the height of the capacitor element may increase distance between the active element formed on the surface of the semiconductor substrate, and the multi-layered interconnect configuring the logic circuit and the memory circuit, so that the height of the connective portions between the active element and the multi-layered interconnect (generally referred to as "contact plug", or simply "plug" or "contact") may increase to a degree corresponding to the capacitor element. Increase in the height of contact demands filling of the high-aspect-ratio opening with a metal material, and adds technical difficulty in the manufacturing, while being affected also by shrinkage of diameter of the opening. In addition, increase in the height of the contact plug may also result in increase in parasitic resistance and parasitic capacitance of the active element in the logic circuit, and may consequently result in degradation of the operational speed of the logic circuit.

On the other hand, according to the technique described in Japanese Laid-Open Patent Publication No. 2003-332463, a parallel plate type capacitor element is formed above the active element formed on the semiconductor substrate. In this configuration, any effort of increasing the electrostatic capacity of the capacitor element increases the occupied area of the capacitor element, consequently increases the occupied area of the memory circuit, and makes it difficult to manufacture the semiconductor device having the memory circuit at low cost. On the other hand, reduction in the occupied area of the capacitor element conversely degrades charge holdability of the capacitor element, and thereby degrades the data holdability of the memory circuit.

In addition, a design-related problem remains for the case where the memory circuit having such stacked-type capacitor and the logic circuit are formed on the same semiconductor substrate. In general methods of designing the semiconductor device, circuit simulation is conducted using SPICE parameters relevant to the structure of the semiconductor device, so as to design a desired circuit. For the case where the memory circuit using the stacked-type capacitor element and the logic circuit are formed on the same semiconductor substrate, it is necessary to conduct the circuit simulation using the SPICE parameters while taking the above-described increase in the contact resistance and parasitic capacitance into consideration. On the other hand, for the case where the logic circuit, which is not integrated with the memory circuit, is designed, it is not necessary to use such large values of the contact resistance and parasitic capacitance, instead, the SPICE parameters having the contact resistance and the parasitic capacitance, which are just necessary and enough to configure the logic circuit, incorporated therein are used for the design.

As described in the above, since different sets of parameters have to be prepared for designing the semiconductor device having the logic circuit only, and the semiconductor device having the memory circuit and the logic circuit integrated on the same semiconductor substrate, even if the semiconductor device is designed using a semiconductor manufacturing process of the same generation, so that the manufacturing cost, including design cost, of the semiconductor device may increase. In addition, for the case where the circuit originally designed for the logic circuit is desired to be ported to the semiconductor device having the memory circuit and the logic circuit integrated therein, the circuit needs to be re-designed, and again the manufacturing cost of the semiconductor device may unfortunately increase.

In contrast, in this embodiment, the same parameters may be shared by the memory circuit and the logic circuit, by forming the active elements configuring the memory circuit and the logic circuit on the semiconductor substrate, and by forming the capacitor element configuring the memory circuit, in the stacked structure of insulating films which configures the multi-layered interconnect formed further above the active elements. In this embodiment, the capacitor element is formed in the insulating interlayer which configures the interconnect of the logic circuit. By virtue of this configuration, the logic circuit is suppressed from being degraded in the operational speed, due to increased height of the contact plug, and consequent increase in the parasitic resistance and parasitic capacitance of the active elements in the logic circuit, and thereby the problems in Japanese Laid-Open Patent Publication Nos. 2005-005337, 2005-086150, 2002-261256, H11-026716 and 2003-332463 may be solved.

According to the technique described in Japanese Laid-Open Patent Publication No. 2007-201101, since the embedded electrode 302a, 302b embedded in the capacitor elements 301, and the interconnect 303 of the logic circuit which resides in the same layer with the upper interconnects 304a, 304b backed by the embedded electrodes 302a, 302b are aligned to different levels of height, so that manufacturing of such structure has been difficult.

Again, according to the technique described in Japanese Laid-Open Patent Publication No. 2007-201101, since the capacitor elements 301, the embedded electrodes 302a, 302b and the upper interconnects 304a, 304b are formed after interconnects 305 of the logic circuit, which reside on the lower side of the top surface of the capacitor elements 301, were formed, so that the interconnects 305 which configure the logic circuit have occasionally been degraded in the reliability.

Moreover, according to Japanese Laid-Open Patent Publication No. 2007-201101, the meal material layer for configuring the embedded electrodes 302a, 302b embedded in the capacitor elements 301, and the metal material layer for configuring the upper interconnect 304a, 304b backed by the embedded electrodes 302a, 302b, have been formed respectively in separate processes, so that the manufacturing cost has occasionally increased.

In contrast, in this embodiment, the upper interconnect 18 and the embedded electrode may be formed using the same material in the same process. Processes of manufacturing may therefore be simplified, thermal history may be reduced, the lower interconnect may be suppressed from being degraded in the reliability, and cost for manufacturing may be reduced.

In the semiconductor devices disclosed in Japanese Laid-Open Patent Publication Nos. 2000-332216, 2004-342787 and 2005-101647, the top surface of the upper interconnect configuring the capacitor element, and the top surface of the interconnect configuring the logic circuit are positioned on different planes. More specifically, as illustrated in FIG. 5 of Japanese Laid-Open Patent Publication No. 2000-332216, FIG. 7 of Japanese Laid-Open Patent Publication No. 2004-342787, and FIG. 27 of Japanese Laid-Open Patent Publication No. 2005-101647, the via connected to the upper interconnect and the via connected to the interconnect are different from each other, due to difference in the number of layers of insulating interlayer or planarizing insulating film by at least one layer, through which these vias extend. Such difference in height of the vias may result in excessive or insufficient amount of etching above the upper interconnect. As a consequence, the techniques disclosed in Japanese Laid-Open Patent Publication Nos. 2000-332216, 2004-342787 and 2005-101647 have occasionally been suffering from degradation of yield of the semiconductor devices.

In contrast in this embodiment, the top surface of the capacitor element 19 and the top surface of the upper interconnect 18 are formed so as to be aligned to the same plane. Accordingly, the capacitor element 19 and the upper interconnect 18 will have, over the top surfaces thereof, the same number and same species of layers stacked thereon. The via connected to the upper interconnect 18 and the via connected to the interconnect 8c will be less likely to cause variation in height, since the number (and species) of layers through which the vias extend will be same. Accordingly, both of excessive etching and insufficient etching may be avoidable above the upper interconnect 18 configuring the capacitor element 19, and thereby the yield of semiconductor devices may be improved.

(Second Embodiment)

Next, a semiconductor device of a second embodiment will be detailed, referring to the attached drawings.

Figure 4:
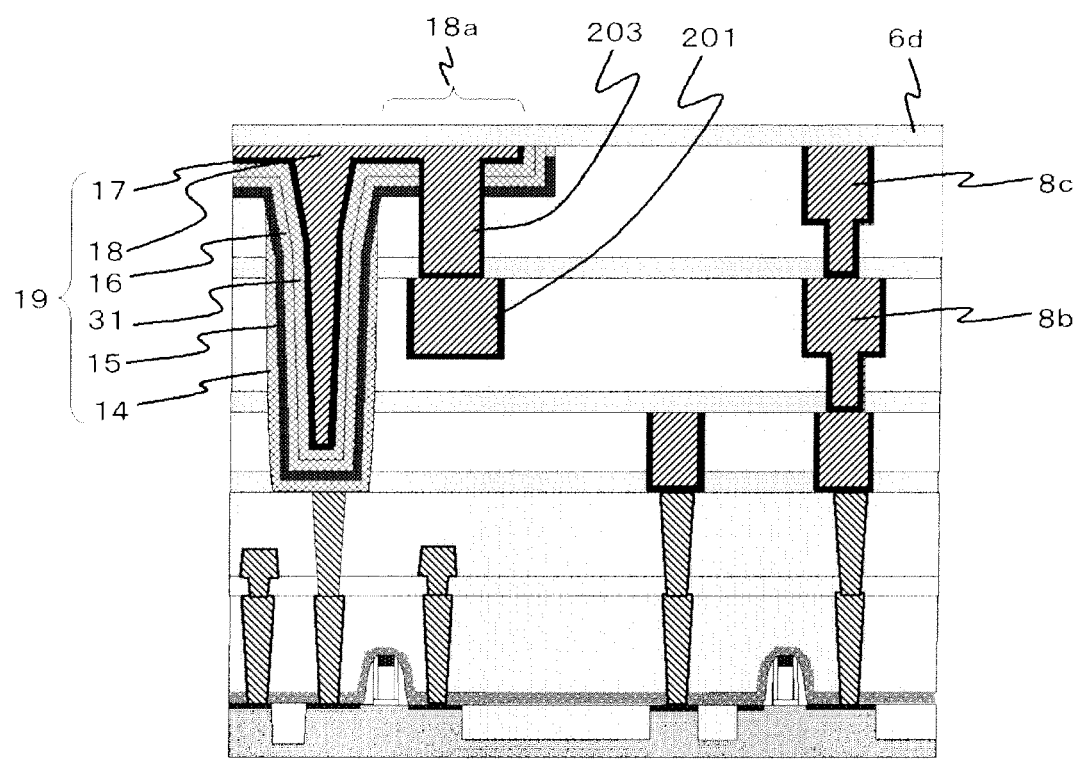
FIG. 4 is a sectional view schematically illustrating a semiconductor device of a second embodiment.

FIG. 4 is a sectional view illustrating the second embodiment. Unlike the first embodiment of the present invention previously illustrated in FIG. 1, the semiconductor device of the second embodiment has, as illustrated in FIG. 4, a vertical interconnect 203 formed below the extension electrode 18a of the upper interconnect 18 of the capacitor element 19, so as to extend through the upper electrode 16 and the capacitor insulating film 15 towards the substrate. Through the vertical interconnect 203, the extension electrode 18a of the upper interconnect 18 of the capacitor element 19, and the fixed-potential interconnect 201 positioned below the extension electrode 18a are connected. The vertical interconnect 203 may be formed for each of, or a part of the plurality of capacitor elements 19. The upper interconnect 18 and the vertical interconnect 203 are configured by the same material. In other words, the upper interconnect 18, the extension electrode 18a, and the vertical interconnect 203 are formed in the same process. The fixed-potential interconnect 201 may be formed preliminarily in the process of forming the interconnect 8b of the logic circuit at the same time therewith, as an interconnect of the memory circuit region positioned in the same layer with the interconnect 8b.

According to the second embodiment, it is no longer necessary to dispose the fixed-potential interconnect over the upper interconnect 18, so that the number of signal interconnect 202 over the upper interconnect 18 may be increased, or line width of the signal interconnect 202 may be increased. Interconnect resistance of the semiconductor device may therefore be reduced.

The second embodiment may give effects similar to those in the first embodiment.

Next, a method of manufacturing the semiconductor device of the second embodiment will be explained. FIGS. 5A to FIG. 5G are sectional views sequentially illustrating procedures of manufacturing of the semiconductor device of the second embodiment.

Figure 5A:
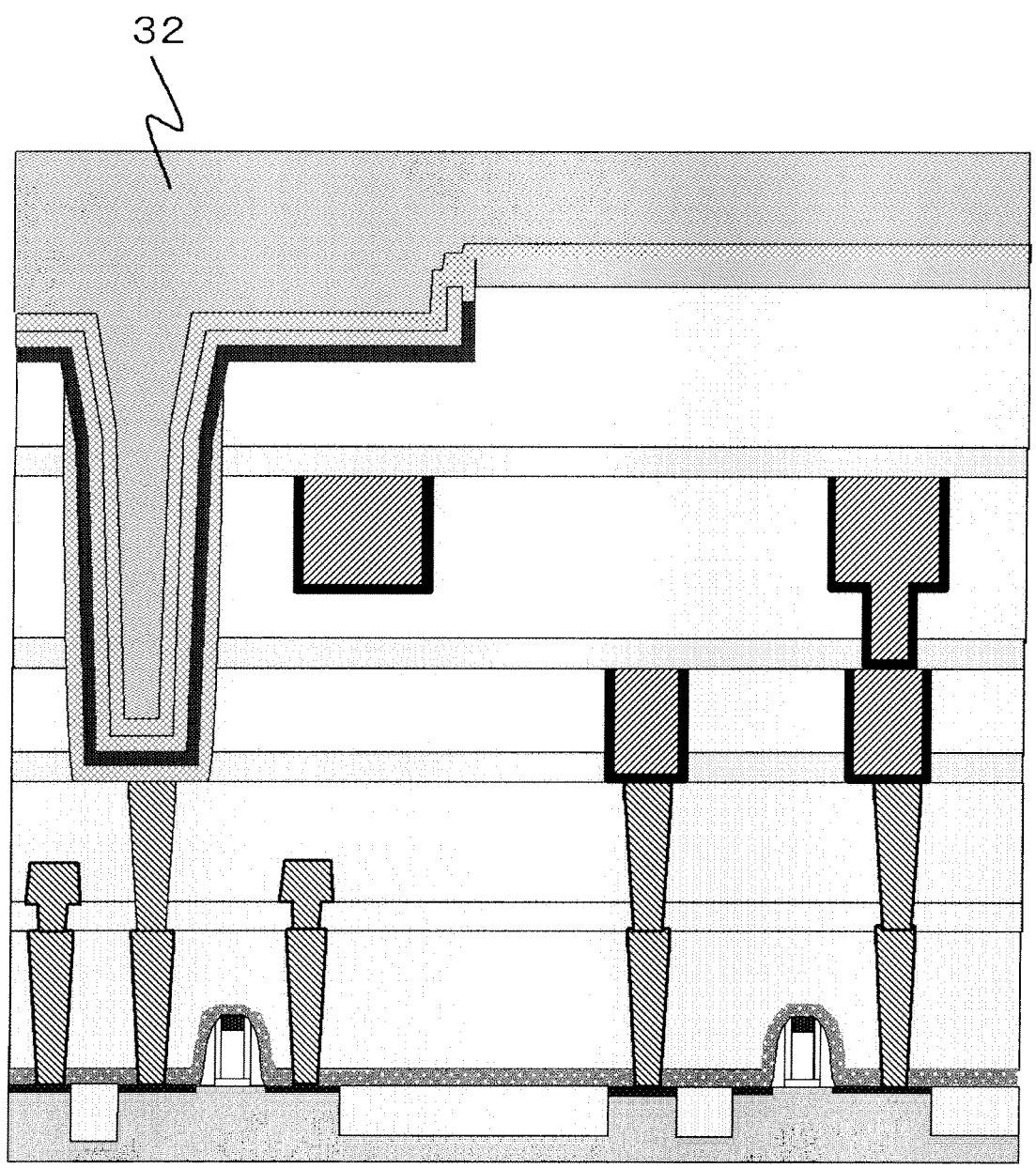

The method of manufacturing according to the second embodiment of the present invention may be proceeded similarly to the above-described method of manufacturing of the first embodiment, up to the process explained referring to FIG. 3P, so that the similar processes will not repetitively be explained. FIG. 5A illustrates a state in which the photoresist layer 32 was formed by coating, given after completion of the procedures up to the process illustrated in FIG. 3P, which was referred to in the explanation of the method of manufacturing according to the first embodiment of the present invention. While FIG. 5A illustrates the photoresist layer 32 as a single-layered film, a so-called, multi-layered photoresist structure, typically configured by a planarizing film, a silicon oxide film, an anti-reflection film, and a photoresist layer, may alternatively be used.

Figure 5B:
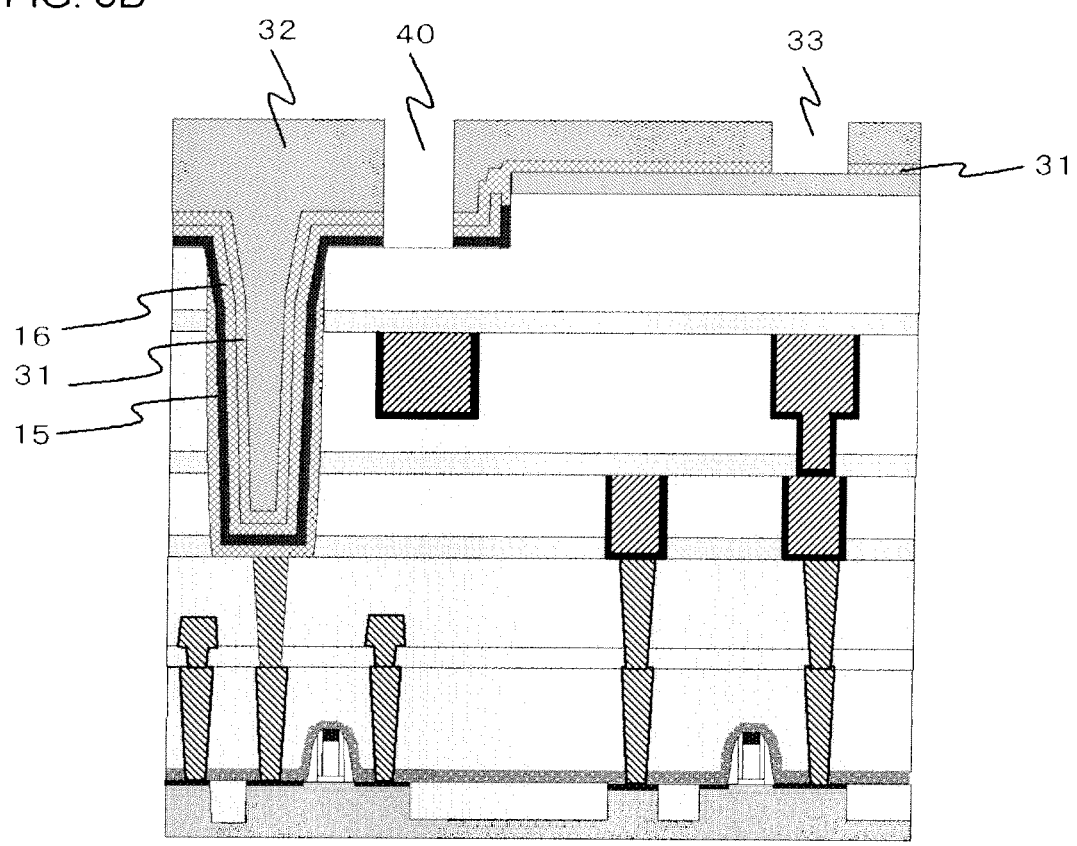

Next, as illustrated in FIG. 5B, the opening 33 conforming to a pattern of the interconnect of the logic circuit, and an opening 40 conforming to a pattern of the vertical interconnect, are formed in the photoresist layer 32, the hard mask 31, the upper electrode 16 and the capacitor insulating film 15, by generally-adoptable methods such as photolithography and reactive ion etching.

Figure 5C:
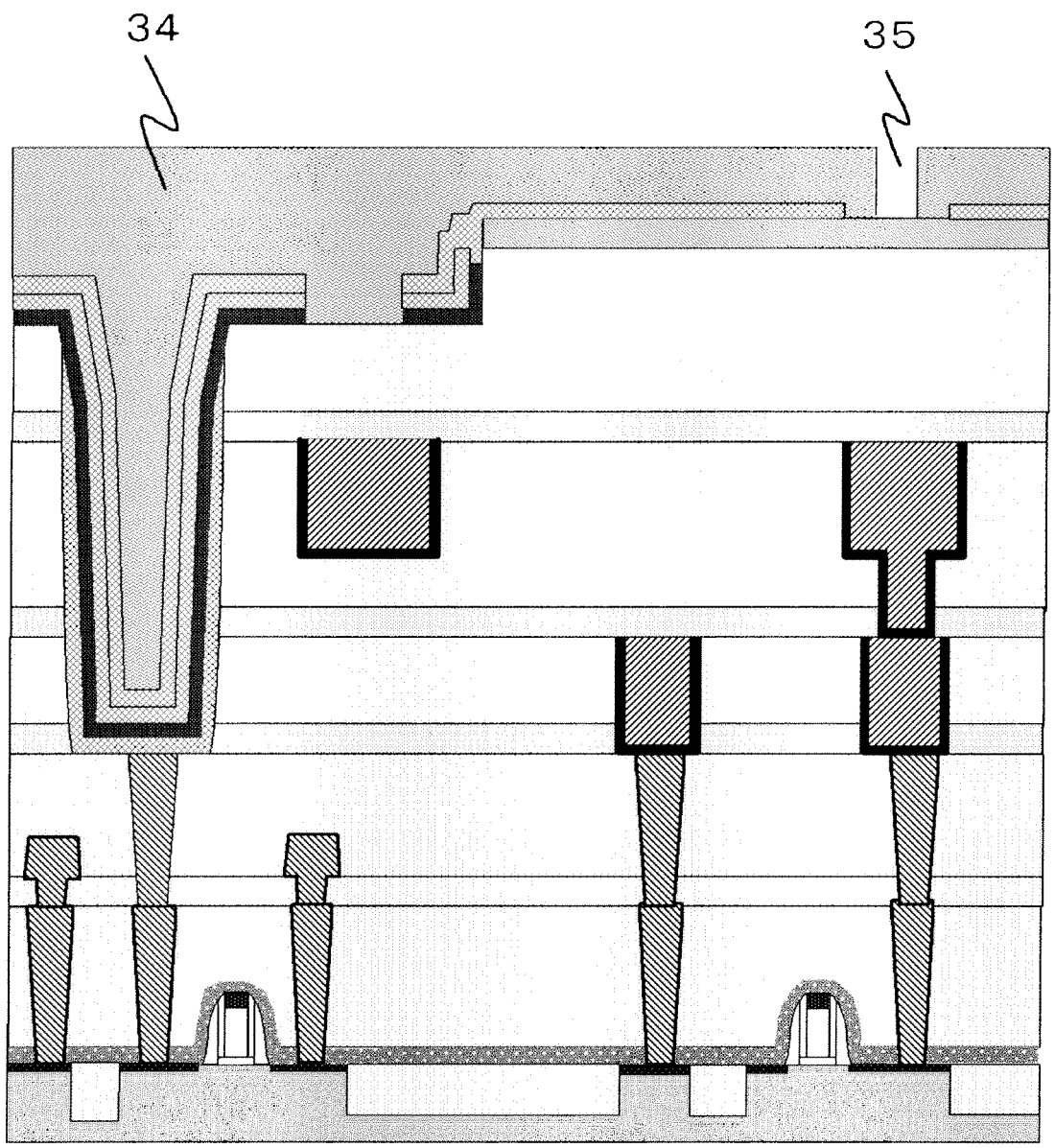

Next, as illustrated in FIG. 5C, the photoresist layer 34 is formed similarly as illustrated in FIG. 3R, and the opening 35 conforming to a pattern of a via composing the interconnect of the logic circuit is formed. Again, while FIG. 5C illustrates the photoresist layer 34 as a single-layered film, a so-called, multi-layered photoresist structure, typically composed of a planarizing film, a silicon oxide film, an anti-reflection film, and a photoresist layer, may alternatively be used.

Figure 5D:
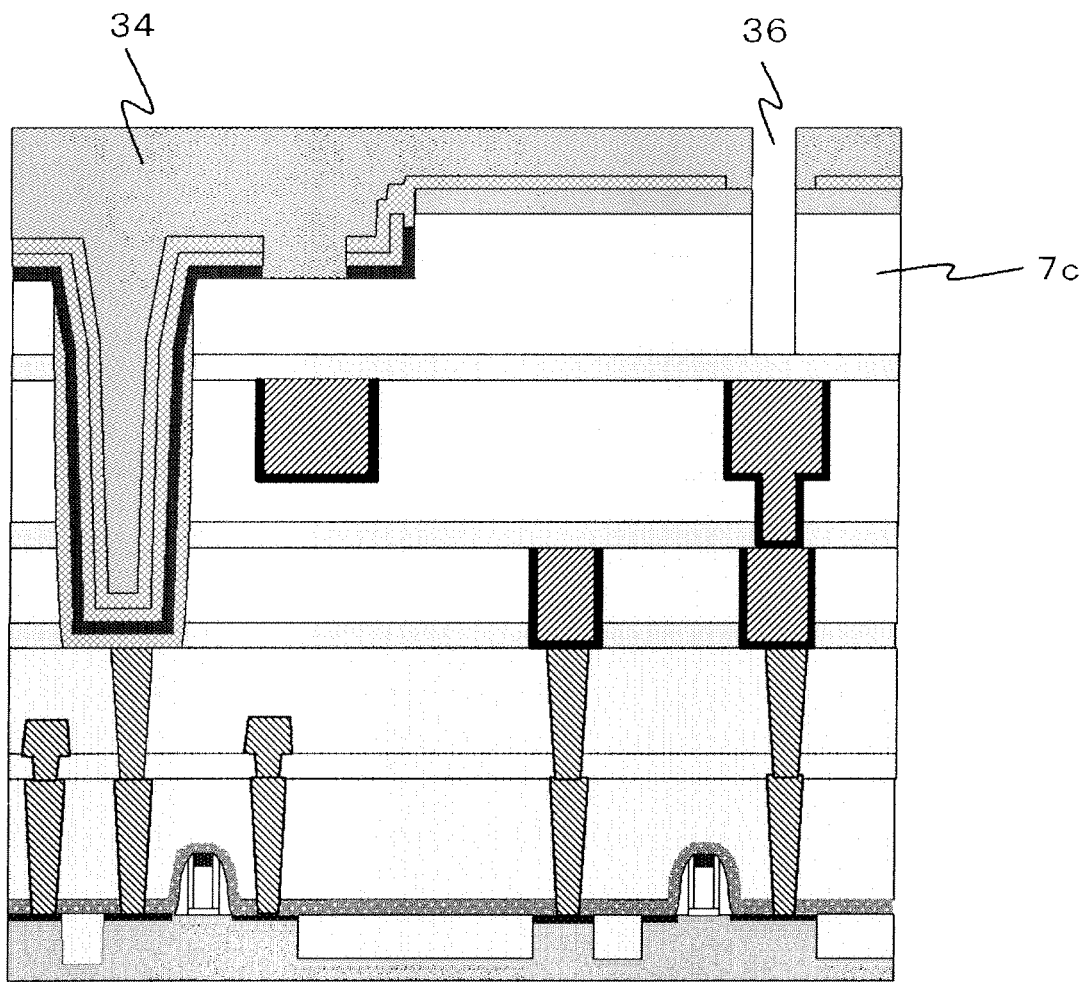

Next, as illustrated in FIG. 5D, the opening 36 for forming therein the via is formed in the insulating interlayer 7c typically by reactive ion etching, similarly as illustrated in FIG. 3S.

Figure 5E:
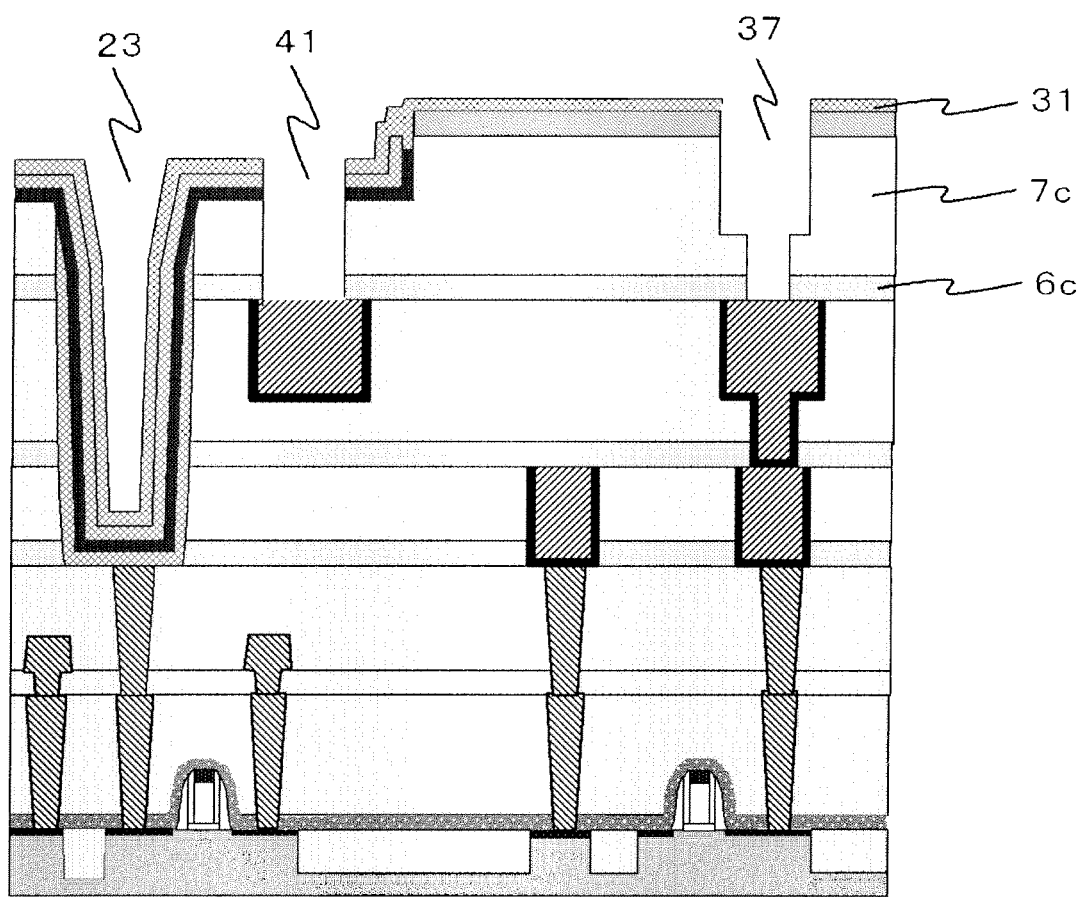

Next, as illustrated in FIG. 5E, the photoresist layer 34 is removed typically by ashing, and the opening 37 for forming therein the interconnect of the logic circuit, and an opening 41 for forming therein the vertical interconnect are formed typically by reactive ion etching, using the hard mask 31 as a mask. The insulating interlayer 6c is then processed. By the process, the semiconductor device will have the opening 23 for forming therein the capacitor element, the opening 28 for forming therein the upper interconnect, the opening 41 for forming therein the vertical interconnect, and the opening 37 for forming therein the interconnect of the logic circuit, all of which stay open at this point in time.

Figure 5F:
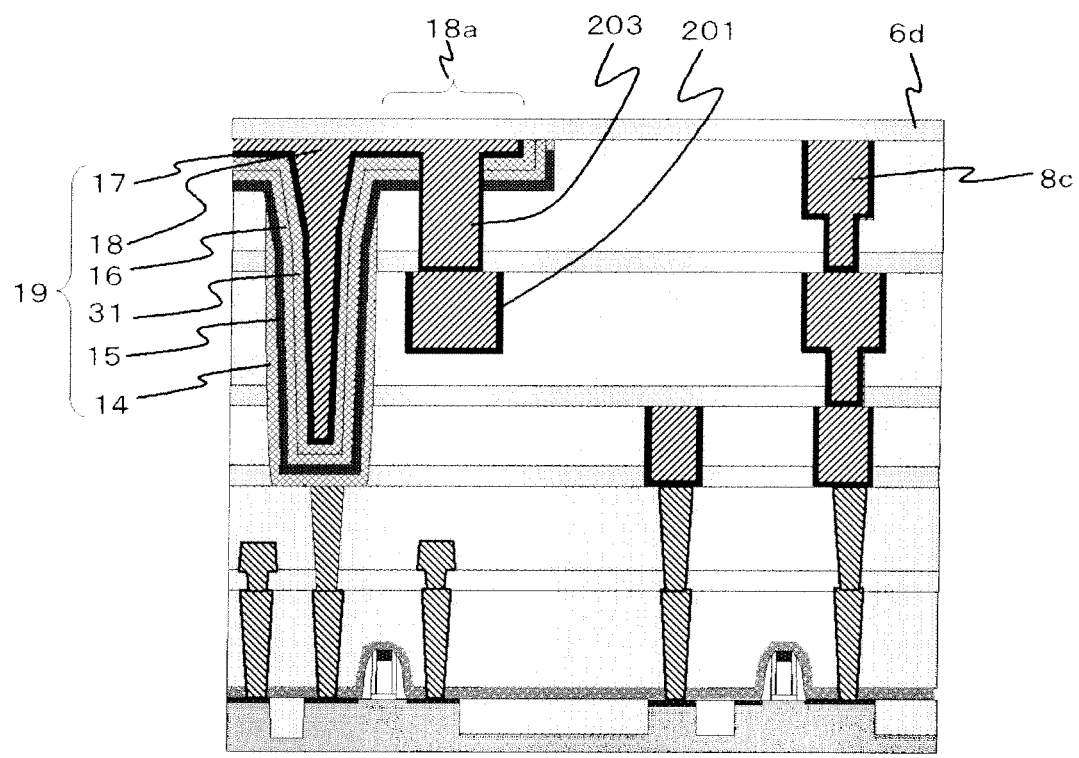

Next, as illustrated in FIG. 5F, a barrier metal film and a metal material layer are formed so as to cover or fill the openings 23, 28, 41 and 37, and the work is planarized typically by CMP. In this way, the interconnect 8c of the logic circuit, the upper interconnect 18 of the capacitor element 19, and the vertical interconnect 203 electrically connected to the fixed-potential interconnect 201 which resides right under the extension electrode 18a of the upper interconnect 18, may be formed in the same process. The insulating interlayer 6d is then deposited over the entire surface.

Thereafter, as illustrated in FIG. 5G, the signal interconnects 202a, 202b, 202c, and the interconnect 8d of the logic circuit are respectively formed further above the capacitor element 19 and the interconnect 8c of the logic circuit. The signal interconnects 202a to 202c and the interconnect 8d of the logic circuit may be formed typically by the damascene process, which is a general method adoptable as the method of manufacturing this sort of semiconductor device.

According to the method of manufacturing of the second embodiment, since it is no longer necessary to form the fixed-potential interconnect over the upper interconnect of the capacitor element 19, so that the designer can freely arrange the signal interconnects 202a to 202c, or can increase the line width of the signal interconnects 202a to 202c, to thereby reduce the interconnect resistance of the signal interconnects 202a to 202c. The semiconductor device successfully reduced in the interconnect resistance may be obtained in this way.

(Third Embodiment)

Next, a semiconductor device of a third embodiment will be explained referring to the attached drawings.

Figure 6:
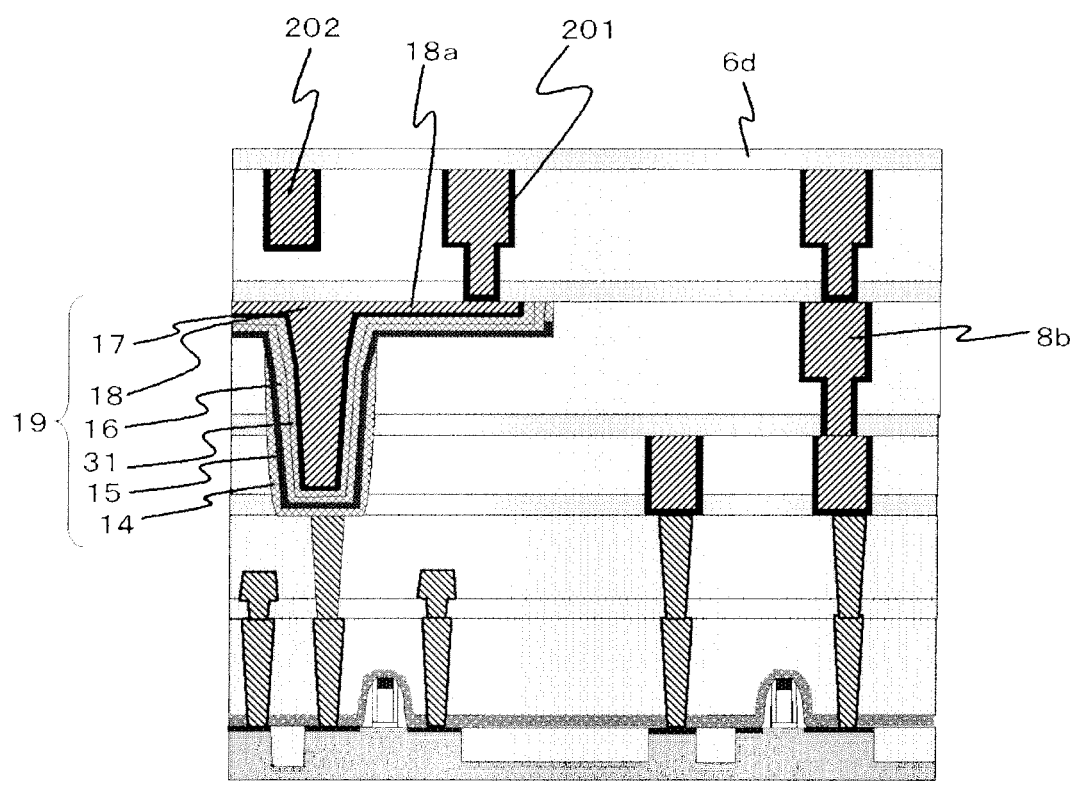
FIG. 6 is a sectional view schematically illustrating a semiconductor device of a third embodiment.

FIG. 6 is a sectional view illustrating the semiconductor device of the third embodiment. In the third embodiment, unlike the first embodiment and the second embodiment, the top surface of the upper interconnect 18 of the capacitor element 19 is formed so as to be aligned to the same plane with the top surface of the interconnect 8b of the logic circuit. More specifically, the height in the thickness-wise direction of the capacitor element 19 is equivalent to the multi-layered interconnect composed of two interconnect layers, which is smaller than those in the first and second embodiments. By virtue of this configuration, a larger number of interconnects in the memory circuit is now adoptable to applications other than the capacitor element, and the circuit design may therefore be simplified. While electrostatic capacity of the capacitor element 19 inevitably decreases due to reduced height thereof, the capacitance of the capacitor element 19 and the number of layers of the interconnect layers used for the memory circuit vary depending on a technique of designing the memory circuit and a required level of charge holding time, and the present invention allows the designer to determine priority of the capacitance value and the number of interconnect layers. Of course, in this embodiment, the height of the capacitor element 19 explained in the first and second embodiments may be increased to a degree equivalent to an increased number of interconnect layers (four or more layers, for example), so as to increase the electrostatic capacity of the capacitor element 19.

The third embodiment may give effects similar to those in the first embodiment.

Note that the method of manufacturing a semiconductor device of the third embodiment may be proceeded similarly to the method of manufacturing of the first embodiment, except for difference in height of the capacitor element. Since it is obvious that the configuration explained in the second embodiment is adoptable also to the third embodiment of the present invention, so that the detail will not be given.

(Fourth Embodiment)

Next, a method of manufacturing a semiconductor device of a fourth embodiment will be explained referring to the attached drawings.

FIGS. 7A to 7F are drawings sequentially illustrating procedures of manufacturing of the semiconductor device of the fourth embodiment.

The method of manufacturing of the fourth embodiment is different from that of the first embodiment, in that an opening for forming therein the interconnect of the logic circuit, having the top surface thereof aligned to the same plane with the top surface of the capacitor element, is formed using the hard mask 21, rather than using the hard mask 31. More specifically, while the method of manufacturing of the first embodiment adopted the hard mask 31 composed of a metal material layer in the process of etching the interconnect of the logic circuit, the method of manufacturing of the fourth embodiment adopts a resist layer and an insulating film (hard mask 21) such as a silicon oxide film as a mask in the process of etching the interconnect of the logic circuit.

Figure 7A:
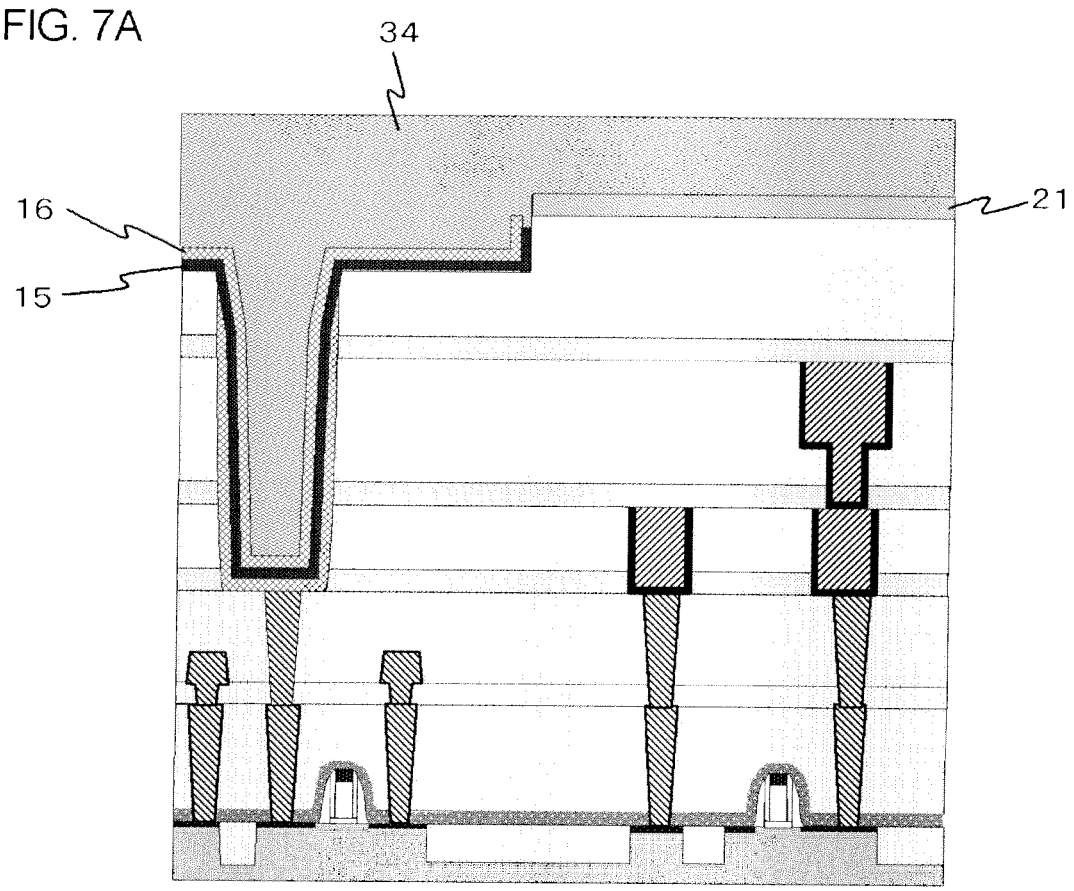
FIGS. 7A to 7F are sectional views sequentially illustrating procedures of manufacturing of the semiconductor device of the fourth embodiment.

First, the upper electrode 16 and the capacitor insulating film 15 are anistopically etched overall to leave them as illustrated in FIG. 3O, and the photoresist layer 34 is then formed over the upper electrode 16 and the hard mask 21 as illustrated in FIG. 7A.

Figure 7B:
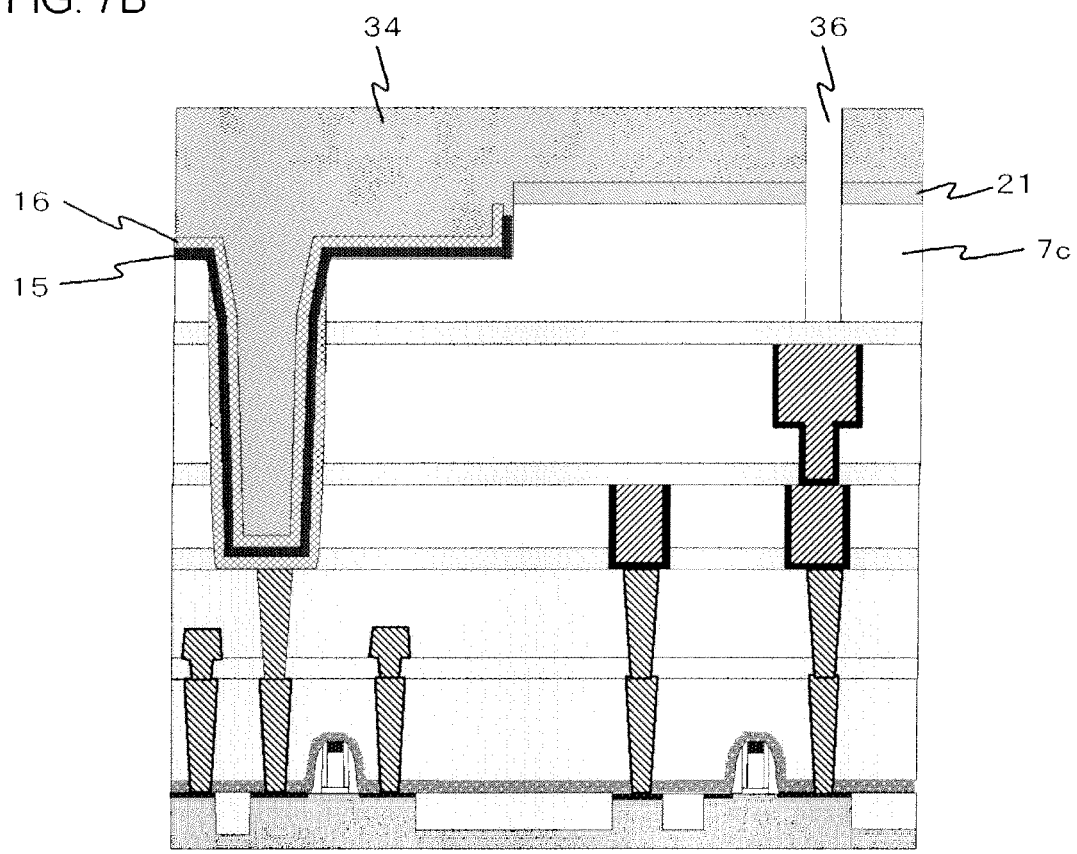
Figure 7C:
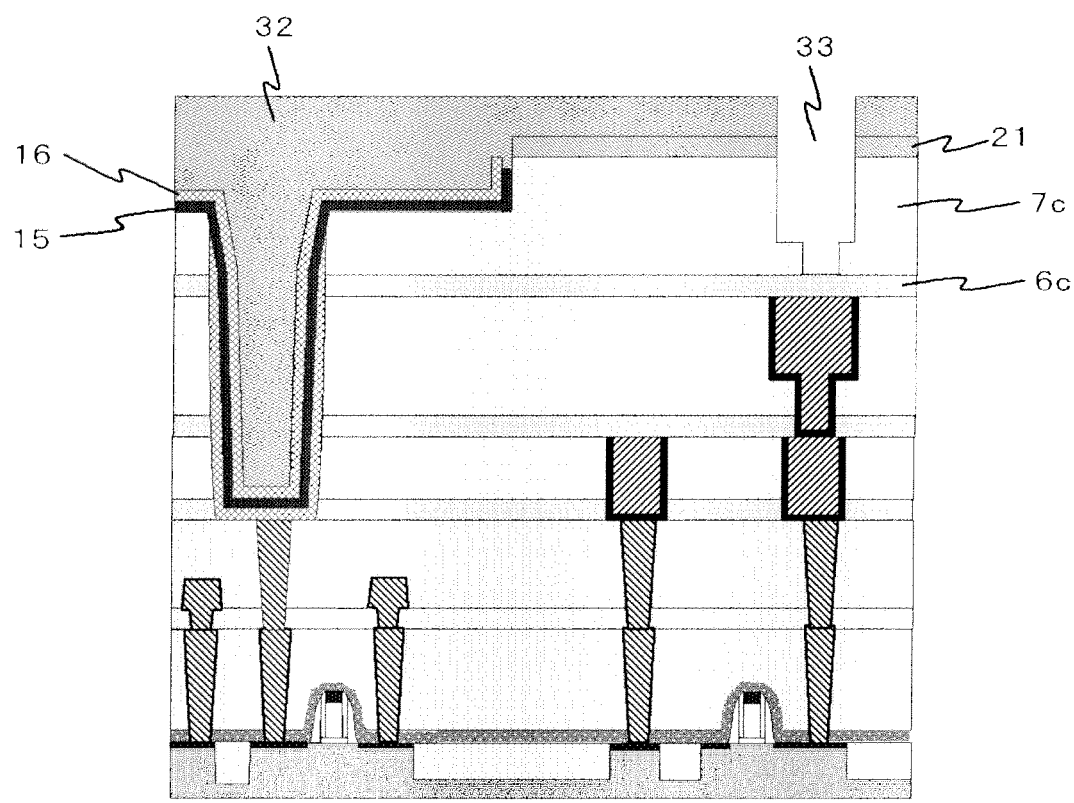

Next, as illustrated in FIG. 7B, the opening 36 for forming therein a via is formed in the insulating interlayer 7c using the photoresist layer 34 as a mask. The photoresist layer 34 is then removed by ashing, although not illustrated. Next, as illustrated in FIG. 7C, the photoresist layer 32 used for forming the opening for the interconnect is formed, and the opening 33 is formed in the insulating interlayer 7c, using the photoresist layer 32 and the hard mask 21 as a mask. While FIG. 7 illustrates each of the photoresist layer 32 and the photoresist layer 34 as a single-layered film, a so-called, multi-layered photoresist structure, typically composed of a planarizing film, a silicon oxide film, an anti-reflection film, and a photoresist layer, may alternatively be used. While FIG. 7C illustrates the photoresist layer 32 remained unremoved even after completion of the processing of the insulating interlayer 7c, the photoresist layer 32 may totally be removed as the reactive ion etching proceeds, and the residual process for forming the opening 33 for the interconnect may be proceeded using the hard mask 21 only.

Figure 7D:
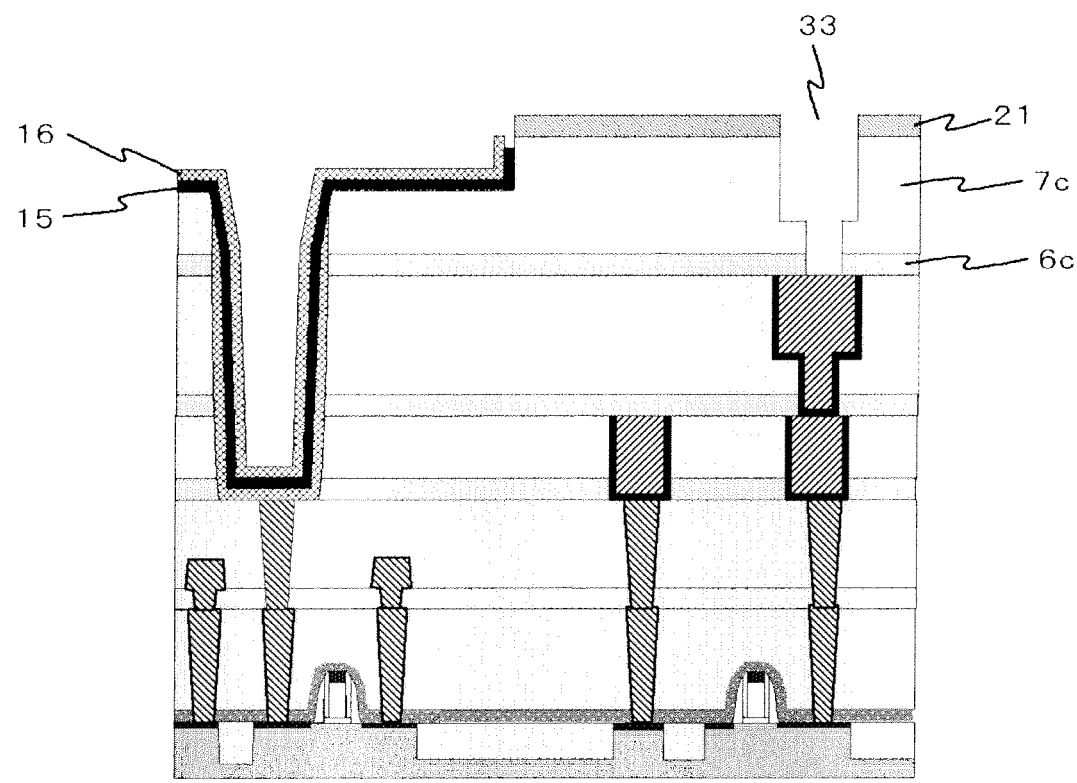
Figure 7E:
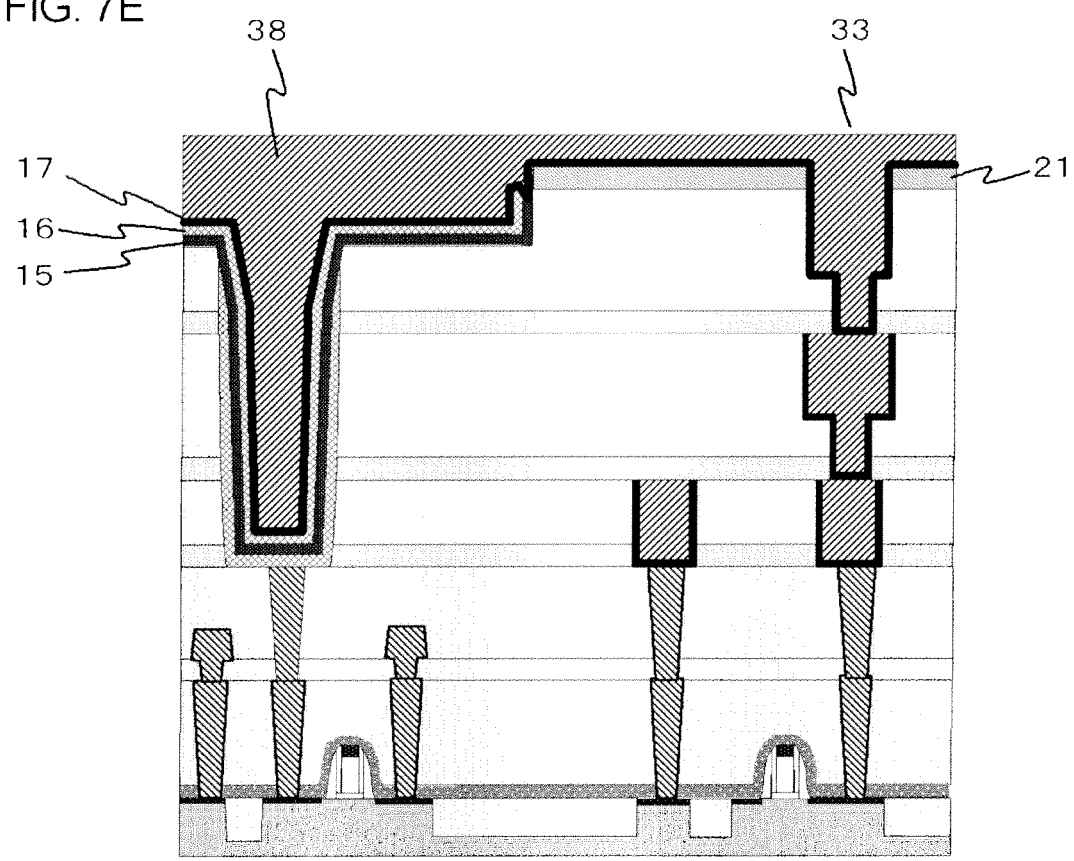

Next, as illustrated in FIG. 7D, the photoresist layer 32 is totally removed by ashing, and insulating interlayer 6c is processed so as to ensure connection with the lower interconnect. Thereafter, as illustrated in FIG. 7E, the barrier metal film 17 and the electro-conductive film 38 are formed typically by sputtering, ALD, CVD, plating or the like, so as to cover the opening for the capacitor element, the opening for the upper interconnect, and the opening 33 for the interconnect.

Figure 7F:
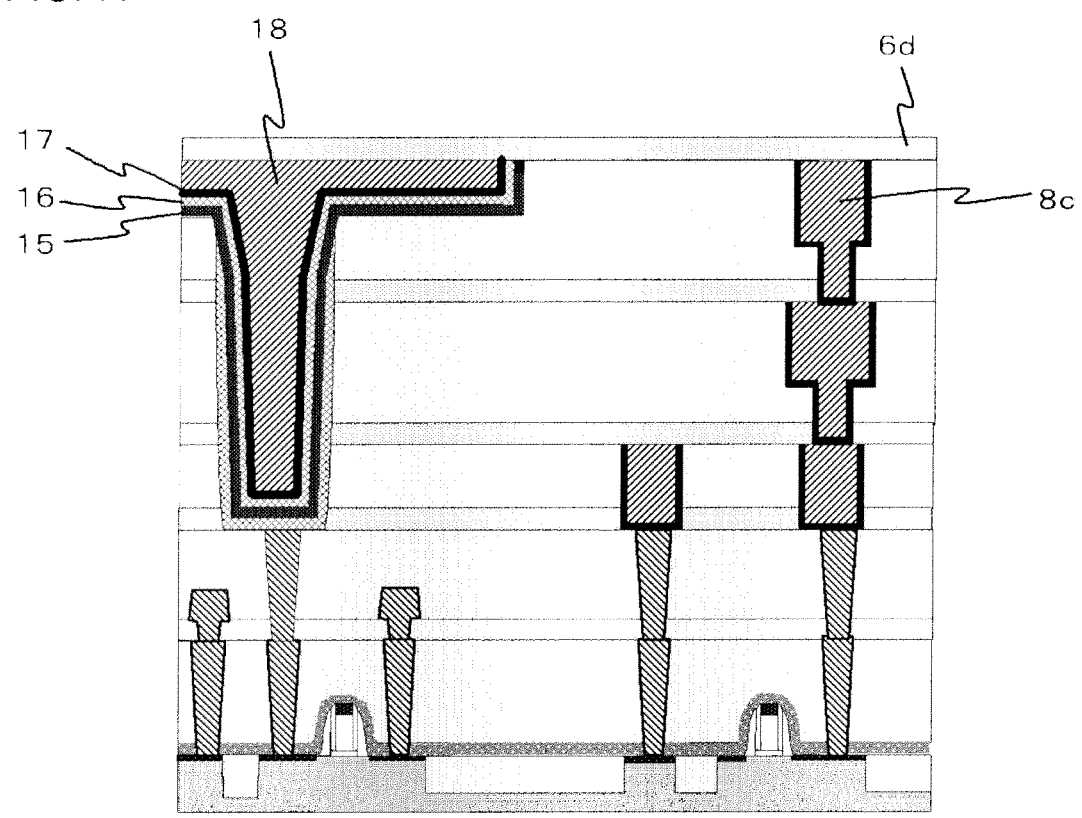

Next, as illustrated in FIG. 7F, unnecessary portions of the barrier metal film 17 and the electro-conductive film 38, and the hard mask 21 are removed typically by CMP so as to planarize the work, to thereby make the top surface of the upper interconnect 18 of the capacitor element and the top surface of the interconnect 8c of the logic circuit align to the same plane. The insulating interlayer 6d is then deposited over the upper interconnect 18 and the interconnect 8c, typically by CVD.

The semiconductor device explained in the first embodiment may be formed by the method of manufacturing of the fourth embodiment. According to the method of manufacturing of the fourth embodiment, electric resistance of the upper electrode 16 may be reduced as compared with the method of manufacturing of the first embodiment, since the hard mask 31 does not remain inside the capacitor element, although the number of times of aching increases as a result of disusing the metallic hard mask 31.

The fourth embodiment may give effects similar to those in the first embodiment.

It is obvious that the fourth embodiment, which is different from the method of manufacturing of the first embodiment only in the procedure of processing the insulating interlayer, may similarly be adoptable also to the second and third embodiments.

(Fifth Embodiment)

Next, a method of manufacturing of a fifth embodiment of the present invention will be explained, referring to the attached drawings.

FIGS. 8A to 8F are drawings sequentially illustrating procedures of manufacturing of the semiconductor device of the fifth embodiment.

The method of manufacturing of the fifth embodiment is different from that of the first embodiment, in that the interconnect of the logic circuit, having the top surface thereof aligned to the same plane with the top surface of the upper interconnect, is formed using the hard mask composed of a metal material layer and capacitor insulating film. More specifically, in contrast to the method of manufacturing of the first embodiment by which the interconnect of the logic circuit is processed using the hard mask 31 composed of a metal material layer, the processing of the interconnect of the logic circuit in the method of manufacturing of the fifth embodiment is conducted using the hard mask composed of a metal material layer and a capacitor insulating film.

According to the fifth embodiment, the second opening 37 to be filled with the interconnect 8c configuring the logic circuit 100 is formed using, as a mask, the upper electrode 16 and the capacitor insulating film 15 which configure the capacitor element 19.

Figure 8A:
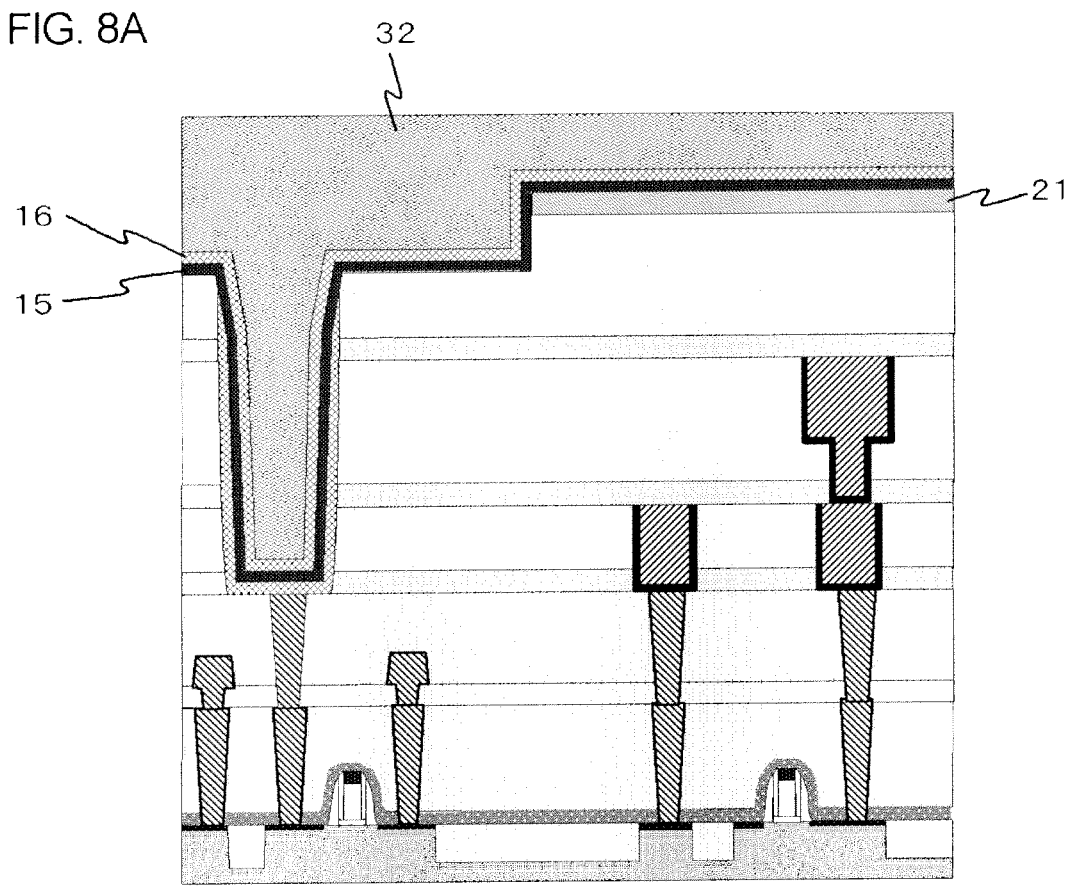

First, the capacitor insulating film 15 and the upper electrode 16 are deposited as illustrated in FIG. 3M, and the photoresist layer 32 is then formed over the entire surface of the capacitor insulating film 15 and the upper electrode 16, as illustrated in FIG. 8A. While the photoresist layer 32 herein is illustrated as a single-layered film, a multi-layered photoresist structure, typically composed of a planarizing film, a silicon oxide film, an anti-reflection film, and a photoresist layer, may alternatively be used.

Figure 8B:
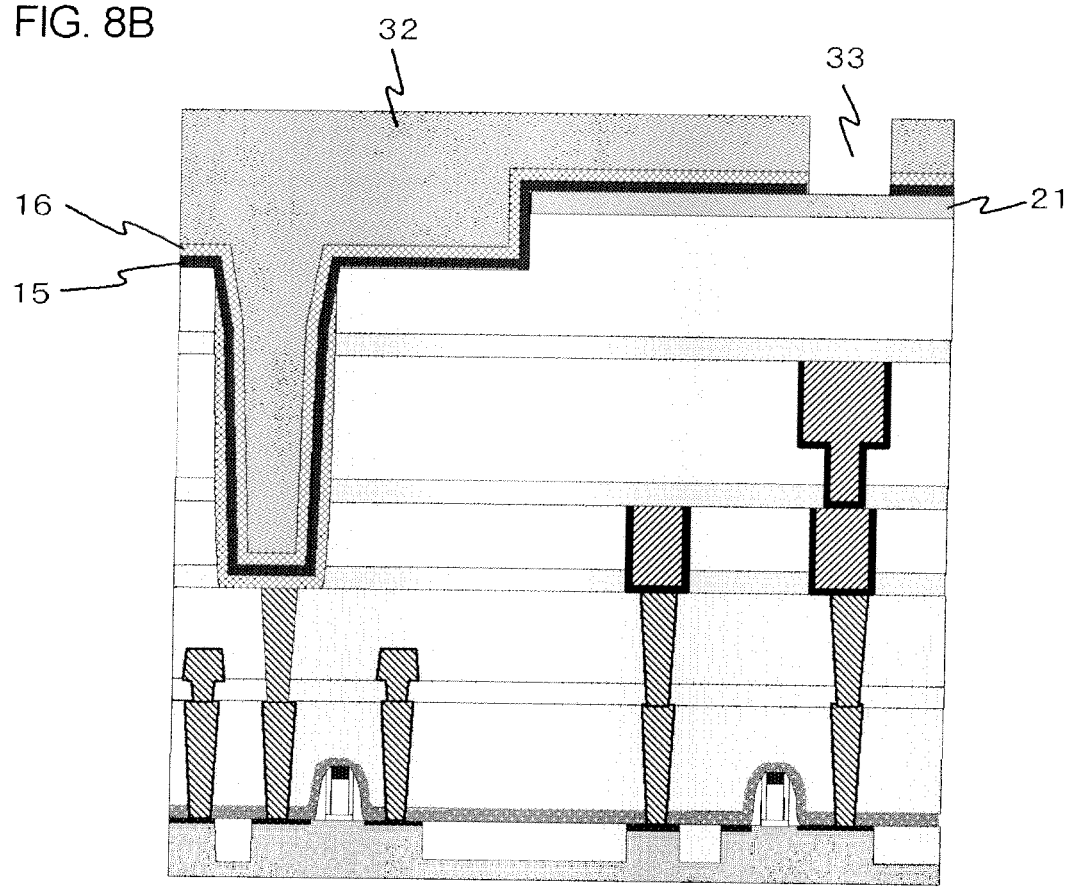

Next, as illustrated in FIG. 8B, a pattern of the interconnect of the logic circuit is formed in the photoresist layer 32 typically by photolithography, and the upper electrode 16 and the capacitor insulating film 15 are then processed typically by reactive ion etching, to thereby form the opening 33 conforming to a pattern of the interconnect of the logic circuit. After the opening 33 was formed, the photoresist layer 32 is removed by ashing, although not illustrated.

Figure 8C:
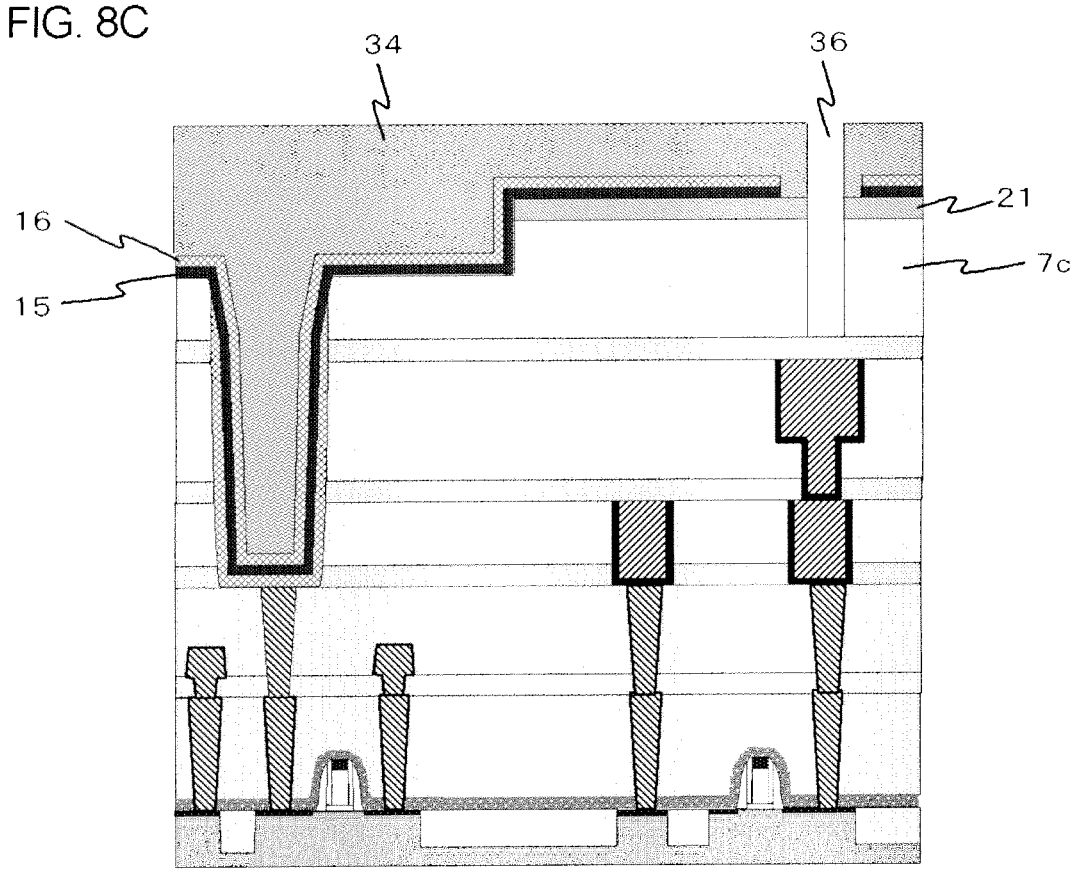

Next, after the photoresist layer 34 was formed as illustrated in FIG. 8C, the insulating interlayer 7c is processed according to a via pattern. While the photoresist layer 34 herein is illustrated as a single-layered film, a multi-layered photoresist structure, typically composed of a planarizing film, a silicon oxide film, an anti-reflection film, and a photoresist layer, may alternatively be used. Next, using the photoresist layer 34 as a mask, the opening 36 for forming therein the via is formed in the insulating interlayer 7*c* typically by reactive ion etching.

Figure 8D:
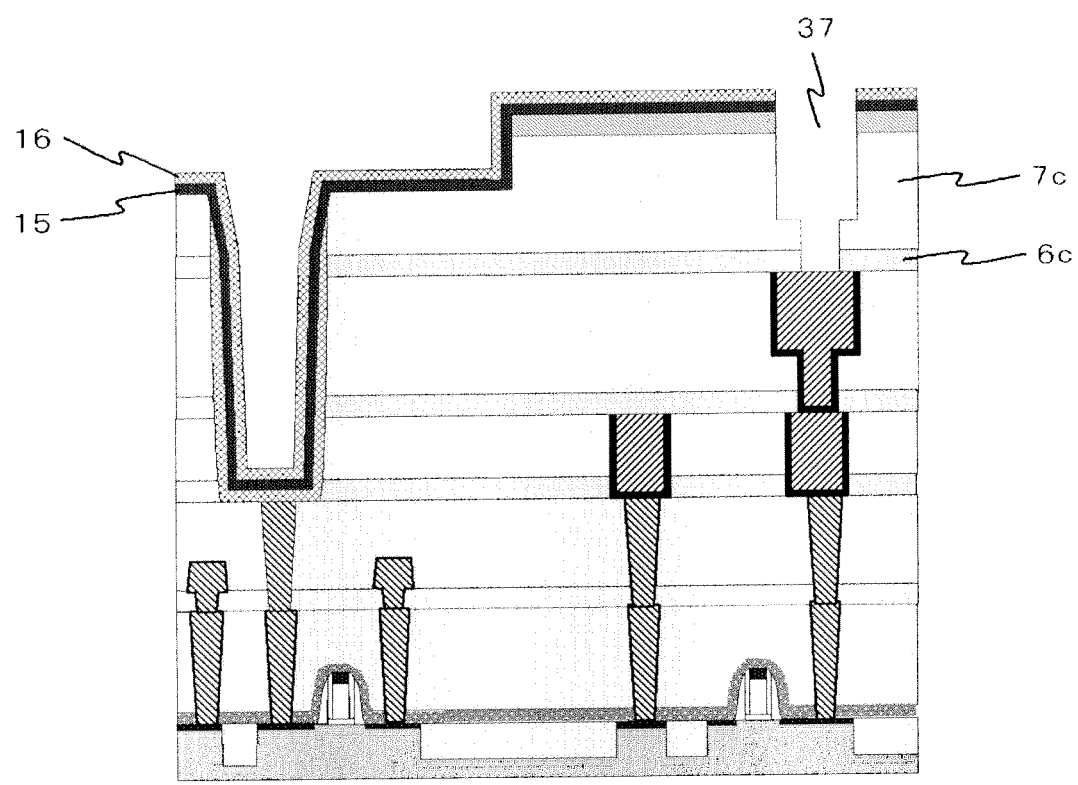

The photoresist layer 34 is then removed by ashing, and as illustrated in FIG. 8D, the opening 37 for forming therein the interconnect of the logic circuit is formed in the insulating interlayers 7*c* and 6*c*, typically by reactive ion etching, using the upper electrode 16 and the capacitor insulating film 15 as a mask.

Next, as illustrated in FIG. 8E, the barrier metal film 17, and the electro-conductive film 38 are formed typically by sputtering, ALD, CVD, plating or the like, so as to cover the opening for the capacitor element, the opening for the upper interconnect, and the opening for the interconnect.

Figure 8F:
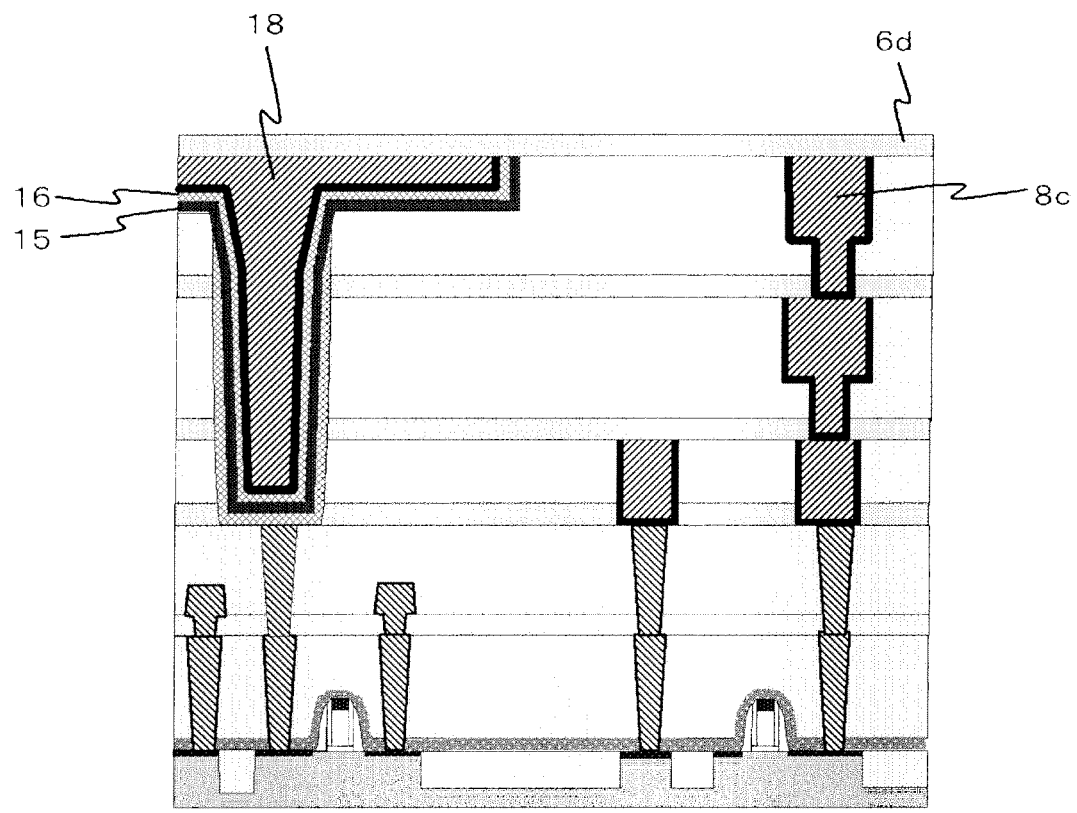

Next, as illustrated in FIG. 8F, unnecessary portions of the electro-conductive film 38, the barrier metal film 17, the upper electrode 16, the capacitor insulating film 15, and the hard mask 21 are removed typically by CMP, so as to planarize the work. In this way, the top surface of the upper interconnect 18 (electro-conductive film 38), and the top surface of the interconnect 8*c* of the logic circuit are formed so as to be aligned to the same plane. The insulating interlayer 6*d* is then formed over the upper interconnect 18 and the interconnect 8*c*, typically by CVD.

The semiconductor device explained in the first embodiment may therefore be formed also by the method of manufacturing of the fifth embodiment. According to the method of manufacturing of the fifth embodiment, since the opening for forming therein the interconnect of the logic circuit is formed using the upper electrode 16 and the capacitor insulating film 15 as a mask, so that the insulating film 15 is necessarily removed typically by CMP, when the electro-conductive film 38 is planarized. Accordingly, while the CMP process may demand more complicated process of end point detection or longer time of process, as compared with the CMP process in the method of manufacturing of the first embodiment, the method of manufacturing of the fifth embodiment may reduce the number of processes relevant to manufacturing of the semiconductor device, as compared with the conventional method of manufacturing the semiconductor device.

The fifth embodiment may give effects similar to those in the first embodiment.

It is obvious that the fifth embodiment, which is different from the method of manufacturing of the first embodiment only in the procedures of processing the insulating interlayer 7*c*, the upper electrode 16, and the capacitor insulating film 15, may similarly be adoptable also to the second and third embodiments.

This embodiment further includes the modes of embodiment described below.

(1) A method of manufacturing a semiconductor device having a memory circuit and a logic circuit formed on the same semiconductor substrate, characterized in processing an interconnect trench in the logic circuit using an upper electrode of a capacitor element as a mask.

(2) A method of manufacturing a semiconductor device having a memory circuit and a logic circuit formed on the same semiconductor substrate, characterized in processing an interconnect trench in the logic circuit using an upper electrode and a capacitor insulating film of a capacitor element as a mask.

(3) A method of manufacturing a semiconductor device having a memory circuit and a logic circuit formed on the same semiconductor substrate, characterized in that an upper interconnect configuring a capacitor element and an interconnect of the logic circuit positioned nearly to the same level of height with the upper interconnect are formed at the same time.

(4) A method of manufacturing a semiconductor device having a memory circuit and a logic circuit formed on the same semiconductor substrate as described in any one of (1) to (3), wherein the method includes a step of forming a device isolation layer and an active element on a semiconductor substrate; a step of forming a first insulating interlayer on the semiconductor substrate; a step of forming a first contact plug and a bit line in the first insulating interlayer; a step of depositing a second insulating interlayer on the bit line; a step of forming a second contact plug connected to the first contact plug in the second insulating interlayer; a step of forming a third insulating interlayer on the second contact plug; a step of forming an interconnect of the logic circuit in the third insulating interlayer; a step of further forming an opening in the third insulating interlayer, and then depositing a lower electrode, a capacitor insulating film, and an upper electrode which configure a capacitor element; a step of forming, in the third insulating interlayer, an opening for forming therein an interconnect of the logic circuit, the top surface of which is aligned nearly to the same level of height with the top surface of the upper electrode configuring the capacitor element; a step of filling a metal material layer into the opening for forming therein the capacitor element, and into the opening for forming therein the interconnect of the logic circuit aligned nearly to the same level of height with the top surface of the upper electrode circuit interconnect; and a step of planarizing the metal material layer.

(Sixth Embodiment)

Next, a sixth embodiment will be explained referring to the attached drawings.

Figure 10:
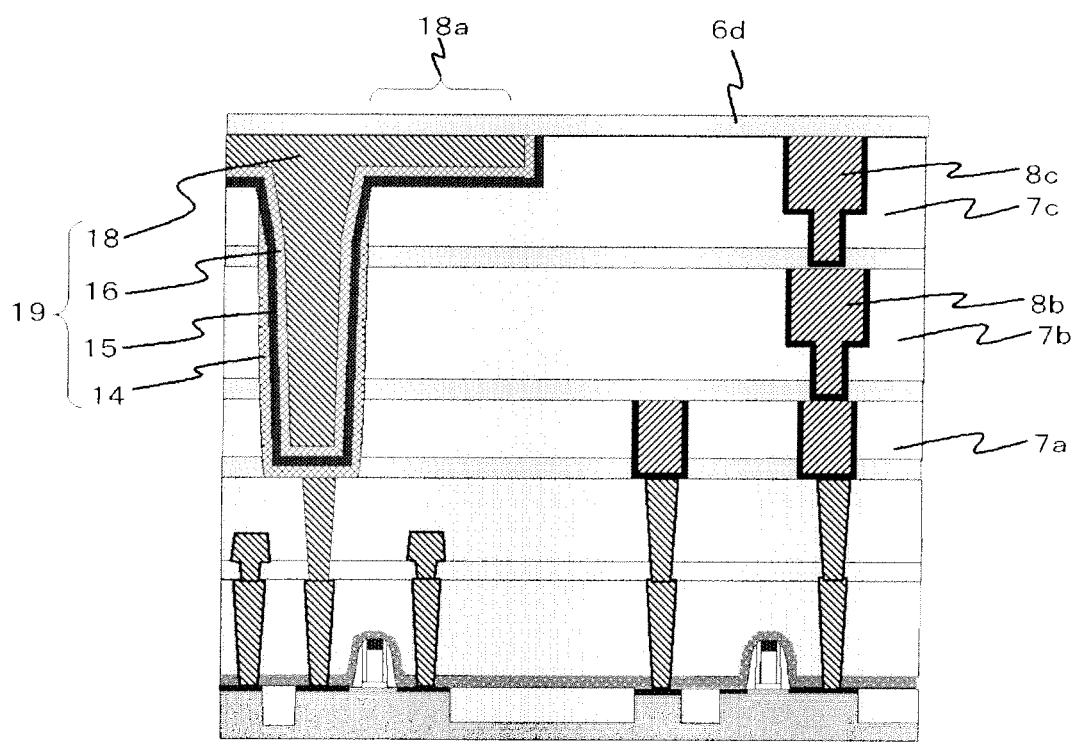
FIG. 10 is a sectional view schematically illustrating a semiconductor device of a sixth embodiment.

FIG. 10 is a sectional view illustrating the sixth embodiment. In the sixth embodiment, as illustrated in FIG. 10, the upper interconnect 18 configuring the capacitor element 19, and the interconnect 8*c* configuring the logic circuit are respectively composed of different materials, unlike the first embodiment of the present invention illustrated in FIG. 1. The top surfaces of the upper interconnect 18 and the extension interconnect 18*a* configuring the capacitor element 19, and the top surface of the interconnect 8*c* configuring the logic circuit, respectively formed using different materials, are aligned to the same plane, similarly to the first embodiment. The upper interconnect 18 and the extension electrode 18*a* configuring the capacitor element 19 are integrally formed using the same material, and is preferably composed of a metal such as tungsten, filled typically by a method excellent in readiness of filling.

According to the sixth embodiment, the upper interconnect 18 and the extension electrode 18*a* configuring the capacitor element 19, and the interconnect 8*c* configuring the logic circuit are formed using different materials. Accordingly, appropriate materials may be filled by appropriate methods. For example, in view of ensuring reliability of the capacitor element 19, it may be preferable to use a metal material excellent in electro-migration resistance, such as tungsten, for the filling in order to form the upper interconnect 18 and the extension electrode 18*a* configuring the capacitor element 19. On the other hand, there is a problem regarding the readiness of filling as described below. In the process of forming the upper interconnect 18 configuring the capacitor element 19, it is necessary to fill an opening deeper than an opening for forming the interconnect 8*c* configuring the logic circuit. For the case where the upper interconnect 18 configuring the capacitor element 19 and the interconnect 8*c* configuring the logic circuit are formed by filling according to the same method such as plating, as described in the first embodiment of the present invention, difference in depth of the trenches to be filled may make the filling per se difficult, or may demand a thicker plated film, and may result in increase in the manufacturing cost. The sixth embodiment may now solve these problems.

In the sixth embodiment, the top surfaces of the upper interconnect 18 and the extension electrode 18*a* configuring the capacitor element 19, and the top surface of the interconnect 8*c* configuring the logic circuit may be formed so as to be aligned to the same plane, by appropriately selecting various conditions of CMP. In this way, effects similar to those in the first may be obtained.

Next, the method of manufacturing of the sixth embodiment will be detailed, referring to the attached drawings. FIGS. 11A to 11F are sectional views for sequentially explaining the processes of manufacturing in the sixth embodiment.

The sixth embodiment relates to a method of manufacturing a semiconductor device having the memory circuit 200 and the logic circuit 100 formed on the same substrate (semiconductor substrate 1). The method includes a step of forming the insulating layer (insulating interlayers 7*a* to 7*c*) on the semiconductor substrate 1, forming the opening 23 in the insulating interlayers 7*a* to 7*c*, and forming the lower electrode 14, the capacitor insulating film 15, the upper electrode 16, the embedded electrode, and the upper interconnect 18 in the opening 23; a step of planarizing the upper interconnect 18; a step of forming the interconnect trench (opening 37) in the insulating interlayer 7*c* having the opening 23 formed therein; a step of forming a metal film (electro-conductive film 38) so as to fill the opening 37; and a step of planarizing the electro-conductive film 38, and further planarizing the upper interconnect 18 at the same time.

In the step of planarizing the metal film, the capacitor element 19 configured by the lower electrode 14, the capacitor insulating film 15, the upper electrode 16, the embedded electrode and the upper interconnect 18 is formed in the opening 23, while forming the interconnect 8*c* configuring the logic circuit in the interconnect trench (opening 37).

The method of manufacturing according to the sixth embodiment is similar to the method of manufacturing explained in the first embodiment, except for the processes of forming the capacitor element 19 and succeeding processes. In other words, in the method of manufacturing according to the sixth embodiment of the present invention, the step illustrated in FIG. 3M explained in the first embodiment, and succeeding steps follow different procedures.

Figure 11A:
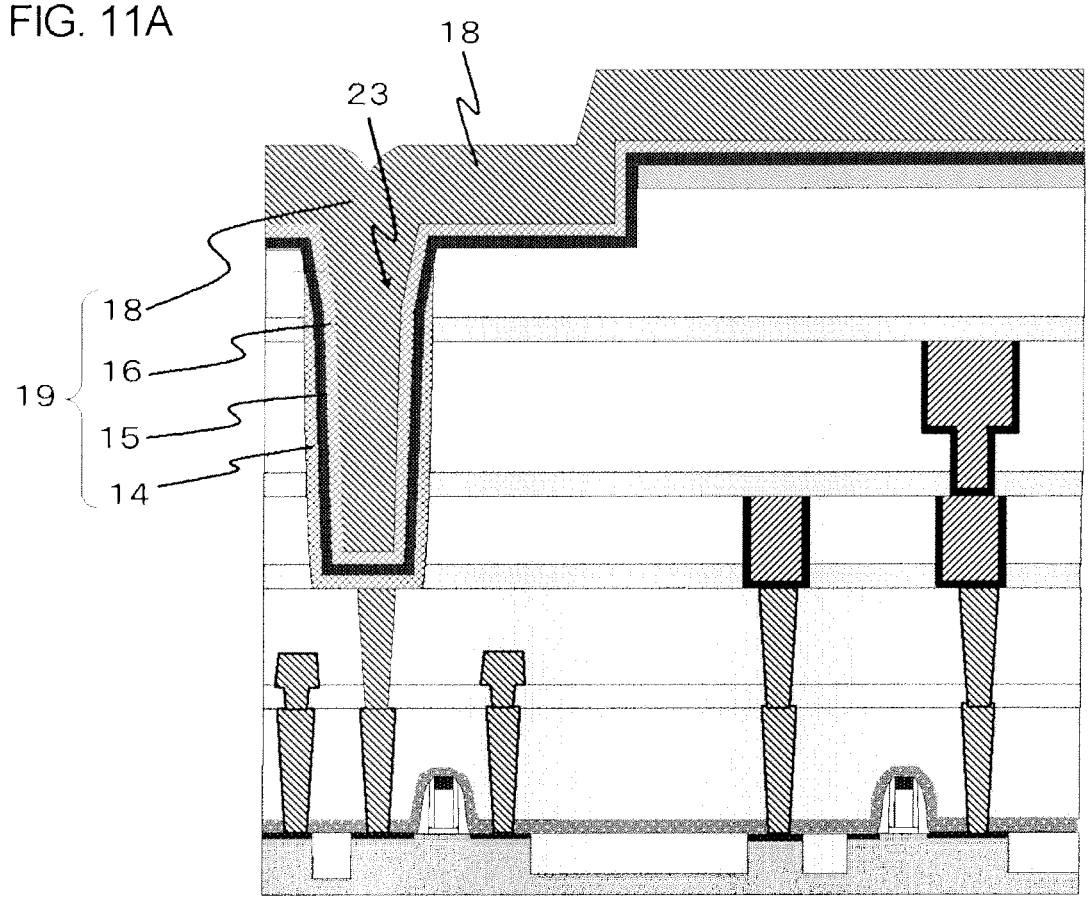
FIGS. 11A to 11F are sectional views sequentially illustrating procedures of manufacturing of the semiconductor device of the sixth embodiment.

In the method of manufacturing according to the sixth embodiment, as previously illustrated in FIG. 3M according to the first embodiment of the present invention, a metal film for composing the upper interconnect 18 is deposited, after the upper electrode 16 was formed as illustrated in FIG. 11A. The upper interconnect 18 may be formed using a metal material such as tungsten, which is excellent in heat stability, despite of its resistivity larger than that of copper or other metal materials having relatively small resistivity. The upper interconnect 18 may be filled typically by CVD, generally adopted to the method of manufacturing the semiconductor devices.

Figure 11B:
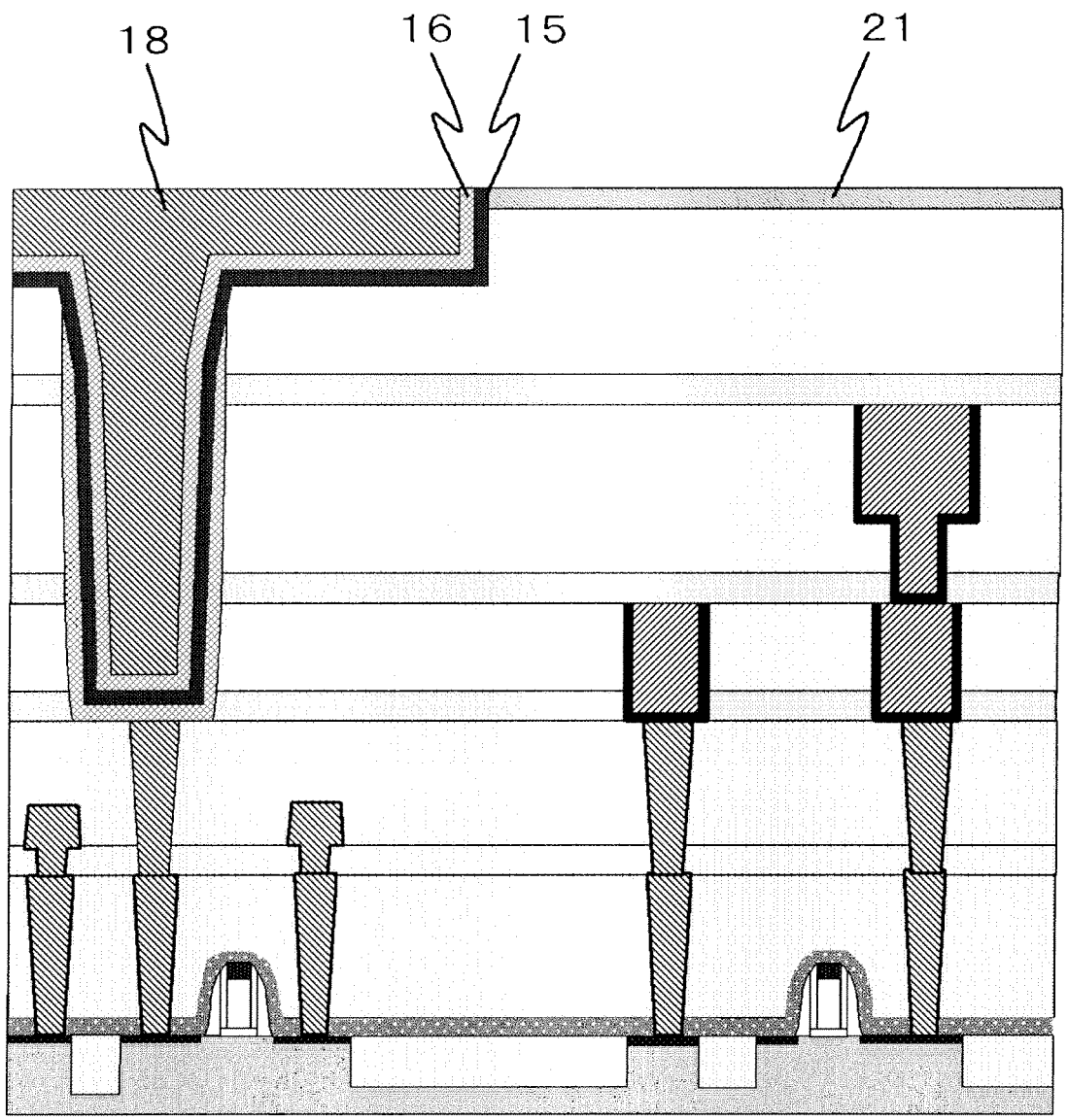

Next, as illustrated in FIG. 11B, excessive portions of the upper interconnect 18, the upper electrode 16, and the capacitor insulating film 15 are removed and planarized typically by CMP. While FIG. 11B shows an exemplary case where the planarization was terminated halfway so as to leave a part of the hard mask 21 unremoved, the hard mask 21 may totally be removed. Again although not illustrated, the planarization may be terminated on the top surface of the capacitor insulating film 15, and then the capacitor insulating film 15 may anisotropically be etched overall, typically by reactive ion etching.

Figure 11C:
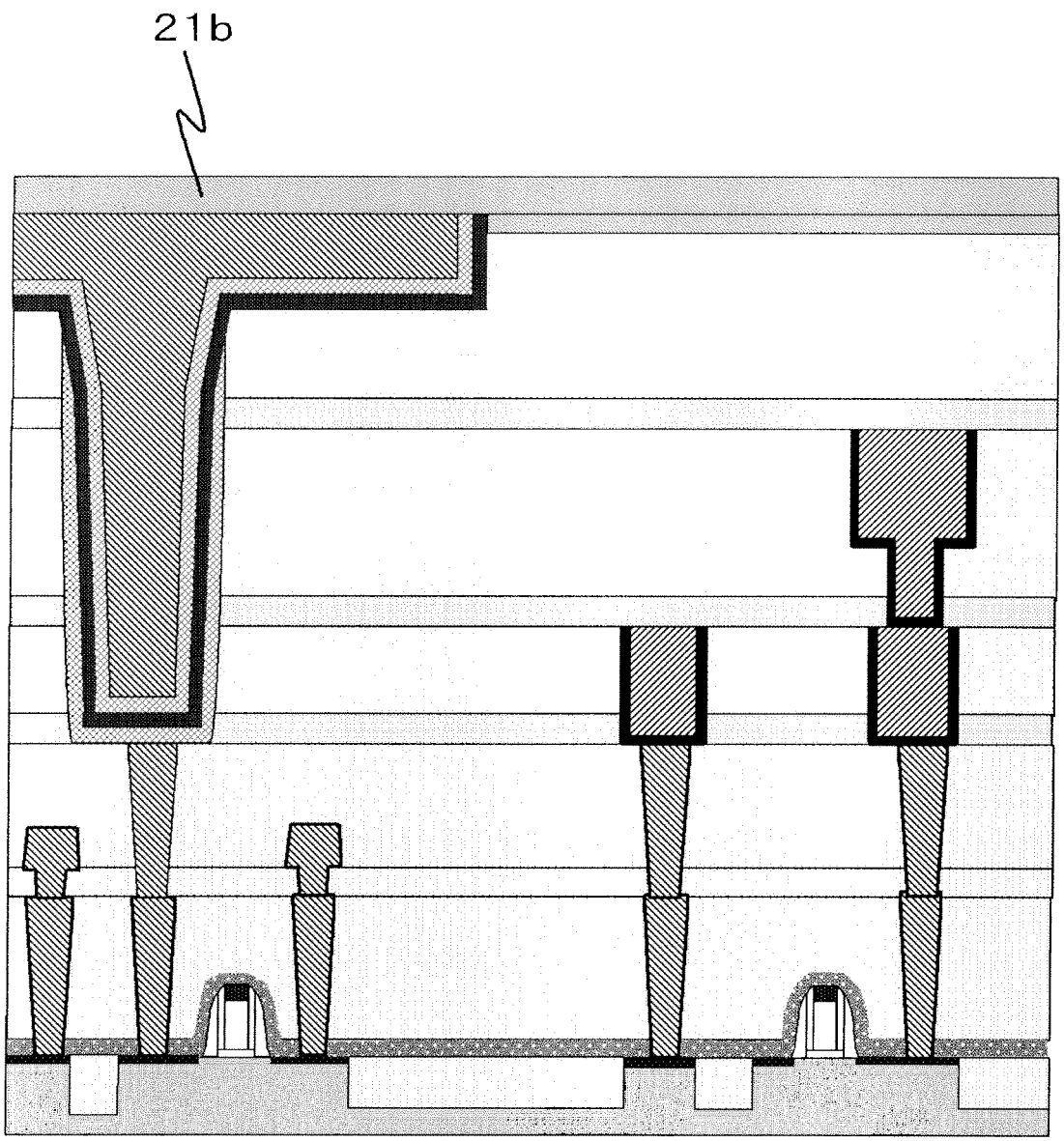

Next, as illustrated in FIG. 11C, a hard mask 21*b* is grown again. The hard mask 21*b* is allowed to function as a hard mask later in the process of forming the interconnect trench for forming therein the interconnect configuring the logic circuit.

Figure 11D:
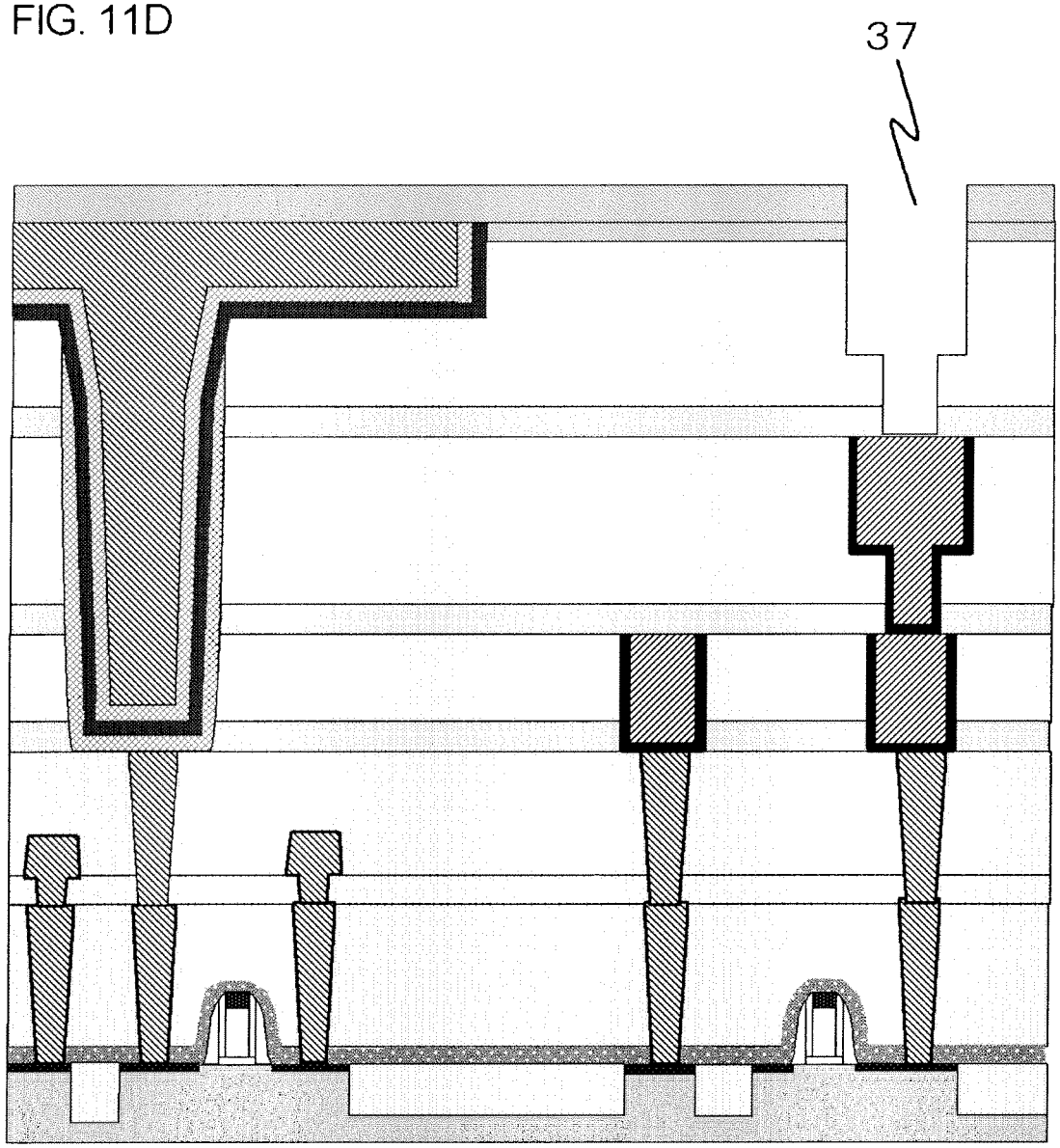

Next, as illustrated in FIG. 11D, the interconnect trench 37, for forming later therein the interconnect configuring the logic circuit, is formed typically photolithography and reactive ion etching.

Figure 11E:
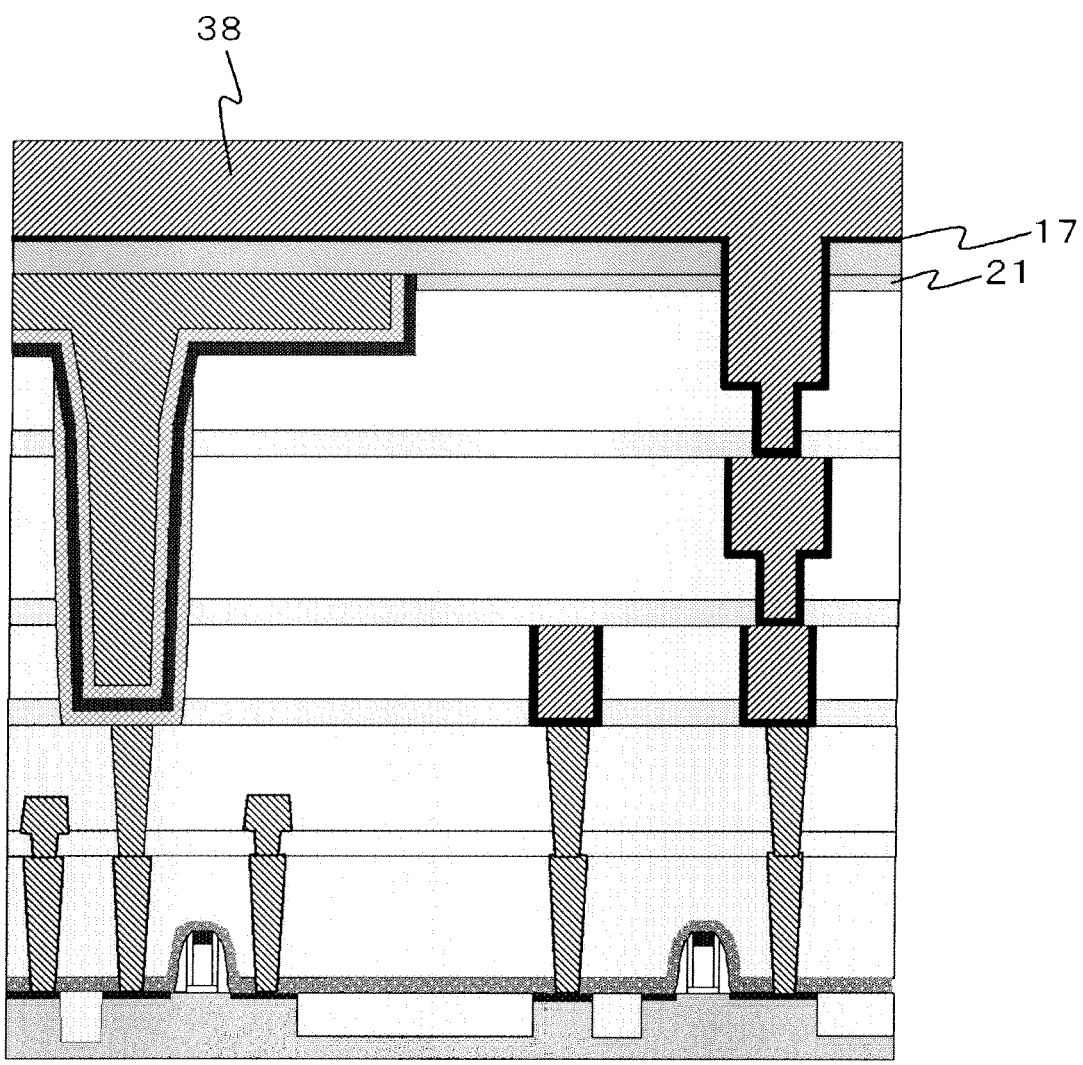

Next, as illustrated in FIG. 11E, the barrier metal film 17 and the metal film 38 are sequentially deposited. The barrier metal film 17 may be configured by a metal film composed of titanium, tantalum, nitrides of these metals, alloys of these metals, stack of these material layers, or other metal films containing metal elements such as manganese, ruthenium and so forth. The metal film may be deposited typically by sputtering, ALD, or the like. The metal film 38, to be adopted to the interconnect of the logic circuit, is preferably composed of a metal material having a small resistivity, such as copper, and alloy mainly composed of copper. The metal film 38 may be deposited typically by plating, CVD, or the like.

Figure 11F:
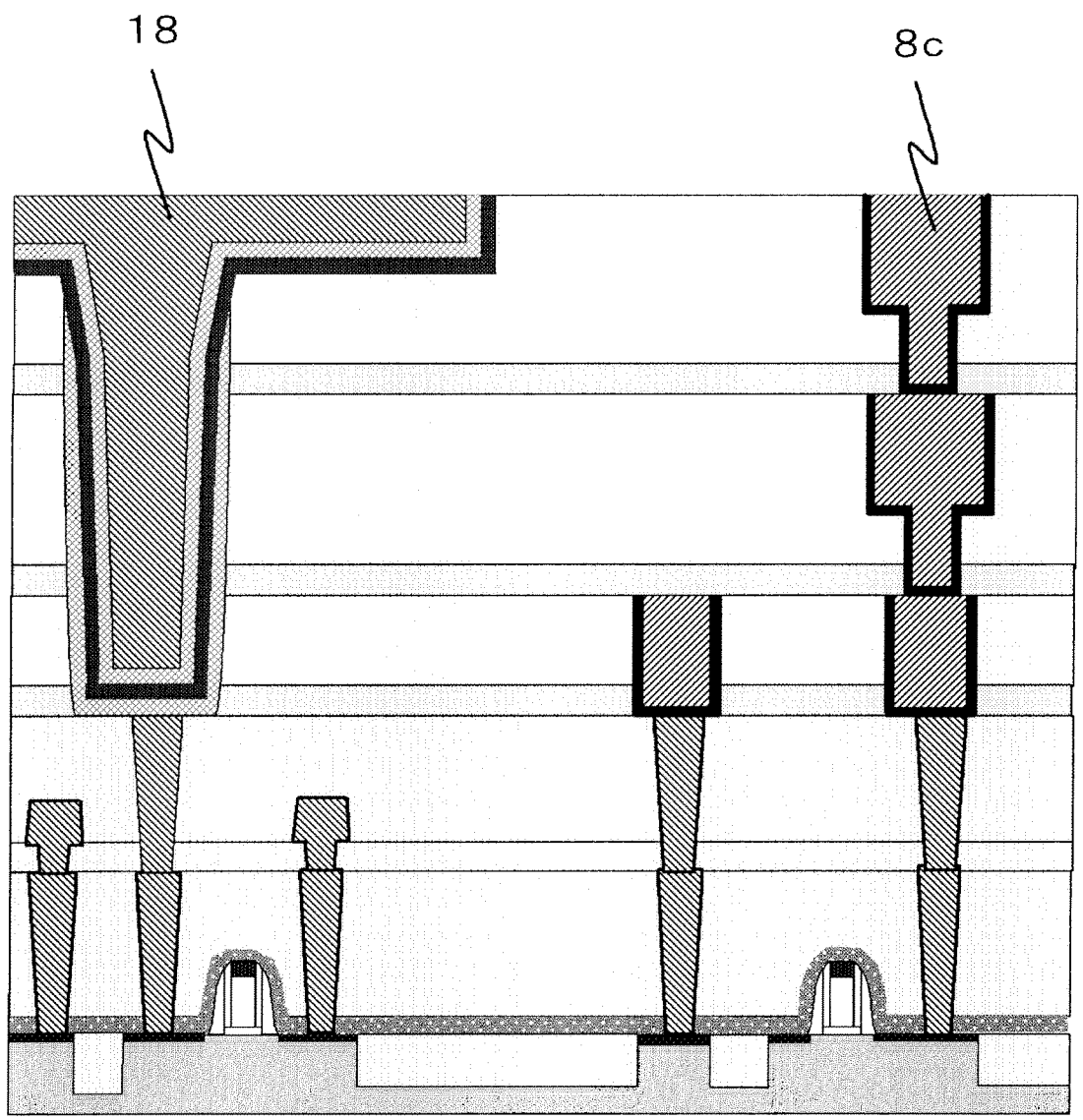

Next, as illustrated in FIG. 11F, excessive portions of the metal film 38, the barrier metal film 17, and the hard mask 21*b* are removed typically by CMP. In this process, it is preferable to concomitantly remove the hard mask 21 deposited in order to pattern the trench for forming therein the capacitor element. It is further preferable in this process to planarize the upper interconnect 18 configuring the capacitor element 19, so as to align the top surface of the upper interconnect 18 and the top surface of the logic circuit interconnect 8*c* to the same plane. After the above-described processes, a common metal diffusion blocking film (insulating interlayer 6*d*) is formed over the upper interconnect 18, the extension electrode 18*a*, and the interconnect 8*c* configuring the logic circuit, all of which having the top surfaces thereof aligned to the same plane. The structure illustrated in FIG. 10 is thus obtained.

The number of times of planarization process in the sixth embodiment is larger than that in the first embodiment, since the sixth embodiment includes the planarization processes for polishing the upper interconnect 18 and the extension electrode 18*a* configuring the capacitor element 19 to a predetermined degree, and the planarization process for making the top surface of the interconnect 8*c* configuring the logic circuit aligned to the same plane with the above-described top surface. The sixth embodiment may, however, yield an effect of improving electromigration resistance of the capacitor element 19, an effect of improving readiness of filling, and an effect of reducing the manufacturing cost relevant to the filling. In other words, whichever of the first and sixth embodiments of the present invention should be implemented may be determined by the operator, taking reliability of the semiconductor device, readiness of manufacturing, manufacturing cost and so forth into consideration.

According to the sixth embodiment, the reliability of the capacitor element may be improved, by using a metal material excellent in readiness of filling and being chemically more stable as the metal electrodes. Since the capacitor element may be formed without the ashing process which has been necessary in the process of simultaneously forming the embedded electrode and the interconnect configuring the logic circuit, so that interfacial resistance between the upper electrode and the embedded electrode may be reduced.

(Seventh Embodiment)

Next, a method of manufacturing according to the seventh embodiment of the present invention will be explained, referring to the attached drawings.

Figure 12:
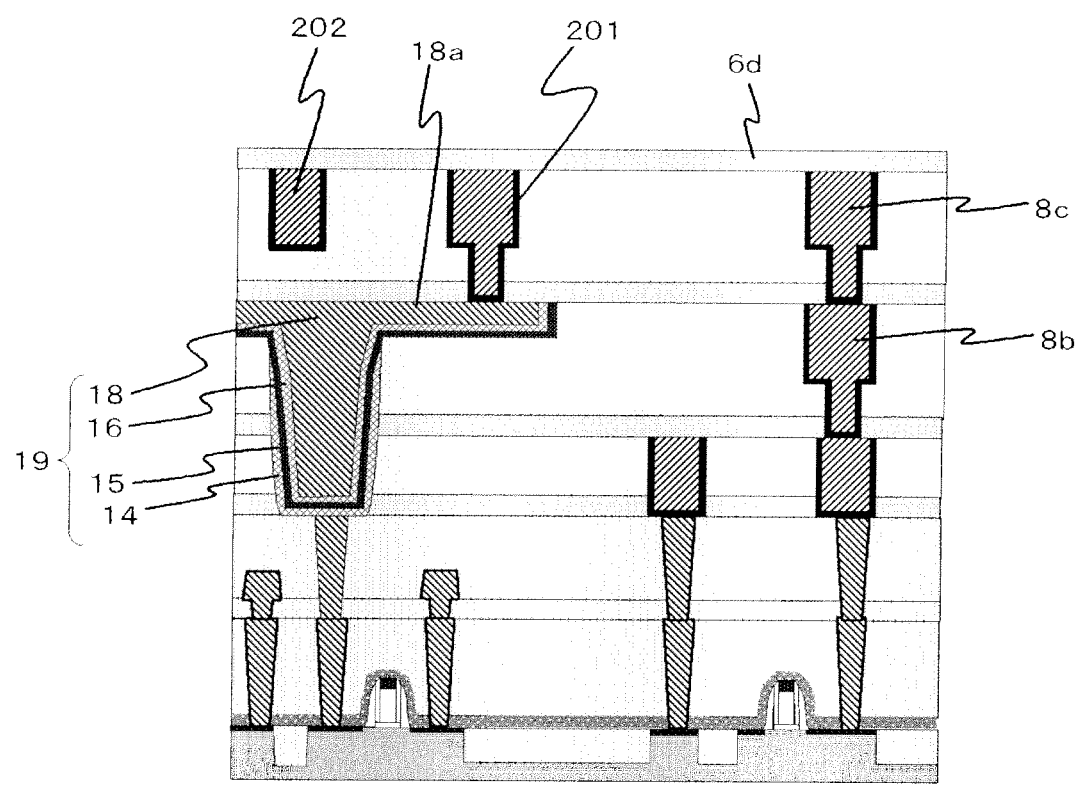
FIG. 12 is a sectional view schematically illustrating a semiconductor device of a seventh embodiment.

FIG. 12 is a sectional view illustrating the seventh embodiment. Unlike the above-described sixth embodiment, the top surface of the upper interconnect 18 configuring the capacitor element 19 in the seventh embodiment is formed so as to be aligned to the same plane with the top surface of the interconnect 8b configuring the logic circuit, as illustrated FIG. 12. More specifically, the capacitor element 19 is configured to have a height in the thickness-wise direction equivalent to two layers of the multi-layered interconnects, which is smaller than that in the sixth embodiment illustrated in FIG. 10. By virtue of this configuration, the number of layers of interconnects in the memory circuit, adoptable to applications other than the capacitor element may be increased, and thereby the circuit design may be simplified. While electrostatic capacity of the capacitor element 19 inevitably decreases due to reduced height thereof, the capacitance of the capacitor element 19 and the number of layers of the interconnect layers used for the memory circuit vary depending on a technique of designing the memory circuit and a required level of charge holding time. The present invention allows the designer to determine priority of the capacitance value and the number of interconnect layers. Of course, in this embodiment, the height of the capacitor element 19 explained in the sixth embodiment may be increased to a degree equivalent to an increased number of interconnect layers (four or more layers, for example), so as to increase the electrostatic capacity of the capacitor element 19.

The seventh embodiment may give effects similar to those in the sixth embodiment.

(Eighth Embodiment)

Next, a method of manufacturing according to an eighth embodiment will be explained, referring to the attached drawings.

Figure 13:
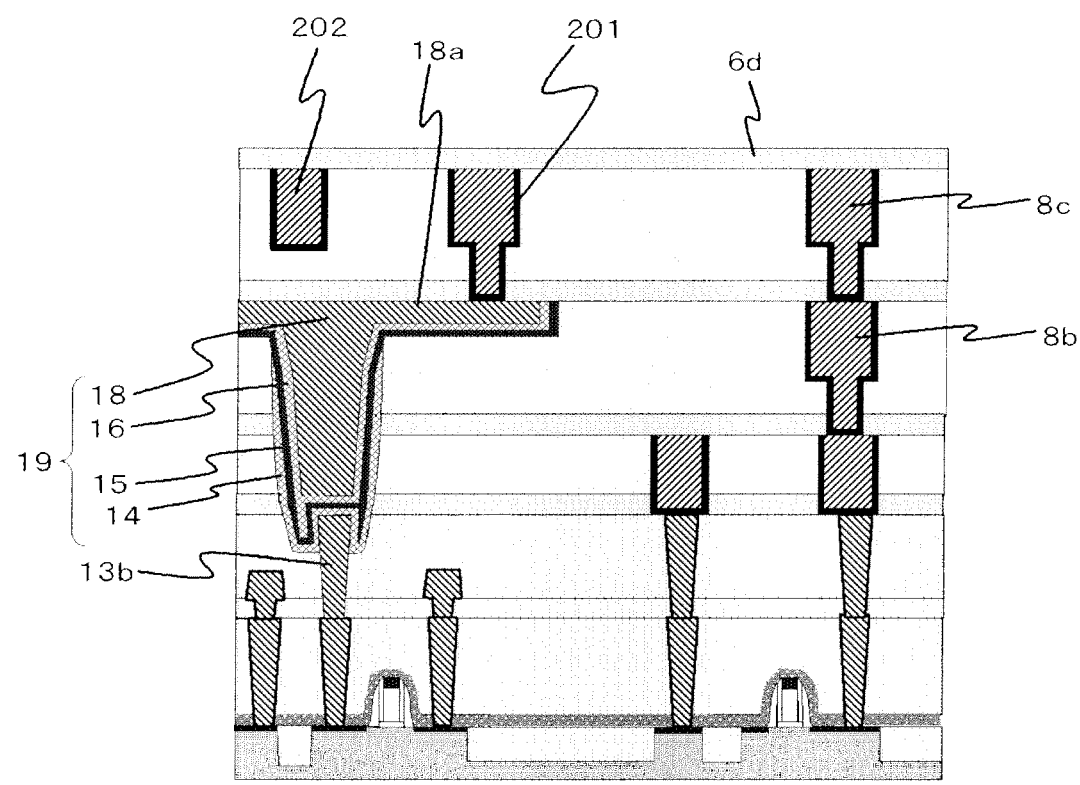
FIG. 13 is a sectional view schematically illustrating a semiconductor device of an eighth embodiment.

FIG. 13 is a sectional view illustrating the eighth embodiment. Unlike the above-described first to seventh embodiments, the lower electrode 14 configuring the capacitor element 19 in the eighth embodiment is formed so as to cap a upper surface and at least a part of side face of the capacitor contact plug 13b, and thereby area of the electrode of the capacitor element 19 increases, as illustrated in FIG. 13. Increase in the area of electrode of the capacitor element in the memory circuit in this way yields an effect of increasing the electrostatic capacity of the capacitor element, and an effect of increasing the data holding time of the memory circuit. Configuration and effects of this embodiment may be obtained by deepening the opening 23 at the portion around the capacitor contact plug 13b, when the capacitor element is formed typically by reactive ion etching, in the process of manufacturing described in the above referring to FIGS. 3F to 3H. The eighth embodiment may therefore be implemented concomitantly with any other embodiment of the present invention. The eighth embodiment may give effects similar to those in the first or sixth embodiment.

(Ninth Embodiment)

Next, a ninth embodiment of the present invention will be explained, referring to the attached drawings.

Figure 14A:
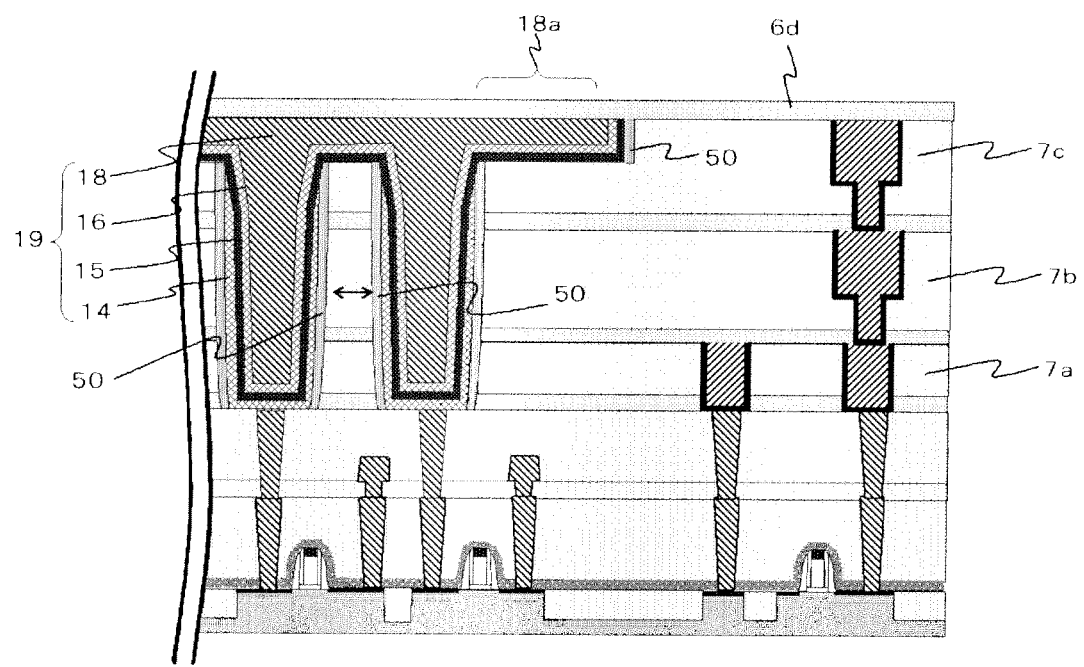
FIGS. 14A and 14B are sectional views schematically illustrating a semiconductor device of a ninth embodiment.
Figure 14B:
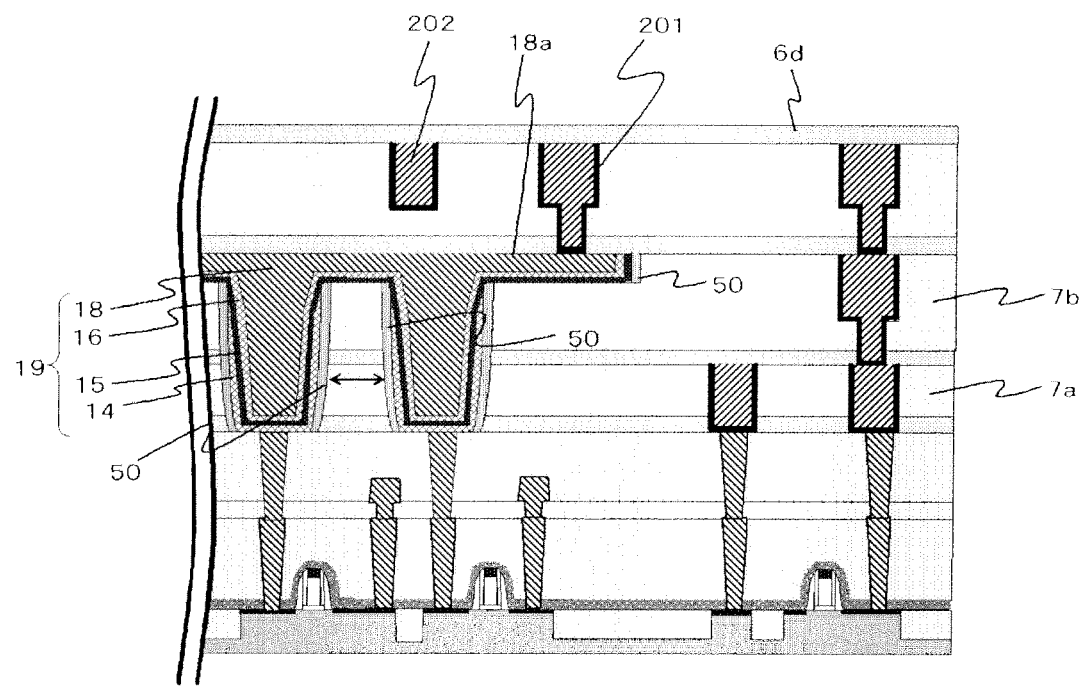

FIGS. 14A and 14B are sectional views illustrating the ninth embodiment. In the ninth embodiment, as illustrated in FIG. 14A, a sidewall protection film 50 is formed between the insulating interlayer 7, and the lower electrode 14 and the capacitor insulating film 15 configuring the capacitor element 19. More specifically, the sidewall protection film 50 is formed so that the lower electrode 14 does not come into contact with the insulating interlayers 7a to 7c in the area between the adjacent capacitor elements 19. In other words, the side face of the lower electrode 14 is entirely covered with the seamless sidewall protection film 50 across all insulating interlayers 7a to 7c through which the lower electrode 14 extends (the same will apply also to FIG. 14B). In recent extremely fine-patterned semiconductor devices, the insulating interlayer 7 having micro-pores formed therein, or so-called porous film, may occasionally be adopted aiming at reducing the dielectric constant of the insulating interlayer 7 which resides between the adjacent interconnects. By forming the sidewall protection film 50 between the adjacent capacitor elements 19 as described in this embodiment, the insulating interlayer 7 which resides between the capacitor elements 19 may be protected against intrusion of the lower electrode 14. This configuration yields an effect of stable formation of the lower electrode 14, an effect of reducing leakage current between the lower electrodes 14 of the adjacent capacitor elements 19, and an effect of improving the long-term reliability. Barrier insulating films disclosed, for example, in International Patent WO2004/107434, containing an organosilica compound such as divinylsiloxane benzocyclobutene, may be adoptable to this sort of sidewall protection film 50. Alternatively, silicon nitride (SiN) film, silicon carbide (SiC) film, silicon carbonitride (SiCN) film, silicon oxycarbide (SiOC) film may be adoptable as the sidewall protection film 50.

In this embodiment, the sidewall protection film 50 (deposited layer) may have a density larger than that of the adjacent insulating layers (insulating interlayers 7a to 7c).

While FIGS. 14A and 14B illustrated the exemplary cases where this embodiment was applied to the sixth and seventh embodiments of the present invention, of course this embodiment may also be adoptable to other embodiments of the present invention.

Figure 15A:
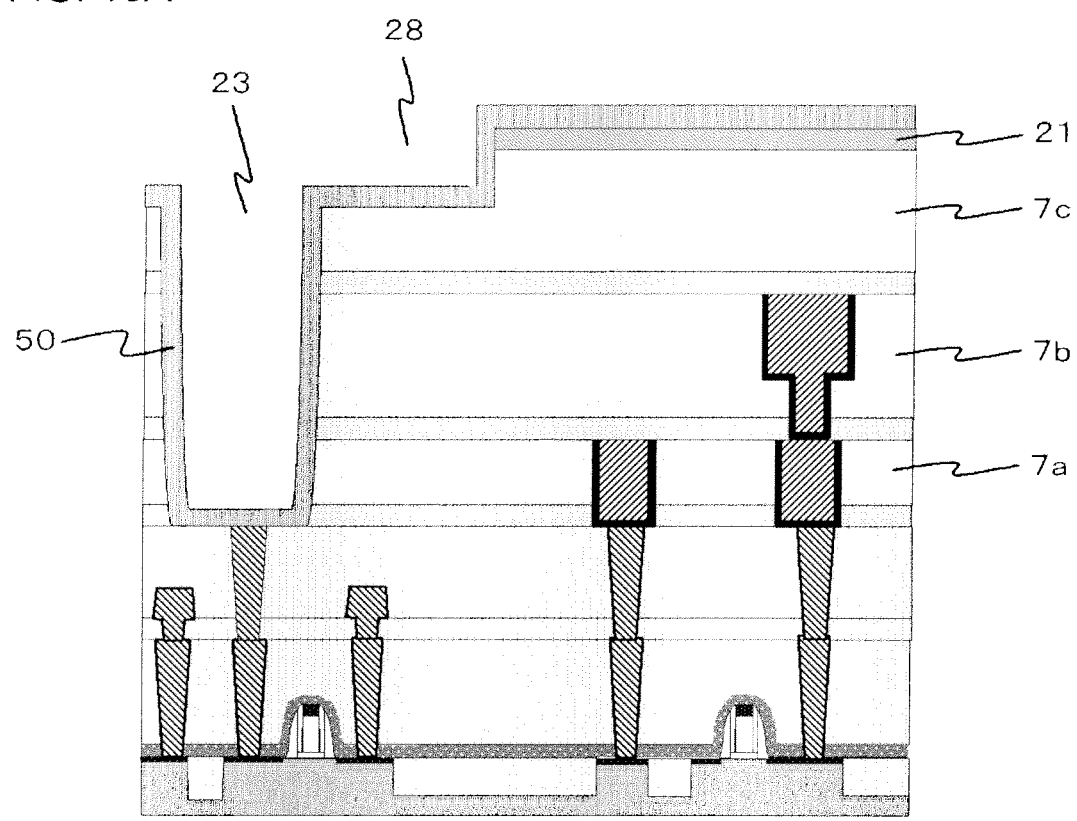
FIGS. 15A to 15C are sectional views sequentially illustrating procedures of manufacturing of the semiconductor device of the ninth embodiment.
Figure 15B:
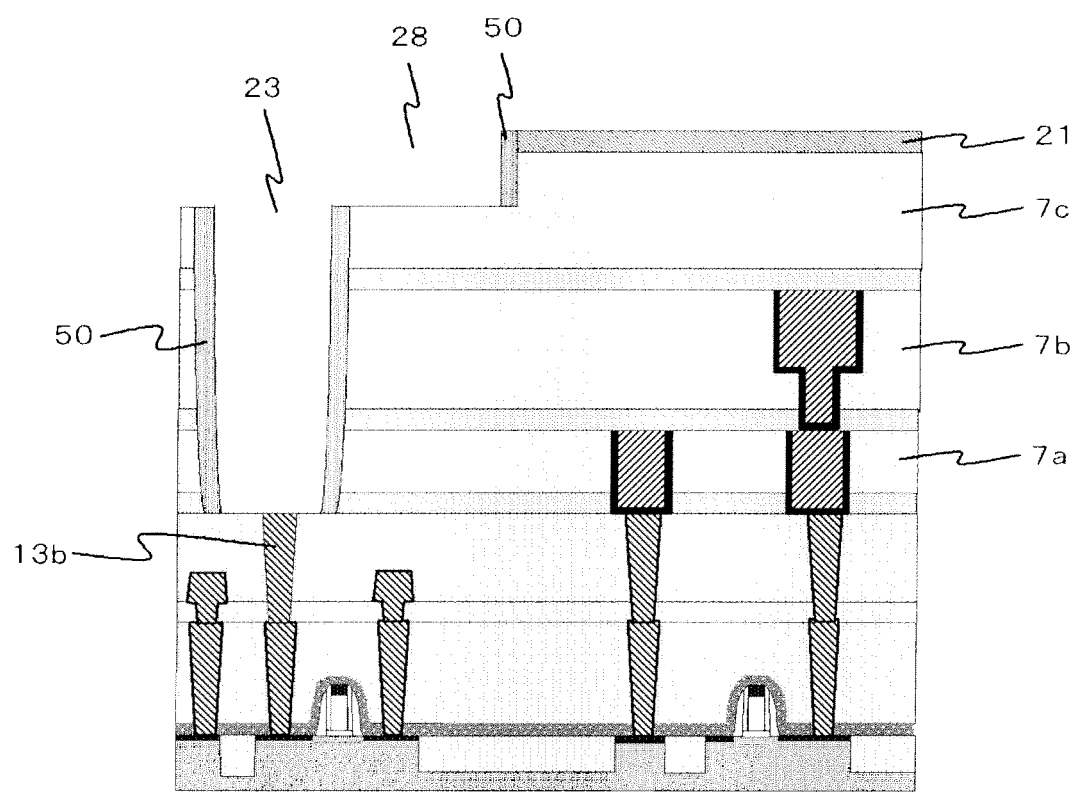
Figure 15C:
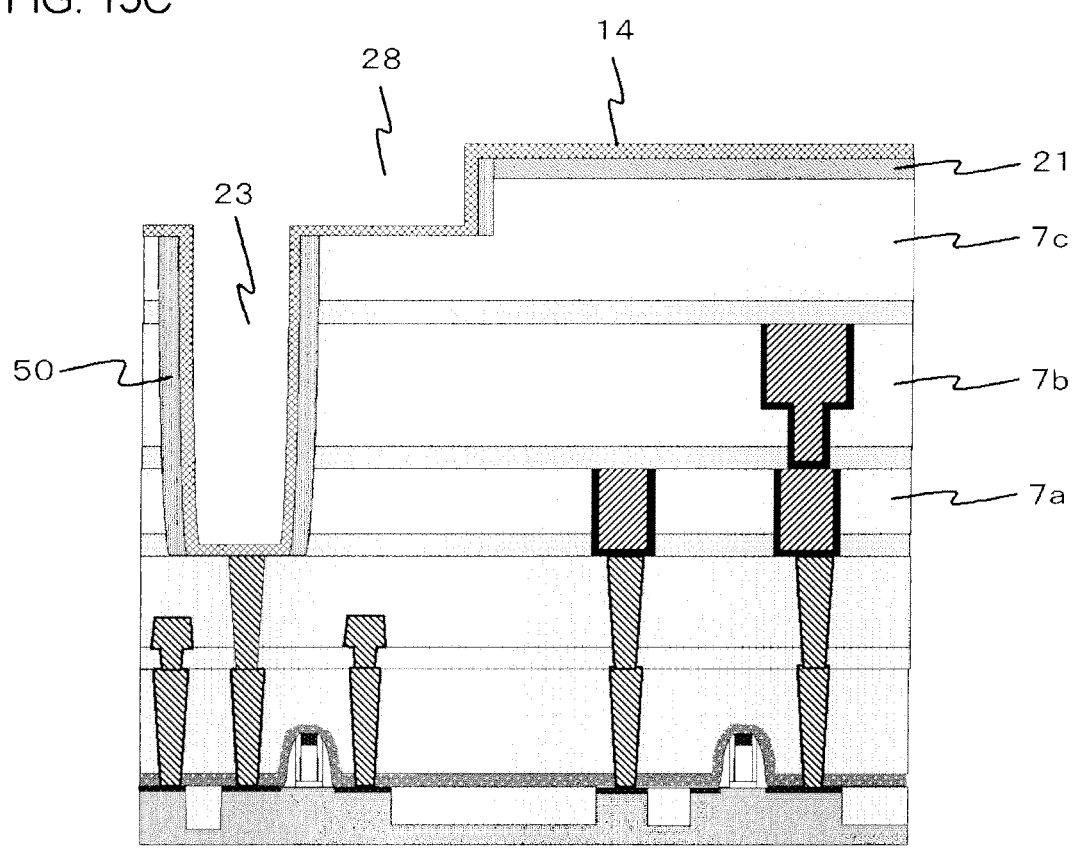

Next, a method of manufacturing according to the ninth embodiment will be explained, referring to the attached drawings. FIGS. 15A to FIG. 15C are sectional views sequentially illustrating procedures of manufacturing of the semiconductor device, according to the ninth embodiment of the present invention.

The method of manufacturing according to the ninth embodiment has an additional process of forming the sidewall protection film, between the steps illustrated in FIG. 3H and FIG. 3I explained in the first embodiment.

In the method of manufacturing according to the ninth embodiment, the opening 23 (first opening) is formed as previously described in the first embodiment as illustrated in FIG. 3H, and now typically as illustrated in FIG. 15A, an insulating film to be patterned to give the sidewall protection film 50, and having a density larger than that of the insulating interlayers 7a to 7c is deposited on the side face of the opening 23. This sort of deposited layer (sidewall protection film 50) is preferably an insulating film containing at least silicon atom, which is exemplified by insulating film grown by CVD, such as silicon oxide ($SiO_2$) film, silicon carbide (SiC) film, silicon nitride (SiN) film, and silicon carbonitride (SiCN) film; insulating films containing silicon, oxygen and/or carbon, and generally called low-k film; and the films such as benzocyclobutene film formed by plasma polymerization. In short, in view of obtaining an effect of this embodiment, it may be good enough to use an insulating film capable of stuffing the micro-pores kept open on the side face of the insulating interlayer 7.

Next, as illustrated in FIG. 15B, the sidewall protection film 50 is anisotropically etched overall typically by reactive ion etching or RF sputter etching, so as to remove at least a portion thereof at the bottom of the opening 23. In this way, electrical contact between the contact plug 13b and the lower electrode 14 formed later is ensured. The sidewall protection film 50 is effective particularly for the case where a porous insulating film having continuous pores was used to configure the insulating interlayers. In the process of manufacturing the porous insulating film having continuous pores, the pores are generally formed by allowing a low-temperature-decomposable organic matter introduced in the film to decompose under heating, while being assisted by UV irradiation or the like. The low-temperature-decomposable organic matter may be introduced by allowing the insulating interlayer to grow using a mixed gas of a low-temperature-decomposable organic gas and a source gas for forming the insulating interlayer, or by using a source molecule of the insulating interlayer bound with a low-temperature-decomposable organic matter. It is at least possible to use a porous insulating film formed, after the growth of the insulating interlayer, by decomposing the organic matter under heating while being assisted by UV irradiation or the like.

Next, as illustrated in FIG. 15C, the lower electrode 14 is formed at least over the bottom and side face of the opening 23. By virtue of presence of the sidewall protection film 50, the insulating interlayer 7 may be protected against intrusion of the lower electrode 14, even for the case where, for example, the micro-pores in the insulating interlayer 7 are formed so as to open on the side face thereof and communicatively extends deep inside.

Formation of the lower electrode 14 described in the above may be followed by processes for forming the capacitor element, similarly as described referring to FIG. 3J and succeeding drawings. In this way, the sidewall protection film 50 may be formed between the insulating interlayers 7a to 7c and the lower electrode 14. Although not illustrated, the sidewall protection film 50 may be formed by the similar procedures, after completion of the process illustrated in FIG. 3F.

(Tenth Embodiment)

Next, a tenth embodiment of the present invention will be explained, referring to the attached drawings.

Figure 16A:
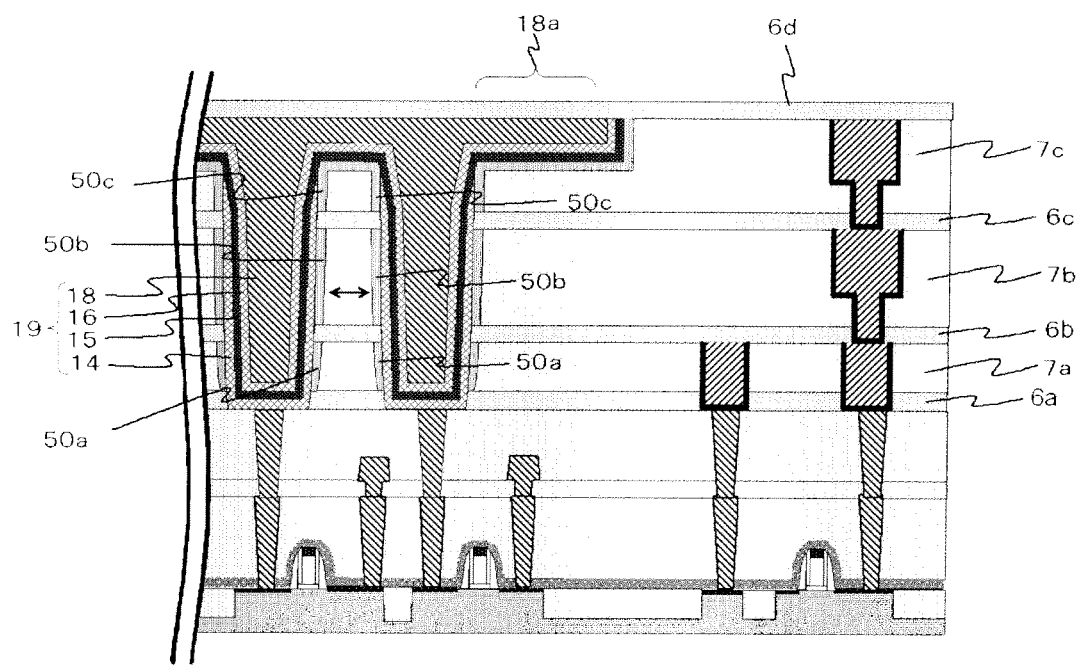
FIGS. 16A and 16B are sectional views schematically illustrating a semiconductor device of a tenth embodiment.
Figure 16B:
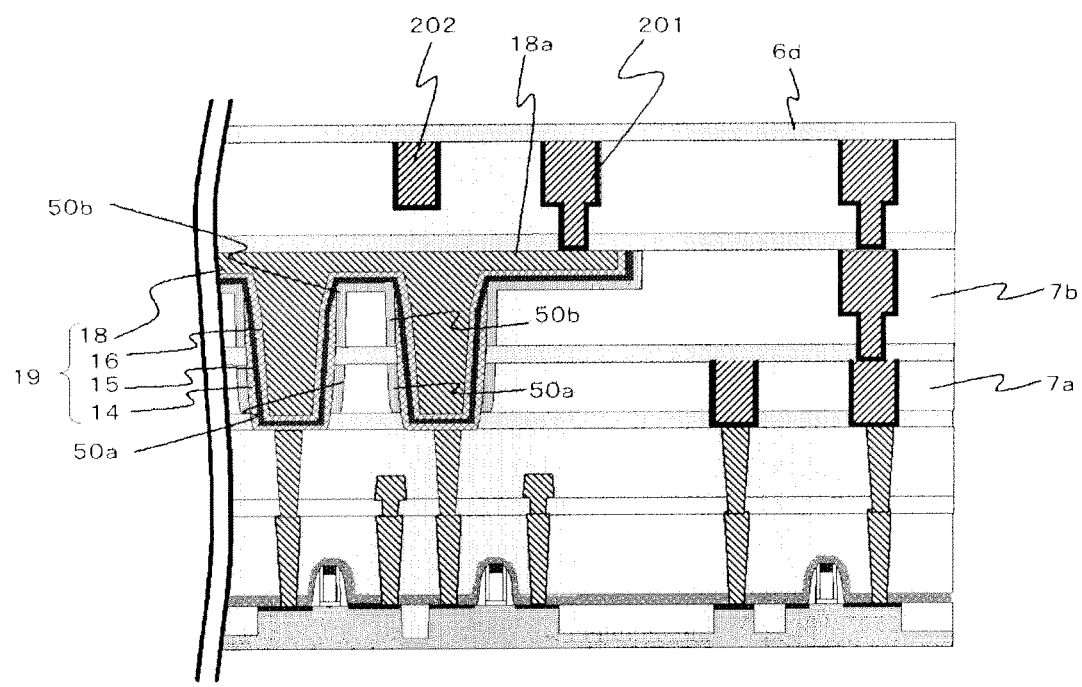

FIGS. 16A and 16B are sectional views illustrating the tenth embodiment. In the tenth embodiment, as illustrated in FIG. 16A, sidewall protection films 50a to 50c are formed between the lower electrode 14 configuring the capacitor element 19, and the insulating interlayers 7a to 7c. These sidewall protection films 50a to 50c are formed only on the end faces of the insulating interlayer 7a to 7c, so as to avoid direct contact between the lower electrode 14 and the insulating interlayer 7a to 7c in the region between the adjacent capacitor elements 19. In other words, the side face of the lower electrode 14 is entirely covered with the sidewall protection film 50a to 50c and the insulating interlayers 6b, 6c across all insulating interlayers 7a to 7c through which the lower electrode 14 extends (the same will apply also to FIG. 16B). The sidewall protection films 50a to 50c contains at least one element contained in the insulating interlayers 7a to 7c, and has a density larger than that of the insulating interlayer 7.

In recent extremely fine-patterned semiconductor devices, the insulating interlayer 7 having micro-pores formed therein, or so-called porous film, may occasionally be adopted aiming at reducing the dielectric constant of the insulating interlayer 7 which resides between the adjacent interconnects. By forming the sidewall protection films 50a to 50c between the adjacent capacitor elements 19 as described in this embodiment, the insulating interlayer 7 which resides between the capacitor elements 19 may be protected against intrusion of the lower electrode 14. This configuration yields an effect of stable formation of the lower electrode 14, an effect of reducing leakage current between the lower electrodes 14 of the adjacent capacitor elements 19, and an effect of improving the long-term reliability.

Unlike the ninth embodiment described in the above, the sidewall protection films 50a to 50c in the tenth embodiment are formed at least in the surficial portions of the insulating interlayers 7a to 7c brought into contact with the lower electrode 14. This sort of sidewall protection films 50a to 50c may be obtained, as typically disclosed in International Patent WO2007/132879, by modifying the surficial portions of the insulating interlayers 7a to 7c, so as to reduce the carbon content per unit volume as compared with that in the deeper portion of the insulating interlayers 7a to 7c, to thereby form modified layers having a larger atomic ratio of oxygen; or by forming the modified layers based on hydrogen plasma treatment, as disclosed in Japanese Laid-Open Patent Publication No. 2009-123886. Still alternatively, a modified layer containing nitrogen atoms and fluorine atoms, such as disclosed in International Patent WO2003/083935, may be formed. Fluorine atoms contained in the sidewall protection films 50a to 50c might otherwise be anticipated to degrade the electroconductivity of the lower electrode 14 formed later, if they react with the lower electrode 14 to form some compound. In this embodiment, there is no need to anticipate about such degradation of the electroconductivity of the lower electrode 14 due to formation of some compound between the lower electrode 14 and the sidewall protection films 50a to 50c, because the fluorine atoms contained in the sidewall protection films 50a to 50c are strongly bound to nitrogen atoms.

While FIGS. 16A and 16B illustrated the exemplary cases where this embodiment was applied to the sixth and seventh embodiments of the present invention, of course this embodiment may also be adoptable to other embodiments of the present invention.

Figure 17A:
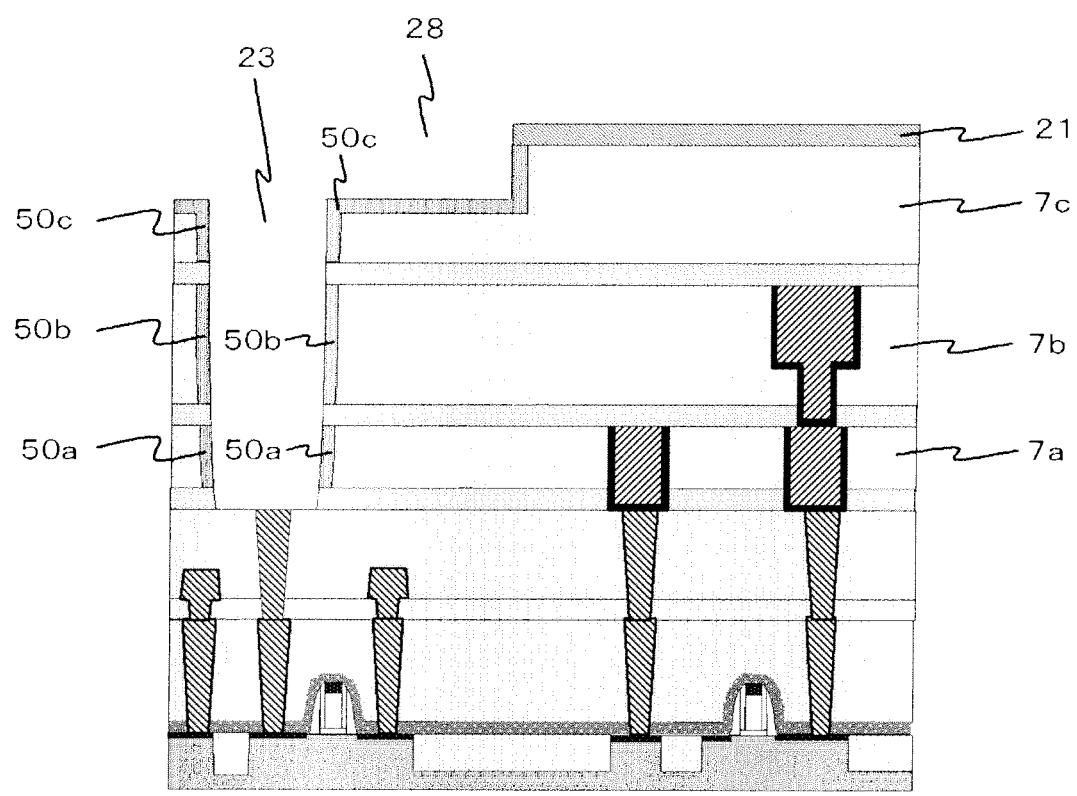
FIGS. 17A and 17B are sectional views sequentially illustrating procedures of manufacturing of the semiconductor device of the tenth embodiment.
Figure 17B:
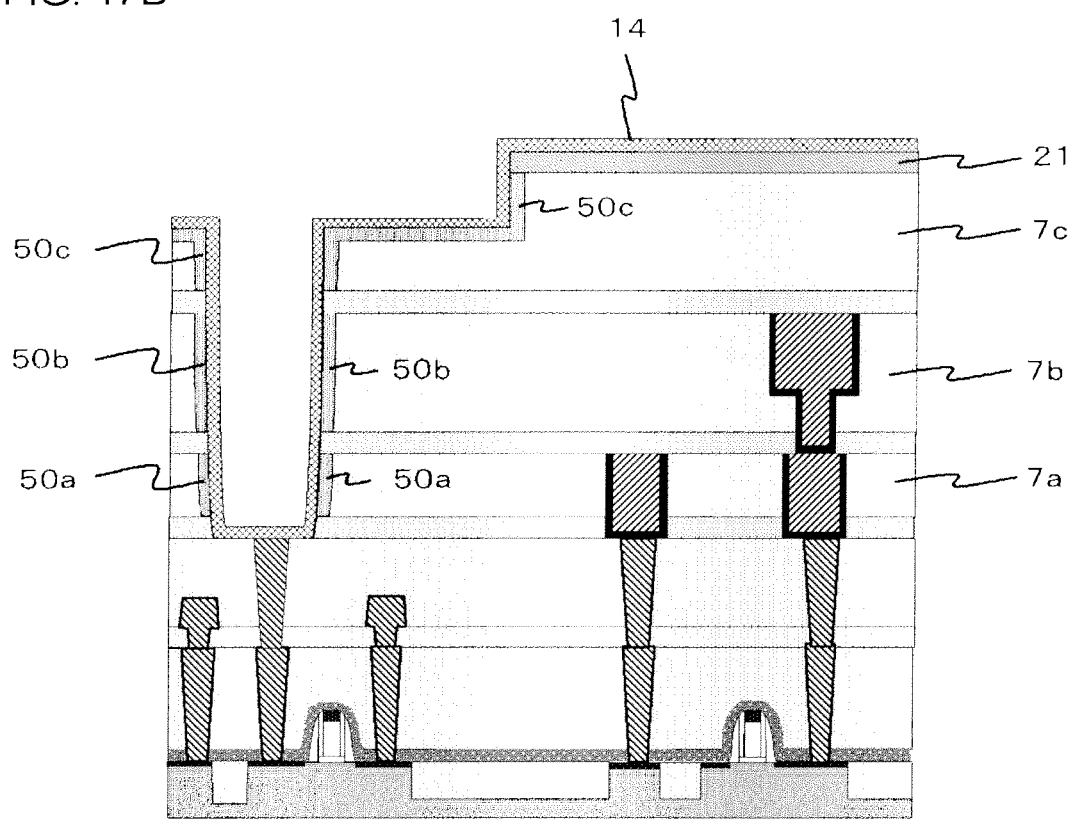

Next, the method of manufacturing according to the tenth embodiment will be explained referring to the attached drawings. FIGS. 17A and 17B are sectional views for sequentially explaining the processes of manufacturing according to the tenth embodiment of the present invention.

The method of manufacturing according to the tenth embodiment has an additional process of forming the sidewall protection film, between the steps illustrated in FIG. 3H and FIG. 3I explained in the first embodiment.

In the method of manufacturing according to the tenth embodiment, the opening 23 is formed as previously described in the first embodiment as illustrated in FIG. 3H, and now typically as illustrated in FIG. 17A, a modified layer expected to serve as the sidewall protection films 50a to 50c is formed. The modified layer may be formed by modifying the surficial portions of the insulating interlayers 7a to 7c. More specifically, the sidewall protection films 50a to 50c may be formed by modifying the surficial portions of the insulating interlayers 7a to 7c, by inducing a plasma in an atmosphere containing hydrogen, nitrogen, carbon, fluorine, or additionally containing an inert gas such as helium, argon or the like. Alternatively, the sidewall protection films 50a to 50c may be formed by irradiating UV light in an atmosphere containing at least oxygen, so as to modify the surficial portions of the insulating interlayers 7a to 7c.

Next, as illustrated in FIG. 17B, the lower electrode 14 is formed. Since the sidewall protection films 50a to 50c are preliminarily formed, the insulating interlayers 7a to 7c may be protected against intrusion of the lower electrode 14, even for the case where, for example, the micro-pores in the insulating interlayers 7a to 7c are formed so as to open on the side face thereof and communicatively extends deep inside.

Formation of the lower electrode 14 described in the above may be followed by processes for forming the capacitor element, similarly as described referring to FIG. 3J and succeeding drawings. In this way, the sidewall protection films 50a to 50c may be formed between the insulating interlayers 7a to 7c and the lower electrode 14. Although not illustrated, the sidewall protection films 50a to 50c may be formed by the similar procedures, after completion of the process illustrated in FIG. 3F.

(Eleventh Embodiment)

Next, an eleventh embodiment will be explained, referring to the attached drawings. The eleventh embodiment provides a method of manufacturing the semiconductor device previously described in the sixth and seventh embodiments.

Figure 18A:
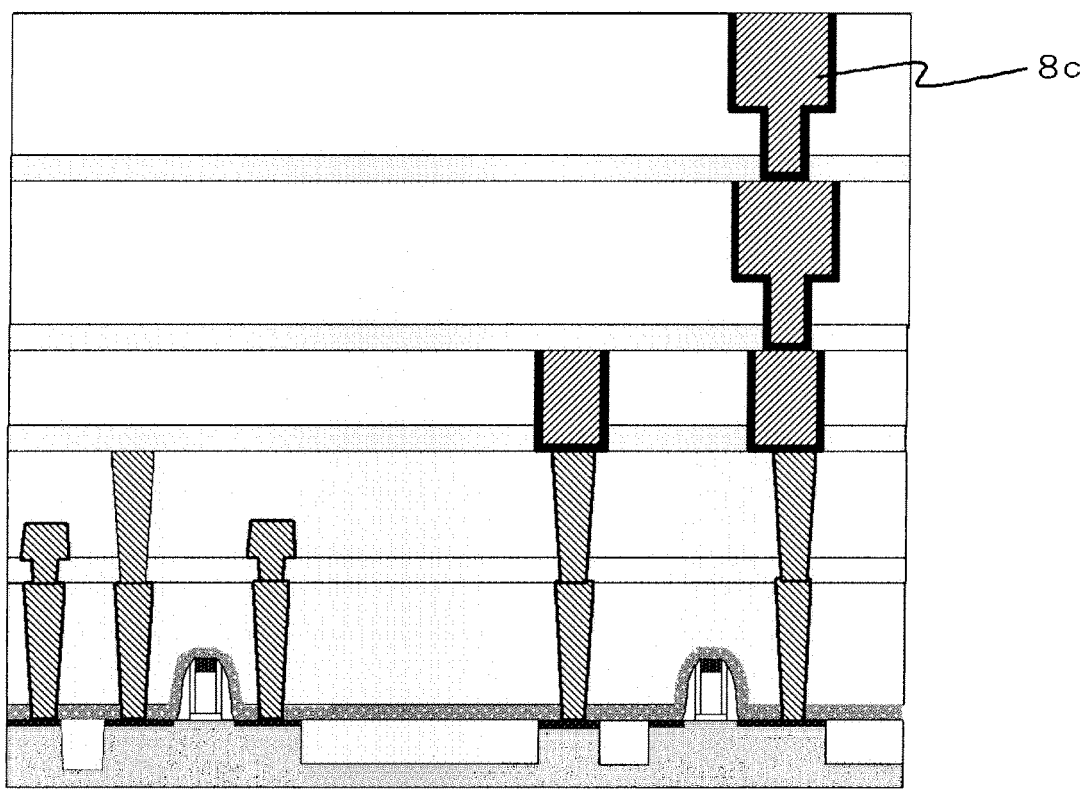
FIGS. 18A to 18J are sectional views sequentially illustrating procedures of manufacturing of the semiconductor device of the eleventh embodiment.

Unlike the method of manufacturing explained above in the sixth embodiment of the present invention, the interconnect 8c configuring the logic circuit in the eleventh embodiment is formed, as illustrated in FIG. 18A, before the capacitor element is formed. The interconnect 8c configuring the logic circuit may be formed by any method generally adoptable to manufacturing of the semiconductor devices.

Figure 18B:
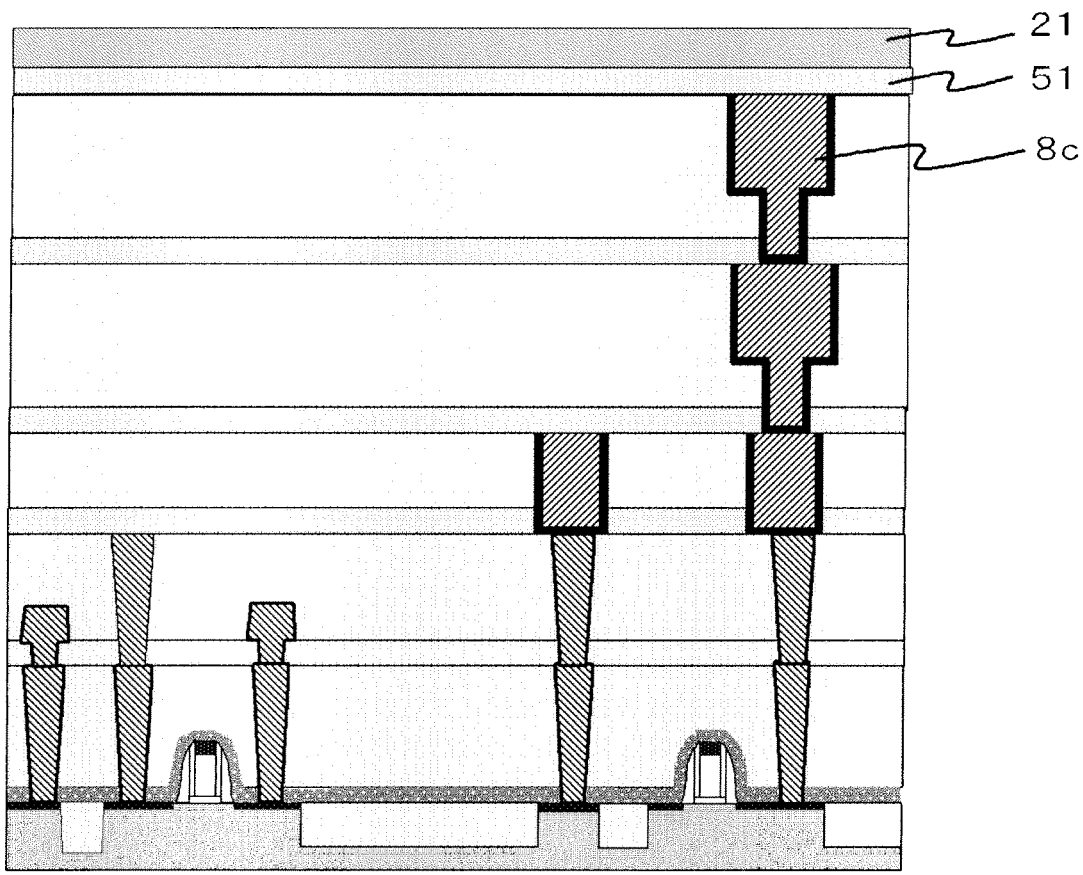

Next, as illustrated in FIG. 18B, a sacrificial layer 51 and a hard mask layer 21, which function later as an etching stopper film in the planarization process, are sequentially deposited. The hard mask layer 21 may be same as that used in the method of manufacturing explained above in the sixth embodiment. The sacrificial layer 51 may be configured, for example, by silicon nitride (SiN) film, silicon carbonitride (SiCN) film, silicon carbide (SiC) film, or stacked structure of these films.

Figure 18C:
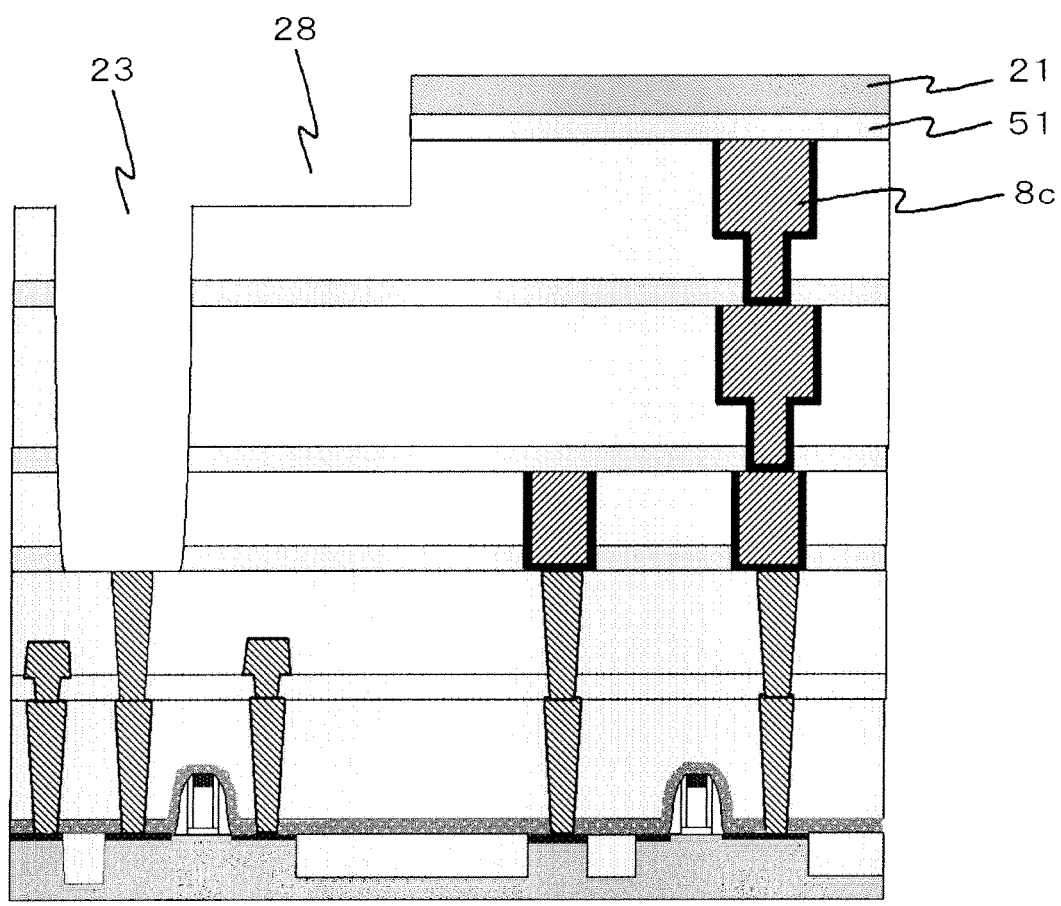

Next, as illustrated in FIG. 18C, the opening 23 for forming therein the capacitor element, and the interconnect trench (opening 28) for forming therein the upper interconnect are formed. They may be formed by the method same as the method of manufacturing described above in the first embodiment.

Figure 18D:
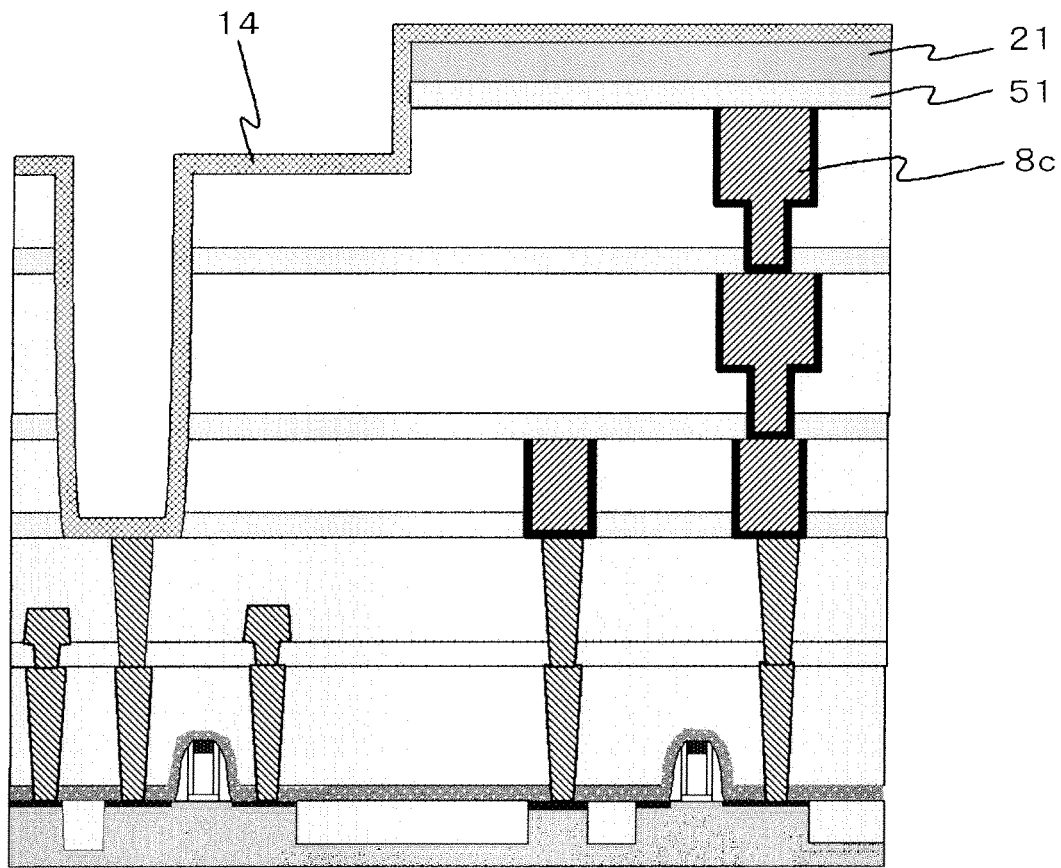

Next, as illustrated in FIG. 18D, a metal film to be patterned later to give the lower electrode 14 is deposited over the openings 23, 28 and the hard mask 21, a protective resist layer is formed in the opening 23, and the exposed portion of the metal film is anisotropically etched overall so as to leave it as the lower electrode 14 only in the opening 23 (the anisotropic etching not illustrated herein).

Figure 18E:
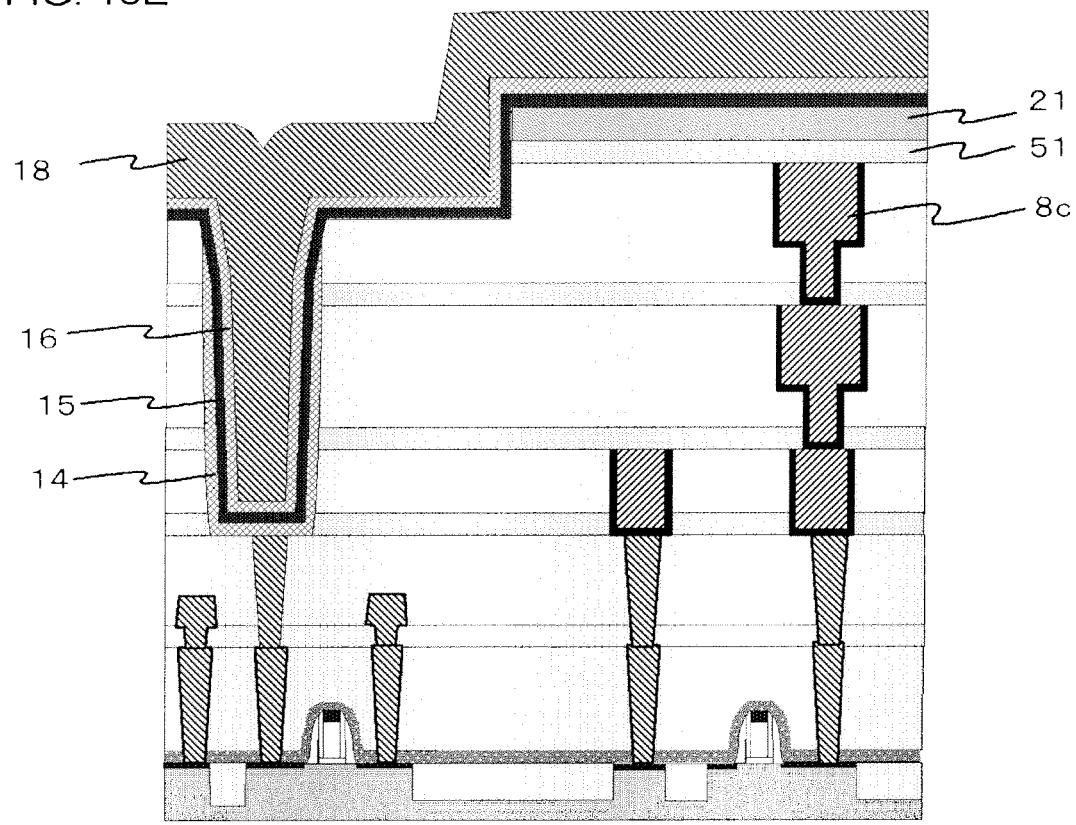

Next, as illustrated in FIG. 18E, the capacitor insulating film 15, the upper electrode 16, and a metal film patterned later to give the upper interconnect 18 are sequentially deposited, in order to form the capacitor element.

Figure 18F:
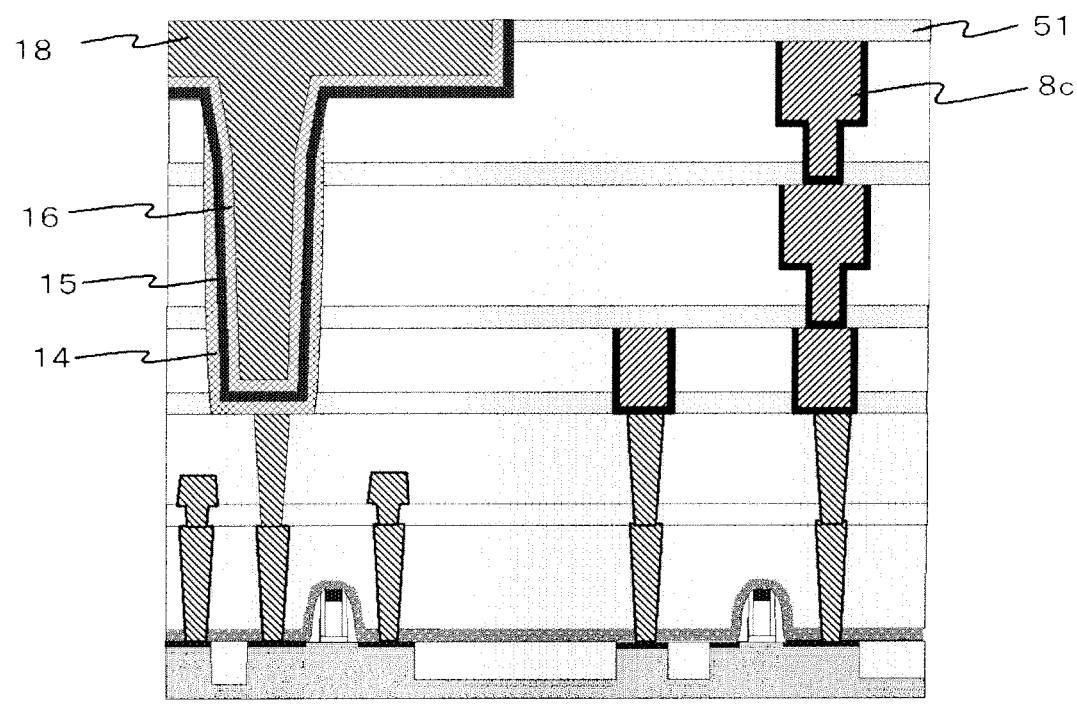

Next, as illustrated in FIG. 18F, excessive portions of the metal films and the insulating film are planarized typically by CMP. It is preferable herein to remove also the hard mask layer 21 by CMP. The sacrificial layer 51 now exhibits a polishing rate smaller than the excessive portions of the metal films and the hard mask layer.

Figure 18G:
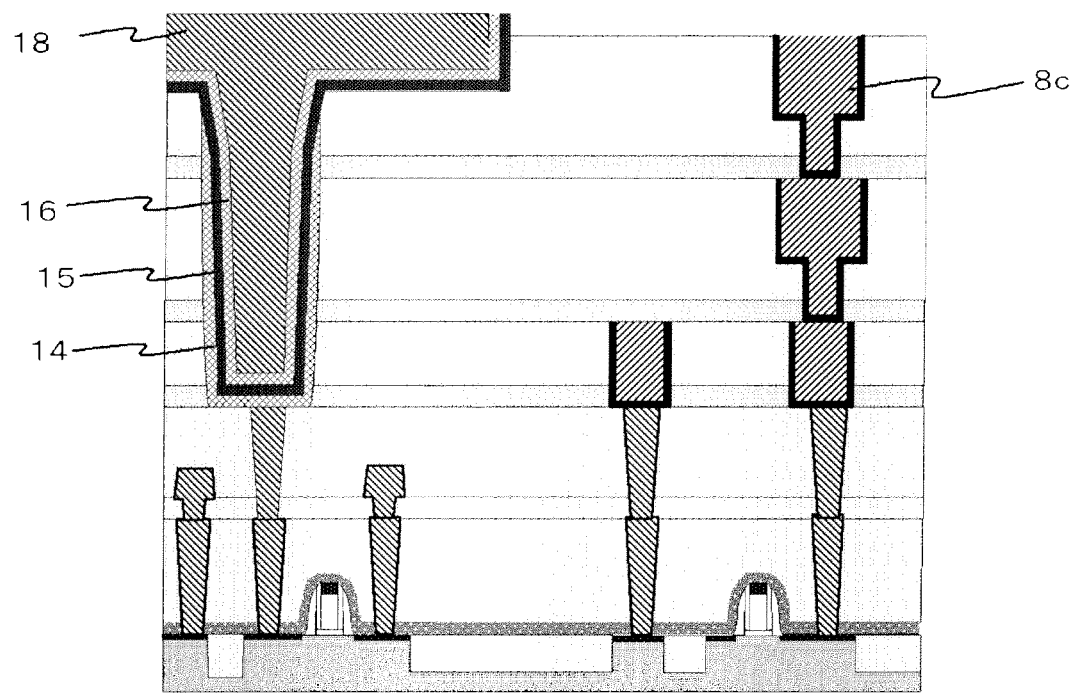
Figure 18H:
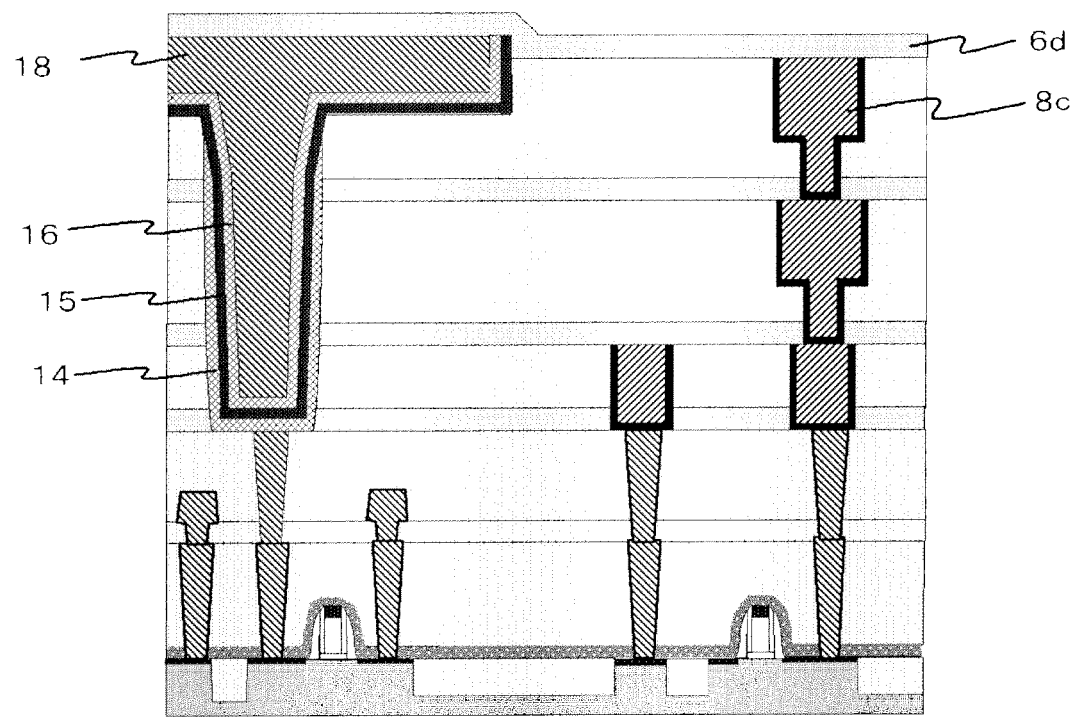

Next, the sacrificial layer 51 is removed by anisotropic etching as illustrated in FIG. 18G, and a diffusion blocking film (insulating interlayer 6d) is formed as illustrated in FIG. 18H. As schematically illustrated in FIG. 18H, the level of height of the top surface of the interconnect 8c configuring the logic circuit is made lower, by the thickness of the capacitor element, than the level of height of the top surface of the upper interconnect 18. Such difference in the level of height is, however, as large as 30 nm or around reflecting the thickness of the sacrificial layer 51, which is determined only enough to serve as the stopper film against CMP in the planarization process, and is not so causative of degrading yield of the semiconductor device.

Figure 18I:
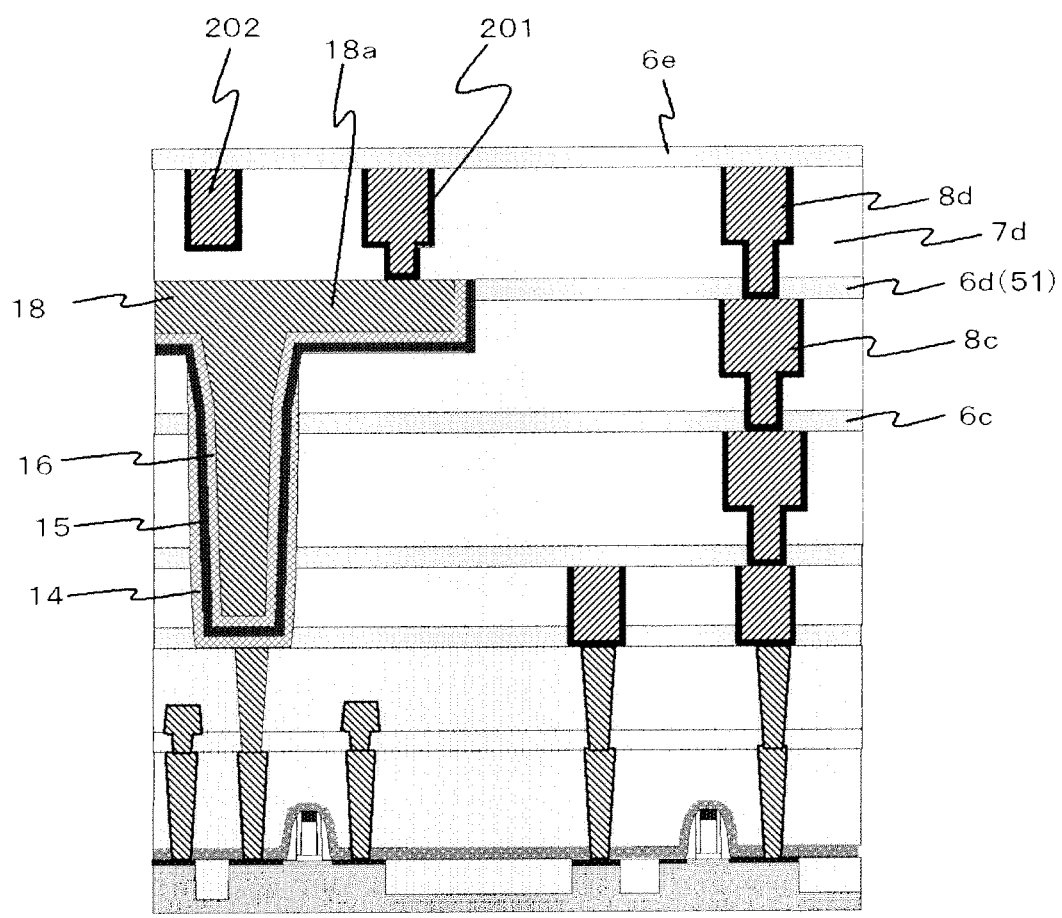

Next, as illustrated in FIG. 18I, the vertical interconnect 201 and the signal interconnect 202 are formed over the upper interconnect 18 configuring the capacitor element, and the interconnect 8d configuring the logic circuit is formed. In this way, the semiconductor device having a difference in the level of height, between the top surface of the capacitor element 19, and the top surface of the interconnect 8c configuring the logic circuit, of 30 nm or smaller may be formed. The levels of height of the top surfaces may be measured typically based on cross-sectional SEM image or surface profile.

Figure 18J:
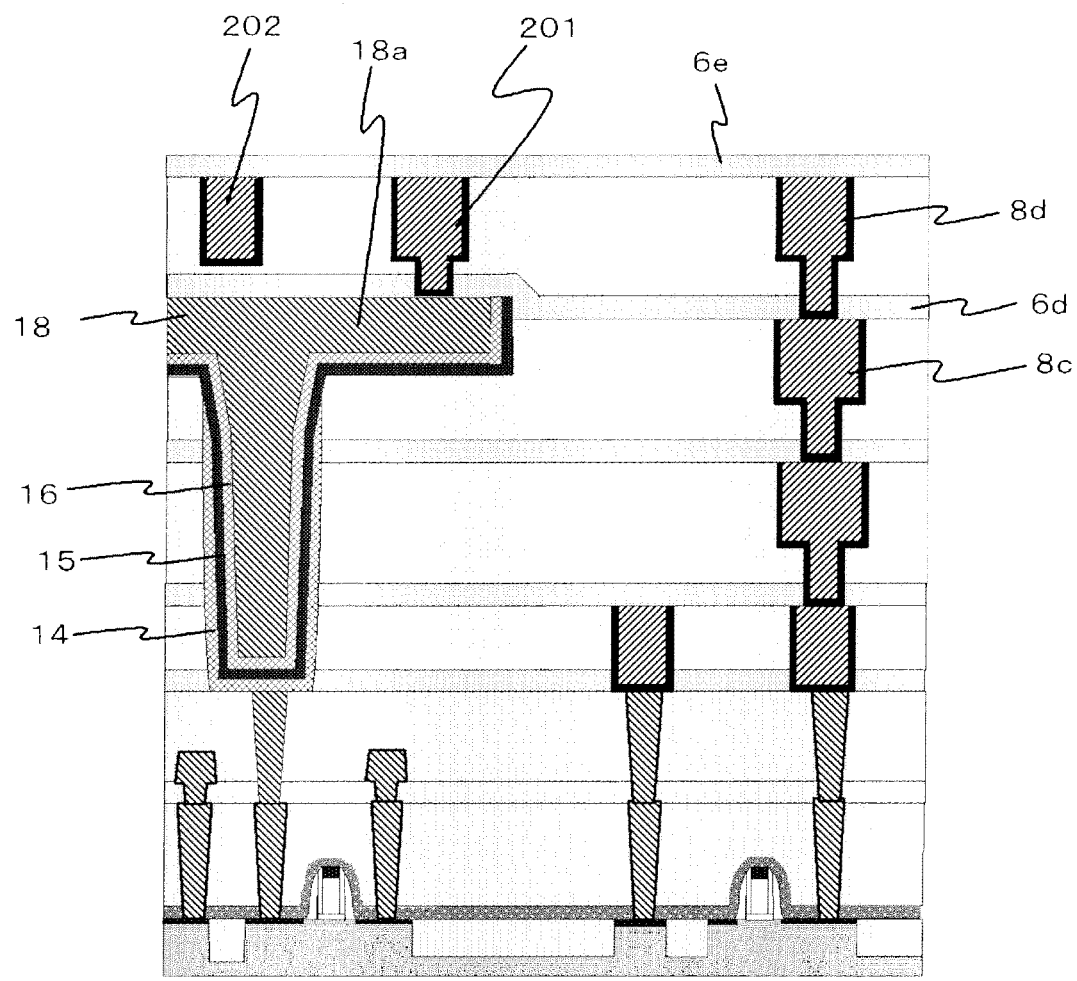
Figure 19:
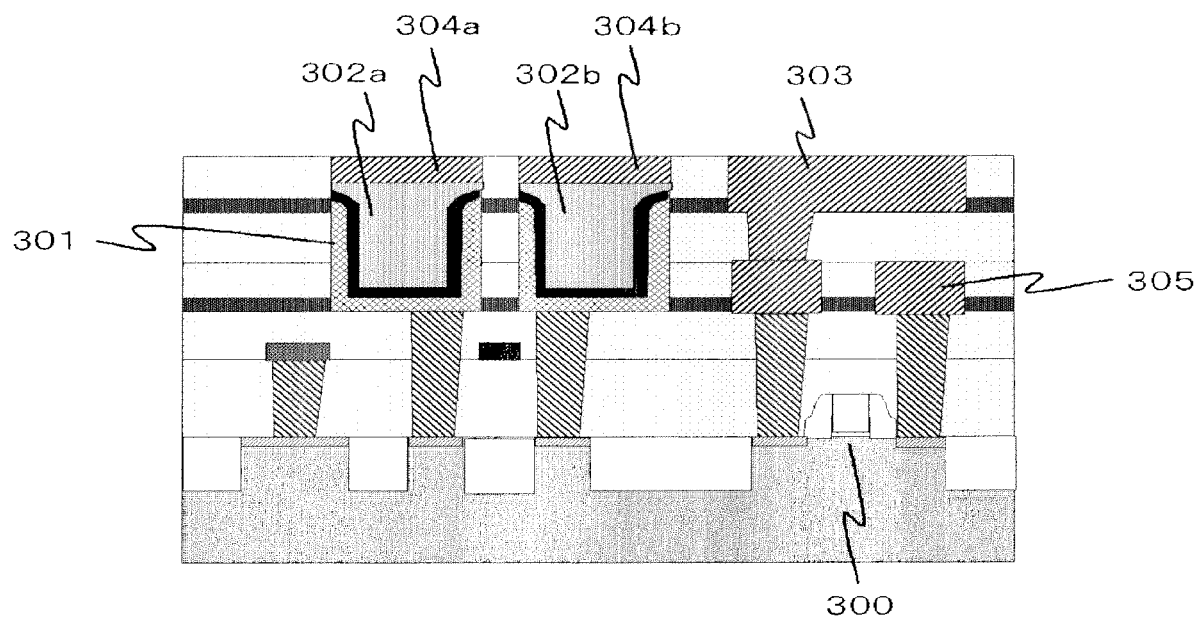
FIG. 19 is a sectional view schematically illustrating a semiconductor device described in Japanese Laid-Open Patent Publication No. 2007-201101.

In this embodiment, as illustrated in FIG. 18J, the diffusion blocking film (insulating interlayer 6d) may be used as the sacrificial layer 51. In this process, it is no longer necessary to anisotropically etch the sacrificial layer 51 as illustrated in FIG. 18G, after the upper interconnect 18 was planarized as illustrated in FIG. 18F, but instead, it may be good enough to deposit the insulating interlayer 7d, and to sequentially form the interconnects (the signal interconnect 202, the fixed-potential interconnect 201, the interconnect 8d). Next, the insulating interlayer 6e is formed over these interconnects. Note, that the diffusion blocking film (insulating interlayer 6d) herein is expected to block diffusion of metal from the interconnect 8c configuring the logic circuit, and preferably has a thickness equivalent to that of the insulating interlayer 6c formed similarly as a diffusion blocking film. In view of achieving the configuration and effect of this embodiment, the thickness is more preferably 30 nm or smaller, which may be assumed as difference in the level of height between the top surface of the upper interconnect 18 and the top surface of the interconnect 8c configuring the logic circuit.

Of course the embodiments and a plurality of modified examples described in the above may be combined without causing contradiction thereamong. The structures of the individual constituents explained in the embodiments and the modified examples may be modified in various ways without departing from the scope of the present invention.

It is apparent that the present invention is not limited to the above embodiments, that may be modified and changed without departing from the scope and spirit of the invention.

What is claimed is:

1. A semiconductor device comprising:
   a substrate;
   a multi-layered interconnect formed on said substrate, and having a plurality of interconnect layers, each of which being configured by an interconnect and an insulating layer, stacked therein;
   a memory circuit formed in a memory circuit region on said substrate in a plan view, and having a peripheral circuit and at least one capacitor element embedded in said multi-layered interconnect; and
   a logic circuit formed in a logic circuit region on said substrate, which is a region different from said memory circuit region in a plan view,
   said capacitor element being configured by a lower electrode, a capacitor insulating film, an upper electrode, an embedded electrode and an upper interconnect,
   said upper interconnect and said embedded electrode being configured by the same material in an integrated manner,
   at least one layer of said interconnect configuring said logic circuit is provided between said upper interconnect and said lower electrode, and
   the top surface of said upper interconnect, and the top surface of said interconnect configuring said logic circuit formed in the same interconnect layer with said upper interconnect, are aligned to the same plane,
   wherein said insulating layer of said multi-layered interconnect, having said capacitor element embedded therein, is provided in common with said insulating layer configuring said logic circuit, formed in the same layer with said capacitor element, and said insulating layer has a dielectric constant smaller than that of silicon oxide film.

2. The semiconductor device as claimed in claim 1, further comprising a metal diffusion blocking film commonly formed over the top surface of said upper interconnect, and over the top surface of said interconnect configuring said logic circuit, formed in the same interconnect layer with said upper interconnect.

3. The semiconductor device as claimed in claim 1, comprising a sidewall protection film formed between said insulating layer and said lower electrode.

4. The semiconductor device as claimed in claim 3, wherein said sidewall protection film is a deposited layer or a modified layer.

5. The semiconductor device as claimed in claim 4, wherein said deposited layer has a density larger than that of said adjacent insulating layer.

6. The semiconductor device as claimed in claim 4, wherein said modified layer contains at least one element composing said adjacent insulating layer.

7. The semiconductor device as claimed in claim 1, wherein said upper interconnect and said interconnect configuring said logic circuit are composed of different materials.

8. The semiconductor device as claimed in claim 7, wherein said upper interconnect is composed of tungsten, and said interconnect configuring said logic circuit is composed of copper or a copper-containing alloy.

9. The semiconductor device as claimed in claim 1, wherein a material, which composes said upper interconnect and said interconnect configuring said logic circuit, is copper or a copper-containing alloy.

10. The semiconductor device as claimed in claim 1, wherein a material composing at least one insulating film, out of the insulating films formed between said interconnect configuring said logic circuit, and an active element formed on the surface of said substrate, has a dielectric constant smaller than that of silicon oxide film.

11. The semiconductor device as claimed in claim 1, wherein said capacitor element has a cylindrical geometry, and said upper electrode and said capacitor insulating film are formed right under said extension electrode of said upper interconnect.

12. The semiconductor device as claimed in claim 1, wherein said upper interconnect has height in the thickness-wise direction smaller than height, in the thickness-wise direction, of said interconnect configuring said logic circuit, formed in the same interconnect layer with said upper interconnect.

13. The semiconductor device as claimed in claim 1, wherein at least one layer of interconnects of said plurality of interconnect layers formed over said capacitor element comprises at least one layer of fixed-potential interconnect and a plurality of signal interconnects, said fixed-potential interconnect being electrically connected to said upper interconnect configuring said capacitor element.

14. The semiconductor device as claimed in claim 1, said upper interconnect has a vertical interconnect extended in the thickness-wise direction so as to penetrate said upper electrode and said capacitor insulating film, and said vertical interconnect being electrically connected to a fixed-potential interconnect, below said upper interconnect.

15. A semiconductor device comprising:

a substrate;

a multi-layered interconnect formed on said substrate, and having a plurality of interconnect layers, each of which being configured by an interconnect and an insulating layer, stacked therein;

a memory circuit formed in a memory circuit region on said substrate in a plan view, and having a peripheral circuit and at least one capacitor element embedded in said multi-layered interconnect; and a logic circuit formed in a logic circuit region on said substrate, which is a region different from said memory circuit region in a plan view, said capacitor element being configured by a lower electrode, a capacitor insulating film, an upper electrode, an embedded electrode and an upper interconnect, said upper interconnect and said embedded electrode being configured by the same material in an integrated manner, at least one layer of said interconnect configuring said logic circuit being provided between said upper interconnect and said lower electrode, and difference in the level of height. between the top surface of said upper interconnect, and the top surface of said interconnect configuring said logic circuit formed in the same interconnect layer with the upper interconnect, being 30 nm or smaller, wherein said insulating layer of said multi-layered interconnect, having said capacitor element embedded therein, is provided in common with said insulating layer configuring said logic circuit, formed in the same layer with said capacitor element, and said insulating layer has a dielectric constant smaller than that of silicon oxide film.

* * * * *